United States Patent
Wada

(10) Patent No.: US 8,507,172 B2
(45) Date of Patent: *Aug. 13, 2013

(54) POSITIVE RESIST COMPOSITION AND PATTERN FORMING METHOD USING THE POSITIVE RESIST COMPOSITION

(75) Inventor: Kenji Wada, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 454 days.

This patent is subject to a terminal disclaimer.

(21) Appl. No.: 12/523,232

(22) PCT Filed: Jan. 28, 2008

(86) PCT No.: PCT/JP2008/051698
§ 371 (c)(1),
(2), (4) Date: Jul. 15, 2009

(87) PCT Pub. No.: WO2008/093856
PCT Pub. Date: Aug. 7, 2008

(65) Prior Publication Data
US 2010/0040975 A1   Feb. 18, 2010

(30) Foreign Application Priority Data

Jan. 31, 2007 (JP) ................................ 2007-021104
Jul. 6, 2007 (JP) ................................ 2007-178474

(51) Int. Cl.
- G03F 7/039 (2006.01)
- G03F 7/11 (2006.01)
- G03F 7/20 (2006.01)
- G03F 7/30 (2006.01)

(52) U.S. Cl.
USPC ........ 430/270.1; 430/311; 430/326; 430/910; 430/914; 430/921; 430/923; 430/273.1

(58) Field of Classification Search
None
See application file for complete search history.

(56) References Cited

U.S. PATENT DOCUMENTS

| | | | |
|---|---|---|---|
| 4,480,910 A | 11/1984 | Takanashi et al. | |
| 6,245,485 B1 * | 6/2001 | Aoai et al. | 430/288.1 |
| 6,245,492 B1 * | 6/2001 | Huang et al. | 430/326 |
| 6,383,713 B1 | 5/2002 | Uetani et al. | |
| 6,576,392 B1 * | 6/2003 | Sato et al. | 430/270.1 |
| 2003/0219680 A1 | 11/2003 | Nishimura et al. | |
| 2004/0197707 A1 * | 10/2004 | Yamanaka et al. | 430/281.1 |
| 2005/0014090 A1 | 1/2005 | Hirayama et al. | |
| 2005/0026073 A1 | 2/2005 | Sasaki | |
| 2005/0147920 A1 * | 7/2005 | Lin et al. | 430/311 |
| 2005/0238992 A1 | 10/2005 | Kodama | |
| 2005/0266351 A1 | 12/2005 | Takemoto et al. | |
| 2006/0154171 A1 | 7/2006 | Hirayama et al. | |
| 2006/0246373 A1 | 11/2006 | Wang | |
| 2006/0269871 A1 | 11/2006 | Harada et al. | |
| 2007/0134588 A1 * | 6/2007 | Kanda et al. | 430/270.1 |

FOREIGN PATENT DOCUMENTS

| | | |
|---|---|---|
| EP | 1 500 976 A1 | 1/2005 |
| EP | 1 505 440 A2 | 2/2005 |
| JP | 57-153433 A | 9/1982 |
| JP | 7-220990 A | 8/1995 |
| JP | 10-48814 A | 2/1998 |
| JP | 11-102066 A | 4/1999 |
| JP | 11-158118 A | 6/1999 |
| JP | 2000-275845 A | 10/2000 |
| JP | 2002-75857 A | 3/2002 |
| JP | 2003-330192 A | 11/2003 |
| JP | 2004-184637 A | 7/2004 |
| JP | 2004-523774 A | 8/2004 |
| JP | 2005-308969 A | 11/2005 |
| JP | 2005-331918 A | 12/2005 |
| JP | 2006-309245 A | 11/2006 |
| JP | 2006-328259 A | 12/2006 |
| JP | 2007-501418 A | 1/2007 |
| JP | 2008-096743 A | 4/2008 |
| WO | 02/31595 A2 | 4/2002 |
| WO | 2004/051372 A2 | 6/2004 |
| WO | 2004/068242 A1 | 8/2004 |
| WO | 2004/077158 A1 | 9/2004 |
| WO | 2005/008336 A2 | 1/2005 |

OTHER PUBLICATIONS

Roxann L. Engelstad, "Emerging Lithographic Technologies VI", Proceedings of SPIE, 2002, pp. 11-24, vol. 4688.
International Search Report for PCT/JP2008/051698 dated May 7, 2008.
Written Opinion—PCT/ISA 237 for PCT/JP2008/051698 dated May 7, 2008.
Office Action dated Sep. 25, 2012 in Japanese Application No. 2007-178474.
Communication dated Jan. 24, 2012 from the Japanese Patent Office in Japanese Application No. 2007-178474.
Office Action dated Jun. 11, 2013 issued by the Japanese Patent Office in counterpart Japanese Patent Application No. 2007-178474.

* cited by examiner

*Primary Examiner* — Sin J. Lee
(74) *Attorney, Agent, or Firm* — Sughrue Mion, PLLC

(57) ABSTRACT

A positive resist composition comprises: (A) a compound capable of generating an acid upon irradiation with actinic rays or radiation; (B) a resin of which solubility in an alkali developer increases under action of an acid; and (C) a compound capable of decomposing under action of an acid to generate an acid.

9 Claims, 1 Drawing Sheet

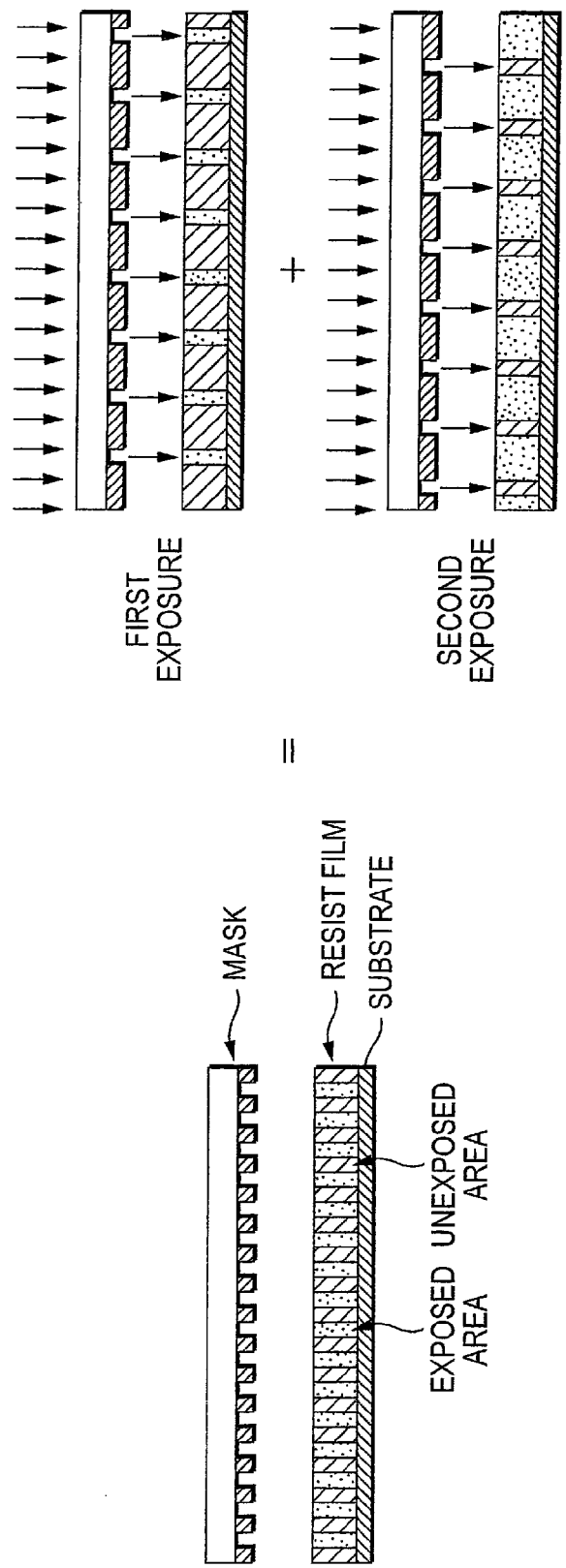

US 8,507,172 B2

POSITIVE RESIST COMPOSITION AND PATTERN FORMING METHOD USING THE POSITIVE RESIST COMPOSITION

TECHNICAL FIELD

The present invention relates to a positive resist composition which changes in the properties by undergoing a reaction upon irradiation with actinic rays or radiation, and a pattern forming method using the positive resist composition. More specifically, the present invention relates to a positive resist composition for use in the production process of a semiconductor such as IC, in the production of a circuit substrate of liquid crystal, thermal head or the like, in other photofabrication processes, and in a lithographic printing plate or an acid-curable composition; and a pattern forming method using the positive resist composition.

BACKGROUND ART

A chemical amplification resist composition is a pattern forming material capable of forming a pattern on a substrate by producing an acid in the exposed area upon irradiation with actinic rays or radiation such as far ultraviolet light and through a reaction using this acid as the catalyst, changing the solubility in a developer between the area irradiated with actinic rays or radiation and the non-irradiated area.

In the case of using a KrF excimer laser as the exposure light source, a resin having small absorption in the region of 248 nm and having a basic skeleton of poly(hydroxystyrene) is predominantly used as the main component, and this is an excellent system capable of forming a good pattern with high sensitivity and high resolution as compared with the conventional naphthoquinonediazide/novolak resin system.

On the other hand, in the case of using a light source of emitting light at a shorter wavelength, for example, in using an ArF excimer laser (193 nm) as the light source, a resist containing a resin having an alicyclic hydrocarbon structure with high transparency has been developed for use with an ArF excimer laser, because the compound having an aromatic group substantially has large absorption in the region of 193 nm. For example, in Patent Document 1 (JP-A-2005-331918 (the term "JP-A" as used herein means an "unexamined published Japanese patent application"), Patent Document 2 (JP-A-2004-184637) and Patent Document 3 (JP-A-2003-330192), various properties are improved by introducing a repeating unit having a spacer portion between the main chain and the acid-decomposable group into an alicyclic acid-decomposable repeating unit.

Also, as for the acid generator which is a main constituent component of the chemical amplification-type resist composition, various compounds have been found and a triarylsulfonium salt and an arylalkylsulfonium salt are disclosed, for example, in Patent Document 4 (JP-A-2000-275845), Patent Document 5 (JP-A-10-48814) and Patent Document 6 (JP-A-2005-308969).

A so-called immersion method of filling a high refractive-index liquid (hereinafter sometimes referred to as an "immersion liquid") between a projection lens and a sample has been conventionally known as a technique for increasing the resolving power in an optical microscope.

As regards the "effect of immersion", assuming that $NA_0 = \sin\theta$, the resolving power and focal depth in the immersion can be expressed by the following formulae:

(Resolving power)=$k_1 \cdot (\lambda_0/n)/NA_0$ (Focal depth)=$\pm k_2 \cdot (\lambda_0/n)/NA_0^2$ wherein $\lambda_0$ is the wavelength of exposure light in air, n is the refractive index of the immersion liquid based on air, and θ is the convergence half-angle of beam.

That is, the effect of immersion is equal to use of an exposure wavelength of 1/n. In other words, in the case of a projection optical system with the same NA, the focal depth can be made n times larger by the immersion. This is effective for all pattern profiles and can be combined with super-resolution techniques such as phase-shift method and modified illumination method which are being studied at present.

Examples of the apparatus where this effect is applied to the transfer of a fine image pattern of a semiconductor device are described in Patent Document 7 (JP-A-57-153433) and Patent Document 8 (JP-A-7-220990).

Recent progress of the immersion exposure technique is reported, for example, in Non-Patent Document 1 (*SPIE Proc.*, 4688, 11 (2002)) and Patent Document 9 (International Publication No. WO2004-077158, pamphlet). In the case of using an ArF excimer laser as the light source, in view of safety on handling as well as transmittance and refractive index at 193 nm, pure water (refractive index at 193 nm: 1.44) is considered to be a most promising immersion liquid. In the case of using an $F_2$ excimer laser as the light source, a fluorine-containing solution is being studied in view of balance between transmittance and refractive index at 157 nm, but those satisfied in terms of environmental safety or refractive index have been not yet found out. Considering the degree of immersion effect and the maturity of resist, the immersion exposure technique is expected to be most soon mounted on an ArF exposure machine.

Also, it is pointed out that when the chemical amplification resist is applied to immersion exposure, the resist layer comes into contact with the immersion liquid at the exposure, as a result, the resist layer deteriorates or a component adversely affecting the immersion liquid bleeds out from the resist layer. Patent Document 10 (International Publication No. WO2004-068242, pamphlet) describes a case where when the resist for ArF exposure is dipped in water before and after exposure, the resist performance is changed, and this is indicated as a problem in the immersion exposure.

As regards the medium filled between a projection lens and a semiconductor substrate, which is used in the immersion exposure, water having a refractive index of 1.44 is employed in view of easy availability and safety and by using an exposure machine having a projection lens with NA of 1.2 to 1.35, pattern formation of a semiconductor device in a design dimension up to the 45 nm generation is considered to be possible.

The generation next to the design dimension of 45 nm is 32 nm, and it is considered that NA of 1.65 is necessary for the pattern formation of a 32 nm-generation semiconductor device and in this case, the medium filled between a projection lens and a semiconductor substrate must have a refractive index of 1.8 or more.

Meanwhile, the construction material of the projection lens having NA of 1.65 is required to have a refractive index of 1.9 or more and LuAg is supposed to be a promising candidate therefor at present, but the problem of large absorption amount of light passed has been not yet solved.

Furthermore, a candidate medium having a refractive index of 1.8 or more has been also not yet found.

For these reasons, a method where pattern formation of a 32 nm-generation semiconductor device is performed by a special pattern forming method using an exposure machine having a projection lens with NA of 1.2 to 1.35 is attracting attention.

Several methods have been proposed for this special pattern forming method, and one of these methods is a double exposure process.

The double exposure process is a method of exposing the same photoresist film twice as described in Patent Document 11 (JP-A-2002-75857), where the pattern in the exposure field is divided into two pattern groups and the exposure is preformed in twice for respective pattern groups divided.

Patent Document 11 indicates that it is necessary in this method to have properties like a two-photon absorption resist, that is, the photosensitivity or solubility in a developer changes in proportion to the square of exposure intensity, but a resist having such properties has been not yet developed.

[Patent Document 1] JP-A-2005-331918
[Patent Document 2] JP-A-2004-184637
[Patent Document 3] JP-A-2003-330192
[Patent Document 4] JP-A-2000-275845
[Patent Document 5] JP-A-10-48814
[Patent Document 6] JP-A-2005-308969
[Patent Document 7] JP-A-57-153433
[Patent Document 8] JP-A-7-220990
[Patent Document 9] International Publication No. WO2004-077158, pamphlet
[Patent Document 10] International Publication No. WO2004-068242, pamphlet
[Patent Document 11] JP-A-2002-75857
[Non-Patent Document 1] Proc. SPIE, Vol. 4688, page 11 (2002)

DISCLOSURE OF THE INVENTION

An object of the present invention is to provide a positive resist composition exhibiting good performance in terms of pattern collapse and pattern profile not only in normal exposure (dry exposure) but also in immersion exposure, and a pattern forming method using the positive resist composition. Another object of the present invention is to provide a positive resist composition suitable for double exposure, which ensures good pattern resolution and good pattern profile in double exposure, and a pattern forming method using the positive resist composition.

The present invention is as follows.

(1) A positive resist composition comprising:

(A) a compound capable of generating an acid upon irradiation with actinic rays or radiation, (B) a resin of which solubility in an alkali developer increases under the action of an acid, and (C) a compound capable of decomposing under the action of an acid to generate an acid.

(2) The positive resist composition as described in (1), wherein the resin (B) comprises at least one of a repeating unit represented by formula (Ia) and a repeating unit represented by formula (Ib):

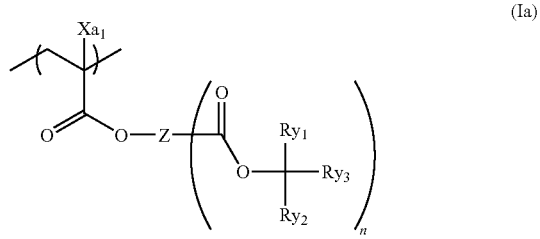

(Ia)

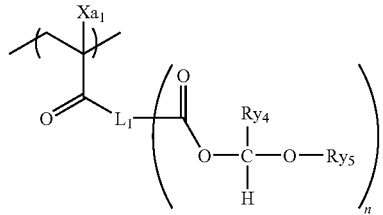

(Ib)

wherein $Xa_1$ represents a hydrogen atom, an alkyl group, a cyano group or a halogen atom;

$Ry_1$ to $Ry_3$ each independently represents an alkyl group or a cycloalkyl group, and at least two members out of $Ry_1$ to $Ry_3$ may combine to form a monocyclic or polycyclic cyclohydrocarbon structure;

Z represents a (n+1)-valent linking group;

$Ry_4$ and $Ry_5$ each independently represents an alkyl group or a cycloalkyl group, and $Ry_4$ and $Ry_5$ may combine to form a monocyclic or polycyclic cyclohydrocarbon structure;

$L_1$ represents a (n+1)-valent linking group; and n represents an integer of 1 to 3.

(3) The positive resist composition as described in (2), wherein in formula (Ia), Z has a chain hydrocarbon group or a cyclic hydrocarbon group.

(4) The positive resist composition as described in (2) or (3), wherein in formula (Ib), $L_1$ has a chain hydrocarbon group or a cyclic hydrocarbon group.

(5) The positive resist composition as described in any one of (1) to (4), which further comprises a hydrophobic resin.

(6) A pattern forming method comprising forming a resist film from the positive resist composition described in any one of (1) to (5), and exposing and developing the resist film.

(7) A pattern forming method comprising forming a resist film from the positive resist composition described in any one of (1) to (5), and subjecting the resist film to immersion exposure and development.

(8) A pattern forming method comprising forming a resist film from the positive resist composition described in any one of (1) to (5), forming a hydrophobic resin-containing topcoat thereon, and subjecting the resist film to immersion exposure and development.

(9) A pattern forming method comprising forming a resist film from the positive resist composition described in any one of (1) to (5), and doubly exposing and developing the resist film.

(10) A pattern forming method comprising forming a resist film from the positive resist composition described in any one of (1) to (5), and subjecting the resist film to immersion double exposure and development.

(11) A pattern forming method comprising forming a resist film from the positive resist composition described in any one of (1) to (5), forming a hydrophobic resin-containing topcoat thereon, and subjecting the resist film to immersion double exposure and development.

Furthermore, the preferred embodiment of the present invention includes the following constructions.

(12) The positive resist composition as described in any one of (1) to (5), wherein the compound (A) is a sulfonium salt of fluorine-substituted alkanesulfonic acid, fluorine-substituted benzenesulfonic acid, fluorine-substituted imide acid or fluorine-substituted methide acid.

(13) The positive resist composition as described in any one of (2) to (5) and (12), wherein the resin (B) further contains a biodegradable repeating unit having a monocyclic or polycyclic alicyclic hydrocarbon structure.

(14) The positive resist composition as described in any one of (2) to (5), (12) and (13), wherein the resin (B) further contains a repeating unit having a lactone structure.

(15) The positive resist composition as described in any one of (2) to (5) and (12) to (14), wherein the resin (B) further contains a repeating unit having a hydroxyl group or a cyano group.

(16) The positive resist composition as described in any one of (2) to (5) and (13) to (15), wherein the resin (B) further contains a repeating unit having a carboxyl group.

(17) The positive resist composition as described in any one of (2) to (5) and (13) to (16), wherein the resin (B) further contains a repeating unit having a hexafluoroisopropanol structure.

(18) The positive resist composition as described in any one of (1) to (5) and (12) to (17), which further comprises a dissolution inhibiting compound capable of decomposing under the action of an acid to increase the solubility in an alkali developer and having a molecular weight of 3,000 or less.

(19) The positive resist composition as described in any one of (1) to (5) and (12) to (18), which further comprises a basic compound and/or a fluorine- and/or silicon-containing surfactant.

(20) The positive resist composition as described in (19), wherein the basic compound is a compound having a structure selected from an imidazole structure, a diazabicyclo structure, an onium hydroxide structure, an onium carboxylate structure, a trialkylamine structure, an aniline structure and a pyridine structure, an alkylamine derivative having a hydroxyl group and/or an ether bond, or an aniline derivative having a hydroxyl group and/or an ether bond.

BRIEF DESCRIPTION OF THE DRAWINGS

FIG. 1 is a schematic view showing the state of double exposure process in the present invention.

BEST MODE FOR CARRYING OUT THE INVENTION

The best mode for carrying out the present invention is described below.

Incidentally, in the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

(A) Compound Capable of Generating an Acid Upon Irradiation with Actinic Rays or Radiation The positive resist composition of the present invention contains a compound capable of generating an acid upon irradiation with actinic rays or radiation (hereinafter sometimes referred to as an "acid generator").

The acid generator which can be used may be appropriately selected from a photoinitiator for photocationic polymerization, a photoinitiator for photoradical polymerization, a photo-decoloring agent for coloring matters, a photo-discoloring agent, a compound known to generate an acid upon irradiation with actinic rays or radiation and used for microresist or the like, and a mixture thereof.

Examples thereof include a diazonium salt, a phosphonium salt, a sulfonium salt, an iodonium salt, an imidosulfonate, an oxime sulfonate, a diazodisulfone, a disulfone and an o-nitrobenzyl sulfonate.

Also, a compound where such a group or compound capable of generating an acid upon irradiation with actinic rays or radiation is introduced into the main or side chain of the polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent 126,712 may also be used.

Out of the acid generators, the compounds represented by the following formulae (ZI), (ZII) and (ZIII) are preferred.

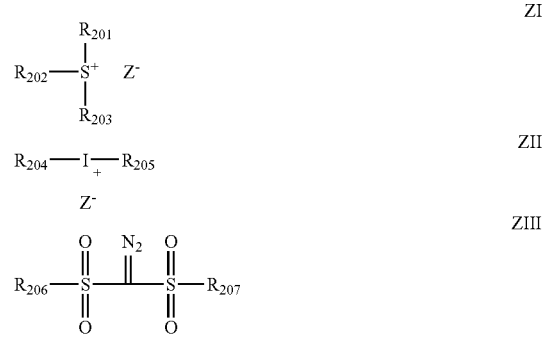

In formula (ZI), $R_{201}$, $R_{202}$ and $R_{203}$ each independently represents an organic group.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

$Z^-$ represents a non-nucleophilic anion.

Examples of the non-nucleophilic anion as $Z^-$ include sulfonate anion, carboxylate anion, sulfonylimide anion, bis(alkylsulfonyl)imide anion and tris(alkylsulfonyl)methyl anion.

The non-nucleophilic anion is an anion having an extremely low ability of causing a nucleophilic reaction and this anion can suppress the decomposition in aging due to intramolecular nucleophilic reaction. By virtue of this anion, the aging stability of the resist is enhanced.

Examples of the sulfonate anion include aliphatic sulfonate anion, aromatic sulfonate anion and camphorsulfonate anion.

Examples of the carboxylate anion include aliphatic carboxylate anion, aromatic carboxylate anion and aralkylcarboxylate anion.

The aliphatic moiety in the aliphatic sulfonate anion may be an alkyl group or a cycloalkyl group but is preferably an alkyl group having a carbon number of 1 to 30 or a cycloalkyl group having a carbon number of 3 to 30, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a boronyl group.

The aromatic group in the aromatic sulfonate anion is preferably an aryl group having a carbon number of 6 to 14, and examples thereof include a phenyl group, a tolyl group and a naphthyl group.

The alkyl group, cycloalkyl group and aryl group in the aliphatic sulfonate anion and aromatic sulfonate anion each may have a substituent. Examples of the substituent for the alkyl group, cycloalkyl group and aryl group in the aliphatic sulfonate anion and aromatic sulfonate anion include a nitro group, a halogen atom (e.g., fluorine, chlorine, bromine, iodine), a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 2 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20) and a cycloalkylakyloxyalkyloxy group (preferably having a carbon number of 8 to 20). As for the aryl group or ring structure in each group, examples of the substituent further include an alkyl group (preferably having a carbon number of 1 to 15).

Examples of the aliphatic moiety in the aliphatic carboxylate anion include the same alkyl group and cycloalkyl group as in the aliphatic sulfonate anion.

Examples of the aromatic group in the aromatic carboxylate anion include the same aryl group as in the aromatic sulfonate anion.

The aralkyl group in the aralkylcarboxylate anion is preferably an aralkyl group having a carbon number of 6 to 12, and examples thereof include a benzyl group, a phenethyl group, a naphthylmethyl group, a naphthylethyl group and a naphthylmethyl group.

The alkyl group, cycloalkyl group, aryl group and aralkyl group in the aliphatic carboxylate anion, aromatic carboxylate anion and aralkylcarboxylate anion each may have a substituent. Examples of the substituent for the alkyl group, cycloalkyl group, aryl group and aralkyl group in the aliphatic carboxylate anion, aromatic carboxylate anion and aralkylcarboxylate anion include the same halogen atom, alkyl group, cycloalkyl group, alkoxy group and alkylthio group as in the aromatic sulfonate anion.

Examples of the sulfonylimide anion include saccharin anion.

The alkyl group in the bis(alkylsulfonyl)imide anion and tris(alkylsulfonyl)methyl anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group. Examples of the substituent for such an alkyl group include a halogen atom, a halogen atom-substituted alkyl group, an alkoxy group, an alkylthio group, an alkyloxysulfonyl group, an aryloxysulfonyl group and a cycloalkylaryloxysulfonyl group. Among these, an alkyl group substituted by a fluorine atom is preferred.

Other examples of the non-nucleophilic anion include fluorinated phosphorus, fluorinated boron and fluorinated antimony.

The non-nucleophilic anion of $Z^-$ is preferably an aliphatic sulfonate anion with the sulfonic acid being substituted by a fluorine atom at the α-position, an aromatic sulfonate anion substituted by a fluorine atom or a fluorine atom-containing group, a bis(alkylsulfonyl)imide anion with the alkyl group being substituted by a fluorine atom, or a tris(alkylsulfonyl) methide anion with the alkyl group being substituted by a fluorine atom, more preferably a perfluoroaliphatic sulfonate anion having a carbon number of 4 to 8, or a benzenesulfonate anion having a fluorine atom, still more preferably nonafluorobutanesulfonate anion, perfluorooctanesulfonate anion, pentafluorobenzenesulfonate anion or 3,5-bis(trifluoromethyl)benzenesulfonate anion.

Examples of the organic group as $R_{201}$, $R_{202}$ and $R_{203}$ include the corresponding groups in the compounds (ZI-1), (ZI-2) and (ZI-3) described later.

The compound may be a compound having a plurality of structures represented by formula (ZI), for example, may be a compound having a structure that at least one of $R_{201}$ to $R_{203}$ in the compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (ZI) is an aryl group, that is, a compound having arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the aryl group having a heterocyclic structure include a pyrrole residue (a group formed by removing one hydrogen atom from a pyrrole), a furan residue (a group formed by removing one hydrogen atom from a furan), a thiophene residue (a group formed by removing one hydrogen atom from a thiophene), an indole residue (a group formed by removing one hydrogen atom from an indole), a benzofuran residue (a group formed by removing one hydrogen atom from a benzofuran) and a benzothiophene residue (a group formed by removing one hydrogen atom from a benzothiophene). In the case where the arylsulfonium compound has two or more aryl groups, these two or more aryl groups may be the same or different.

The alkyl group or cycloalkyl group which is present, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

The compound (ZI-2) is described below.

The compound (ZI-2) is a compound where $R_{201}$ to $R_{203}$ in formula (ZI) each independently represents an organic group having no aromatic ring. The aromatic ring as used herein includes an aromatic ring containing a heteroatom.

The organic group having no aromatic ring as $R_{201}$ to $R_{203}$ has a carbon number of generally from 1 to 30, preferably from 1 to 20.

$R_{201}$ to $R_{203}$ each independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group or cycloalkyl group of $R_{201}$ to $R_{203}$ is preferably a linear or branched alkyl group having a carbon number of 1 to 10 (e.g., methyl, ethyl, propyl, butyl, pentyl) or a cycloalkyl group having a carbon number of 3 to 10 (e.g., cyclopentyl, cyclohexyl, norbornyl). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C=O at the 2-position of the above-described alkyl group.

The 2-oxocycloalkyl group is preferably a group having >C=O at the 2-position of the above-described cycloalkyl group.

The alkoxy group in the alkoxycarbonylmethyl group is preferably an alkoxy group having a carbon number of 1 to 5 (e.g., methoxy, ethoxy, propoxy, butoxy, pentoxy).

$R_{201}$ to $R_{203}$ each may be further substituted by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

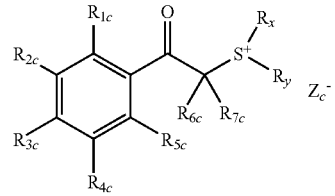

(ZI-3)

In formula (ZI-3), $R_{1c}$ to $R_{5c}$ each independently represents a hydrogen atom, an alkyl group, a cycloalkyl group, an alkoxy group or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group or a vinyl group.

Any two or more members out of $R_{1c}$ to $R_{5c}$, a pair of $R_{6c}$ and $R_{7c}$, or a pair of $R_x$ and $R_y$ may combine with each other to form a ring structure. This ring structure may contain an oxygen atom, a sulfur atom, an ester bond or an amido bond. Examples of the group formed by combining any two or more members out of $R_{1c}$ to $R_{5c}$, a pair of $R_{6c}$ and $R_{7c}$, or a pair of $R_x$ and $R_y$ include a butylene group and a pentylene group.

$Zc^-$ represents a non-nucleophilic anion, and examples thereof are the same as those of the non-nucleophilic anion of $Z^-$ in formula (ZI).

The alkyl group as $R_{1c}$ to $R_{7c}$ may be either linear or branched, and examples thereof include a linear or branched alkyl group having a carbon number of 1 to 20, preferably from 1 to 12 (e.g., methyl, ethyl, linear or branched propyl, linear or branched butyl, linear or branched pentyl). Examples of the cycloalkyl group include a cycloalkyl group having a carbon number of 3 to 8 (e.g., cyclopentyl, cyclohexyl).

The alkoxy group as $R_{1c}$ to $R_{5c}$ may be linear, branched or cyclic, and examples thereof include an alkoxy group having a carbon number of 1 to 10, preferably from 1 to 5 (e.g., methoxy, ethoxy, linear or branched propoxy, linear or branched butoxy, linear or branched pentoxy) and a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. By virtue of such a compound, the solubility in a solvent is more enhanced and production of particles during storage can be suppressed.

Examples of the alkyl group and cycloalkyl group as $R_x$ and $R_y$ are the same as those of the alkyl group and cycloalkyl group in $R_{1c}$ to $R_{7c}$. Among these, a 2-oxoalkyl group, a 2-oxocycloalkyl group and an alkoxycarbonylmethyl group are preferred.

Examples of the 2-oxoalkyl group and 2-oxocycloalkyl group include a group having >C=O at the 2-position of the alkyl group or cycloalkyl group as $R_{1c}$ to $R_{7c}$.

Examples of the alkoxy group in the alkoxycarbonylmethyl group are the same as those of the alkoxy group in $R_{1c}$ to $R_{5c}$.

$R_x$ and $R_y$ each is preferably an alkyl or cycloalkyl group having a carbon number of 4 or more, more preferably 6 or more, still more preferably 8 or more.

In formulae (ZII) and (ZIII), $R_{204}$ to $R_{207}$ each independently represents an aryl group, an alkyl group or a cycloalkyl group.

The aryl group of $R_{204}$ to $R_{207}$ is preferably a phenyl group or a naphthyl group, more preferably a phenyl group. The aryl group of $R_{204}$ and $R_{207}$ may be an aryl group having a heterocyclic structure containing an oxygen atom, a nitrogen atom, a sulfur atom or the like. Examples of the aryl group having a heterocyclic structure include a pyrrole residue (a group formed by removing one hydrogen atom from a pyrrole), a furan residue (a group formed by removing one hydrogen atom from a furan), a thiophene residue (a group formed by removing one hydrogen atom from a thiophene), an indole residue (a group formed by removing one hydrogen atom from an indole), a benzofuran residue (a group formed by removing one hydrogen atom from a benzofuran) and a benzothiophene residue (a group formed by removing one hydrogen atom from a benzothiophene).

The alkyl group or cycloalkyl group in $R_{204}$ to $R_{207}$ is preferably a linear or branched alkyl group having a carbon number of 1 to 10 (e.g., methyl, ethyl, propyl, butyl, pentyl) or a cycloalkyl group having a carbon number of 3 to 10 (e.g., cyclopentyl, cyclohexyl, norbornyl).

The aryl group, alkyl group and cycloalkyl group of $R_{204}$ to $R_{207}$ each may have a substituent. Examples of the substituent which the aryl group, alkyl group and cycloalkyl group of $R_{204}$ to $R_{207}$ each may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$Z^-$ represents a non-nucleophilic anion, and examples thereof are the same as those of the non-nucleophilic anion of $Z^-$ in formula (ZI).

Other examples of the acid generator include the compounds represented by the following formulae (ZIV), (ZV) and (ZVI).

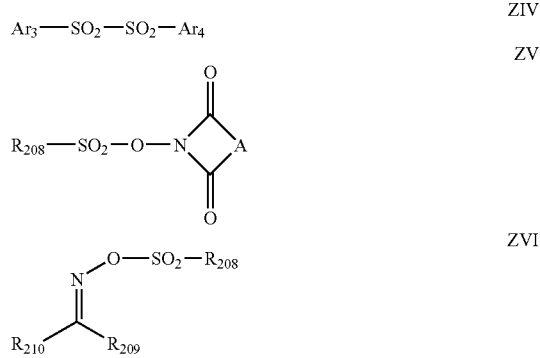

In formulae (ZIV) to (ZVI), $Ar_3$ and $Ar_4$ each independently represents an aryl group.

$R_{208}$, $R_{209}$ and $R_{210}$ each independently represents an alkyl group, a cycloalkyl group or an aryl group.

A represents an alkylene group, an alkenylene group or an arylene group.

Among the acid generators, more preferred are the compounds represented by formulae (ZI) to (ZIII).

The acid generator is preferably a compound capable of generating an acid having one sulfonic acid group or imide group, more preferably a compound capable of generating a monovalent perfluoroalkanesulfonic acid, a compound capable of generating a monovalent aromatic sulfonic acid substituted by a fluorine atom or a fluorine atom-containing group, or a compound capable of generating a monovalent imide acid substituted by a fluorine atom or a fluorine atom-containing group, still more preferably a sulfonium salt of fluoro-substituted alkanesulfonic acid, fluorine-substituted benzenesulfonic acid, fluorine-substituted imide acid or fluorine-substituted methide acid. In particular, the acid generated from the acid generator which can be used is preferably a fluoro-substituted alkanesulfonic acid, a fluoro-substituted benzenesulfonic acid or a fluoro-substituted imide acid and has a pKa of −1 or less, and in this case, the sensitivity can be enhanced.

Among the acid generators, particularly preferred compounds are set forth below.

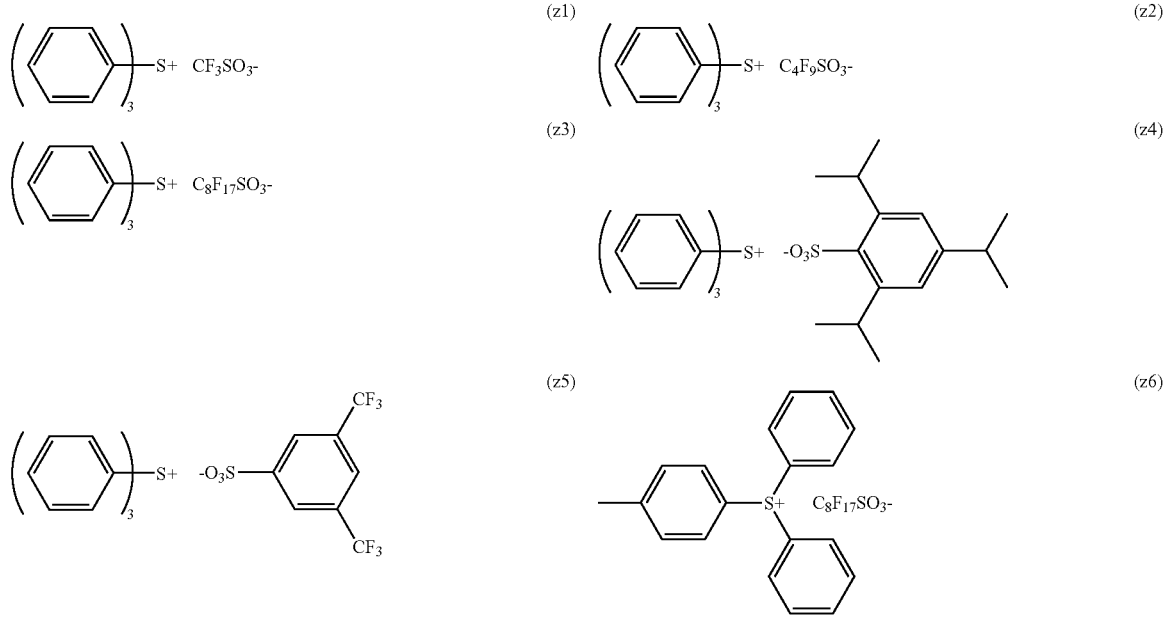

-continued
(z7) 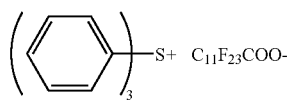
(z8) 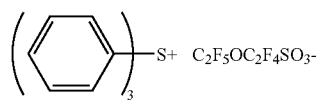
(z9) 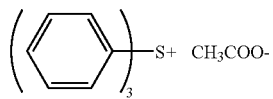
(z10) 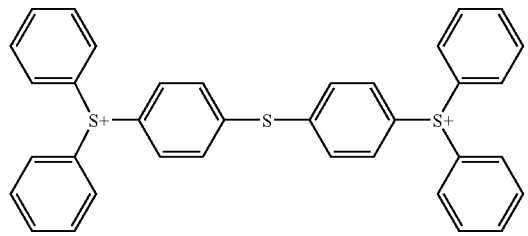 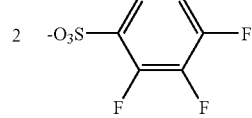
(z11) 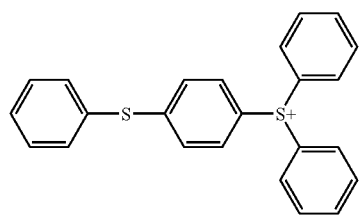 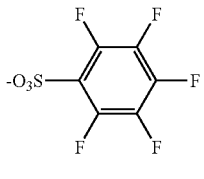
(z12) 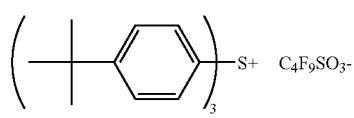
(z13) 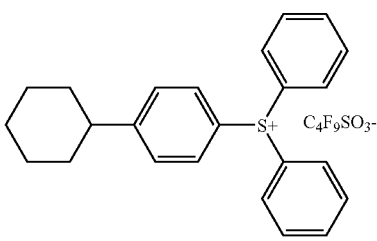
(z14) 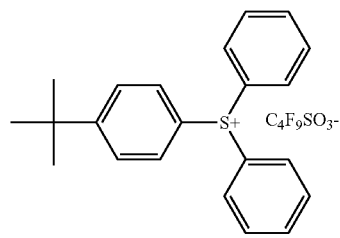
(z15) 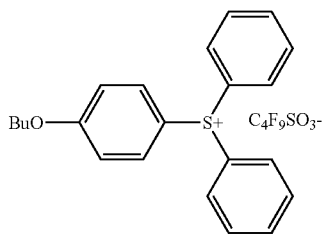
(z16) 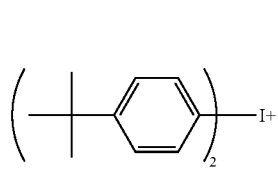 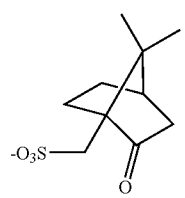
(z17) 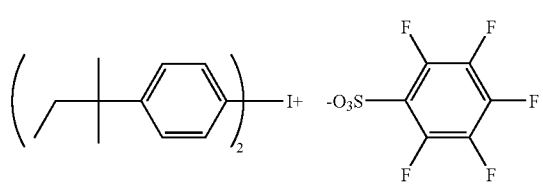
(z18) 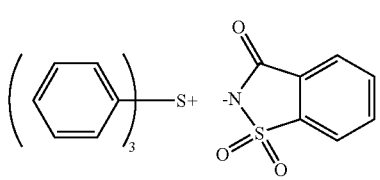

-continued
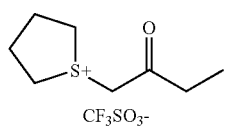
(z21)
(z22)
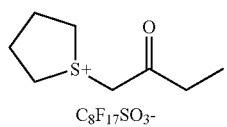
(z23)
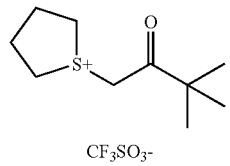
(z24)
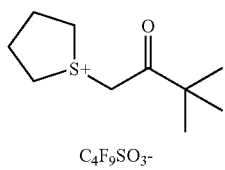
(z25)
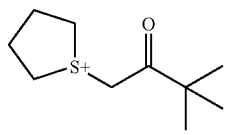
(z26)
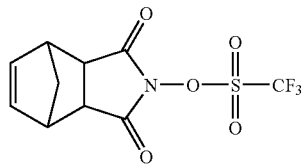
(z27)
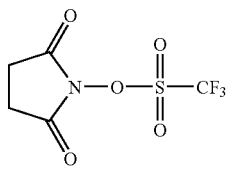
(z28)
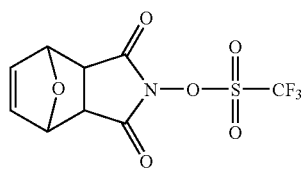
(z29)
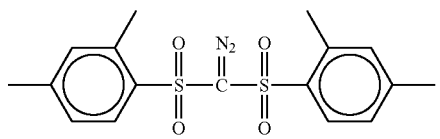
(z30)
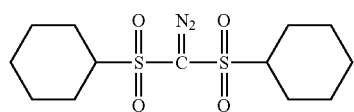
(z31)
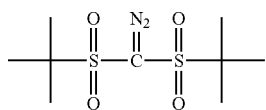
(z32)
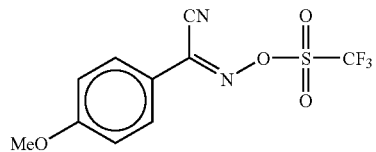
(z33)
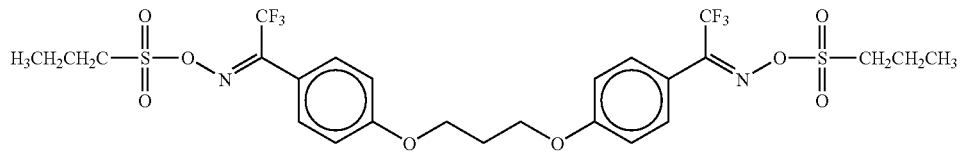
(z34)
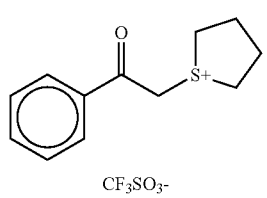
(z35)
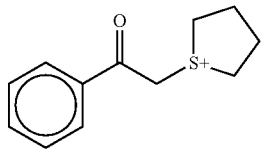
(z36)

-continued
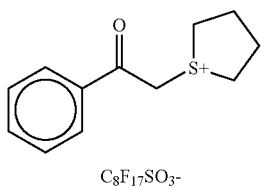
(z37)
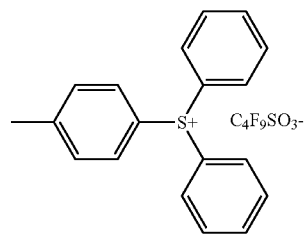
(z38)
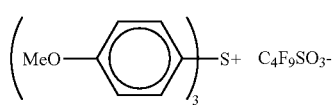
(z39)
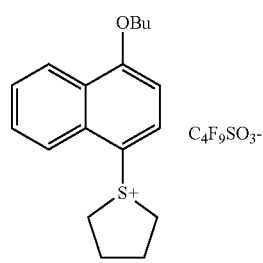
(z40)
(z41)
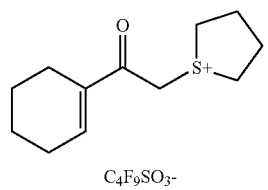
(z42)
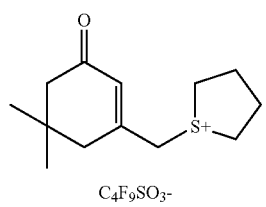
(z43)
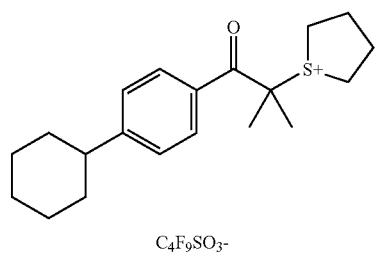
(z44)
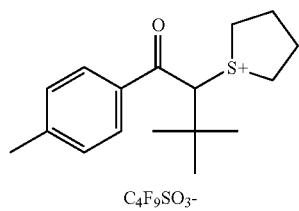
(z45)
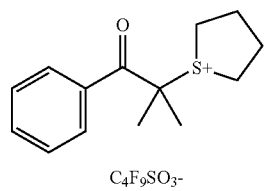
(z46)
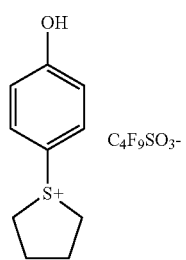
(z47)
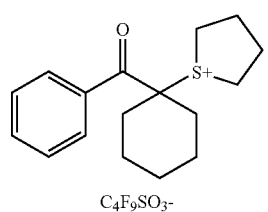
(z48)

-continued
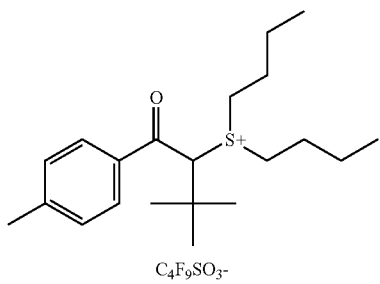 (z49)
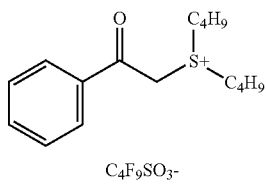 (z50)
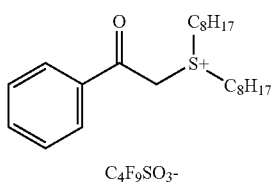 (z51)
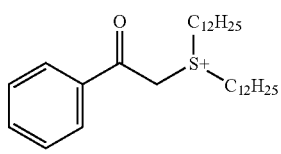 (z52)
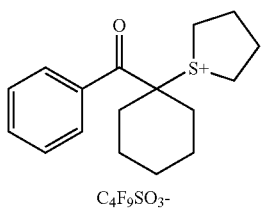 (z53)
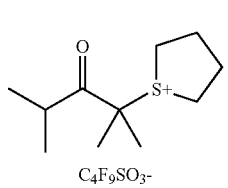 (z54)
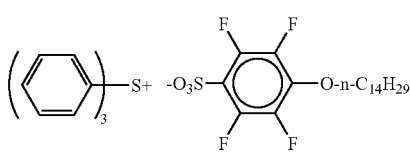 (z55)
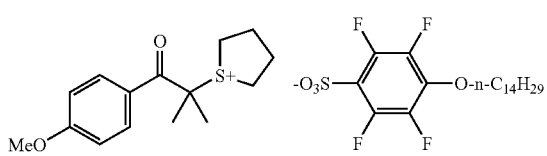 (z56)
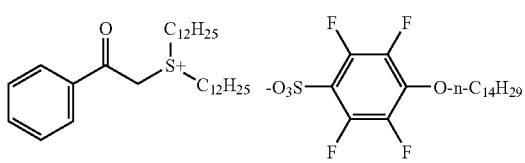 (z57)
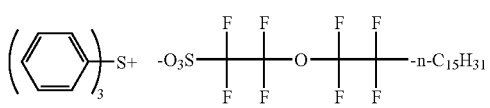 (z58)
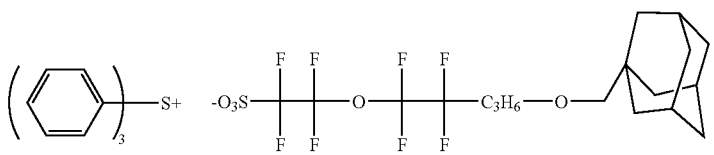 (Z59)
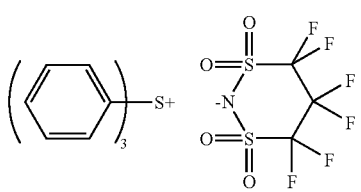 (z60)
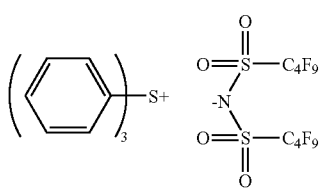 (z62)
(z61)

-continued
(z63)
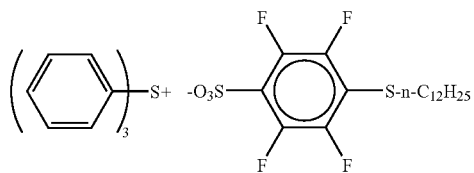
(z64)
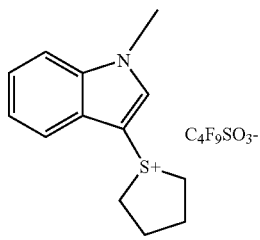
(z65)
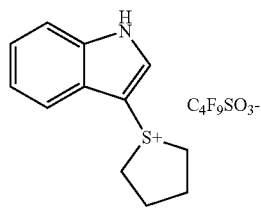
(z66)
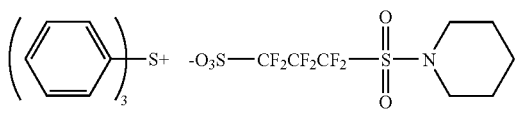
(z67)
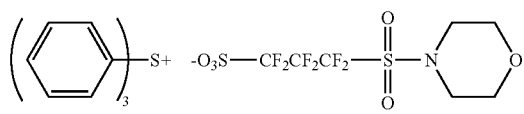
(z68)
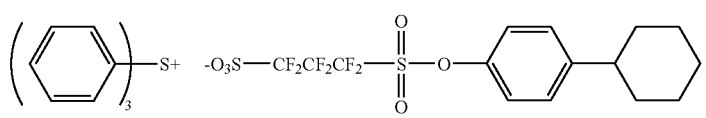
(z69)
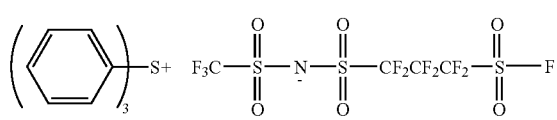
(z70)
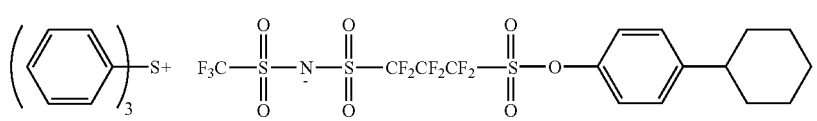
(z71)
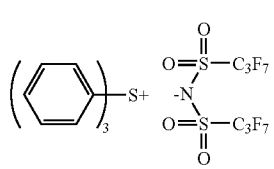
(z72)
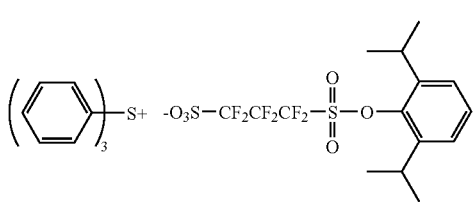
(z73)
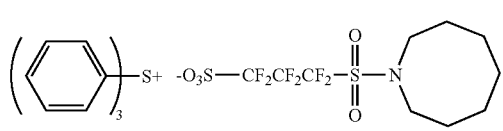
(z74)
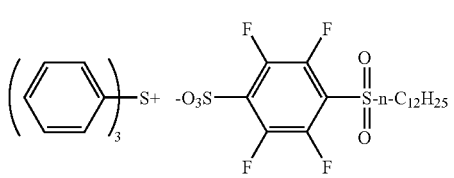
(z75)
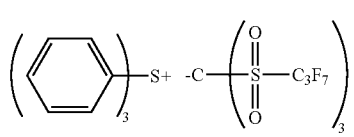
(z76)
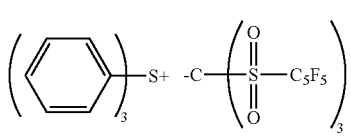

-continued
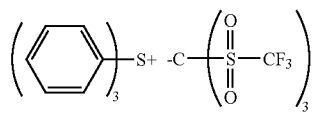 (z77)
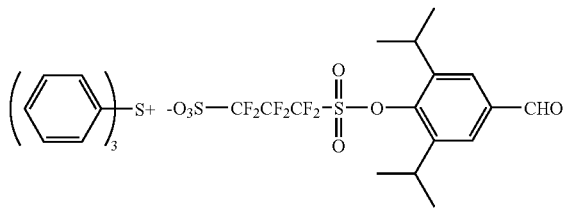 (z78)
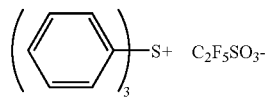 (z79)
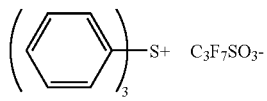 (z80)
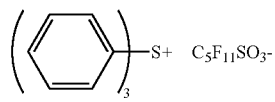 (z81)
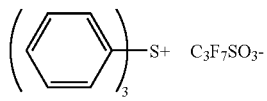 (Z82)
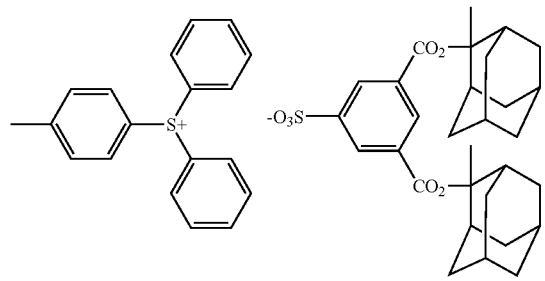 (z83)
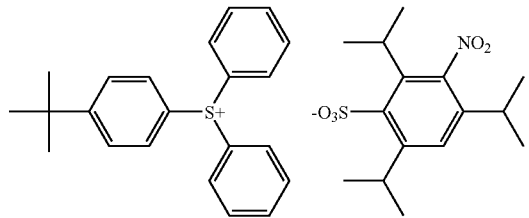 (z84)
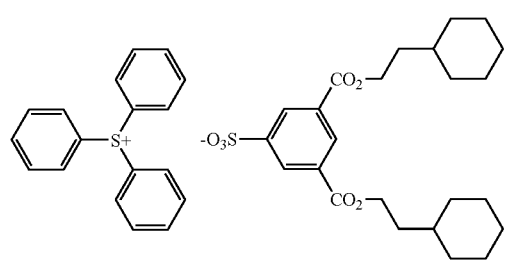 (z85)
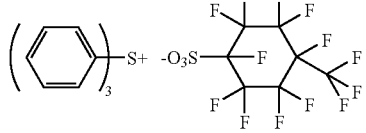 (z86)
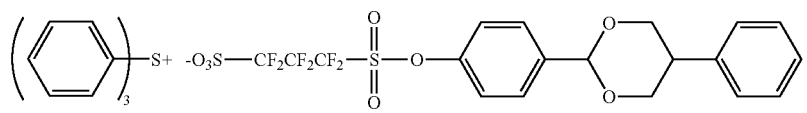 (z87)
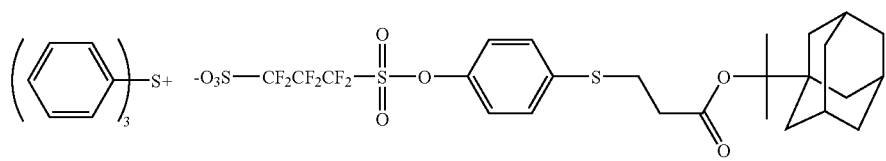 (z88)

-continued

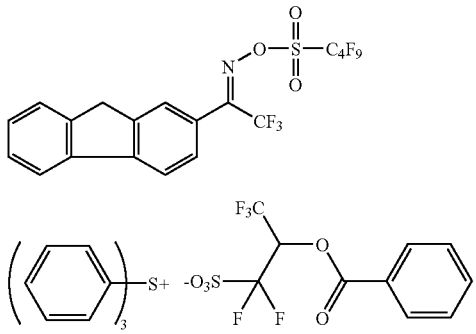
(z89)

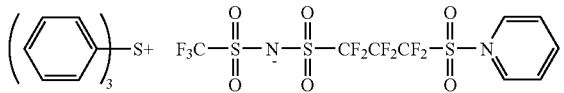
(z90)

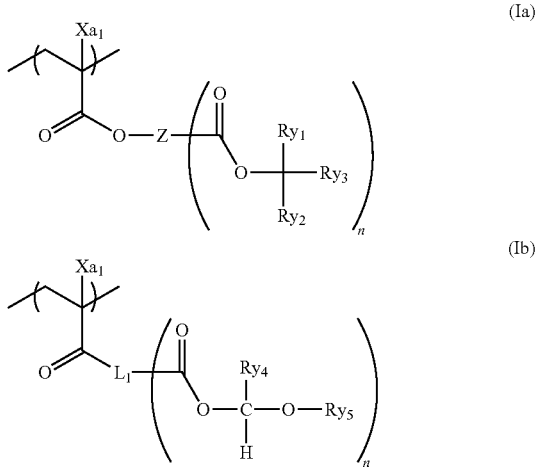
(z91)

One acid generator may be used alone or two or more kinds of acid generators may be used in combination.

The content of the acid generator in the positive resist composition is preferably from 0.1 to 20 mass %, more preferably from 0.5 to 10 mass %, still more preferably from 1 to 7 mass %, based on the entire solid content of the positive resist composition.

(B) Resin of Which Solubility in an Alkali Developer Increases Under the Action of an Acid The positive resist composition of the present invention contains a resin of which solubility in an alkali developer increases under the action of an acid (sometimes called a "resin (B)").

The resin (B) is preferably a resin having a repeating unit represented by the following formula (Ia) and/or a repeating unit represented by the following formula (Ib).

In formulae (Ia) and (Ib), $Xa_1$ represents a hydrogen atom, an alkyl group, a cyano group or a halogen atom.

$Ry_1$ to $Ry_3$ each independently represents an alkyl group or a cycloalkyl group, and at least two members out of $Ry_1$ to $Ry_3$ may combine to form a monocyclic or polycyclic cyclohydrocarbon structure.

Z represents a (n+1)-valent linking group.

$Ry_4$ and $Ry_5$ each independently represents an alkyl group or a cycloalkyl group, and $Ry_4$ and $Ry_5$ may combine to form a monocyclic or polycyclic cyclohydrocarbon structure.

$L_1$ represents a (n+1)-valent linking group.

n represents an integer of 1 to 3.

In formula (Ia), the alkyl group of $Xa_1$ is preferably a linear alkyl group having a carbon number of 1 to 5, and examples thereof include a methyl group. The alkyl group of $Xa_1$ may be substituted by a hydroxyl group, a halogen atom or the like.

$Xa_1$ is preferably a hydrogen atom or a methyl group.

The alkyl group of $Ry_1$ to $Ry_3$ may be either a linear alkyl group or a branched alkyl group and may have a substituent. The linear or branched alkyl group is preferably a linear or branched alkyl group having a carbon number of 1 to 8, more preferably from 1 to 4, and examples thereof include a methyl group, an ethyl group, a propyl group, an isopropyl group, a butyl group, an isobutyl group and a tert-butyl group, with a methyl group and an ethyl group being more preferred.

The cycloalkyl group of $Ry_1$ to $Ry_3$ includes, for example, a monocyclic cycloalkyl group having a carbon number of 3 to 8 and a polycyclic cycloalkyl group having a carbon number of 7 to 14, and may have a substituent. Preferred examples of the monocyclic alkyl group include a cyclopentyl group, a cyclohexyl group and a cyclopropyl group, and preferred examples of the polycyclic cycloalkyl group include an adamantyl group, a norbornane group, a tetracyclododecanyl group, a tricyclodecanyl group and a diamantyl group.

The monocyclic cyclohydrocarbon structure formed by combining at least two members out of $Ry_1$ to $Ry_3$ is preferably a cyclopentyl group or a cyclohexyl group. The polycyclic cyclohydrocarbon structure formed by combining at least two members out of $Ry_1$ to $Ry_3$ is preferably an adamantyl group, a norbornyl group or a tetracyclododecanyl group.

Z is preferably an (n+1)-valent linking group having a carbon number of 1 to 20, more preferably a group formed by removing (n−1) hydrogen atoms from a linear alkylene group having a carbon number of 1 to 4, a cyclic alkylene group having a carbon number of 5 to 20, or a divalent linking group comprising a combination thereof, and may further have an oxy group, a carbonyl group or the like, if desired. The chain alkylene group having a carbon number of 1 to 4 includes a methylene group, an ethylene group, a propylene group and a butylene group, and may be linear or branched. A methylene group is preferred. The cyclic alkylene group having a carbon number of 5 to 20 includes a monocyclic cycloalkylene group such as cyclopentylene group and cyclohexylene group, and a polycyclic cycloalkylene group such as norbornylene group and adamantylene group. An adamantylene group is preferred.

The polymerizable compound for forming the repeating unit represented by formula (Ia) can be easily synthesized by a known method. For example, by using the same means as the method described in JP-A-2005-331918, as shown in the formula below, an alcohol and a carboxylic halogenide compound are reacted under basic conditions, and the reaction product is reacted with a carboxylic acid compound under basic conditions, whereby the polymerizable compound can be synthesized.
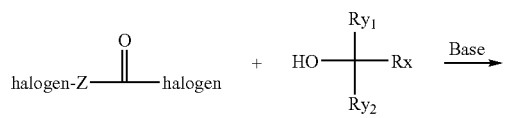
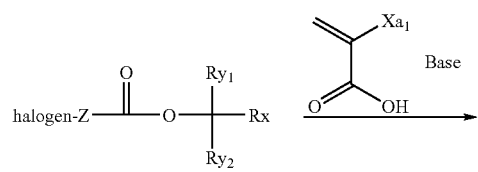
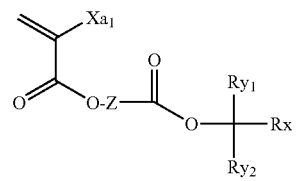
Specific preferred examples of the repeating unit represented by formula (Ia) are set forth below, but the present invention is not limited thereto.
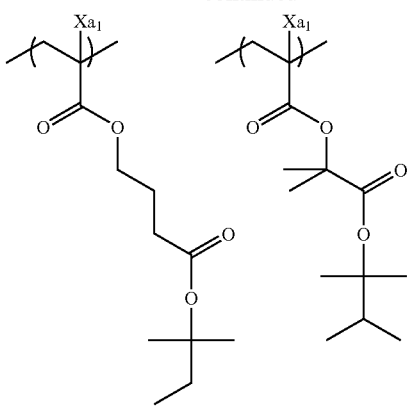
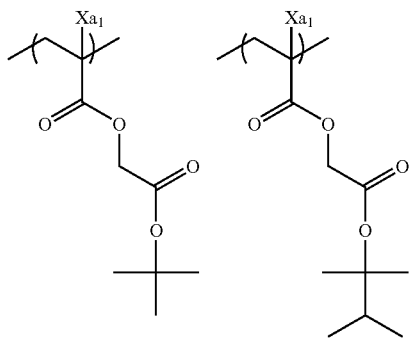
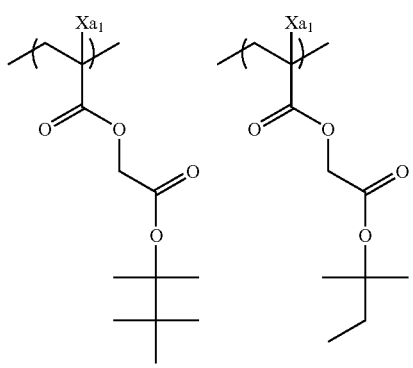
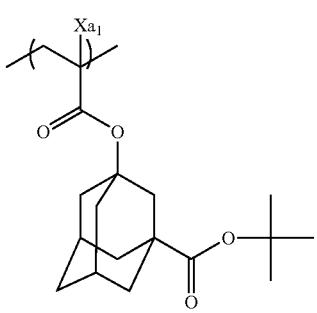
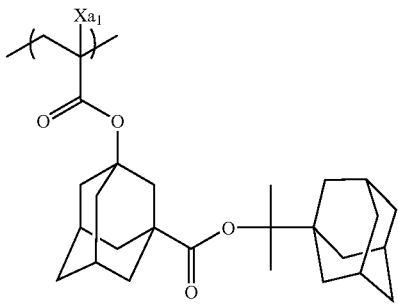
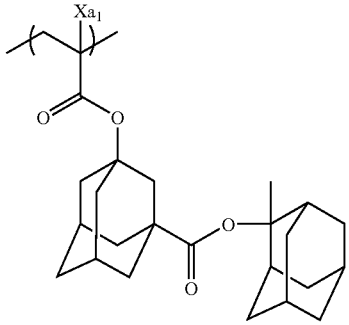
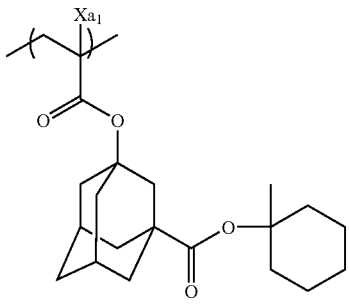

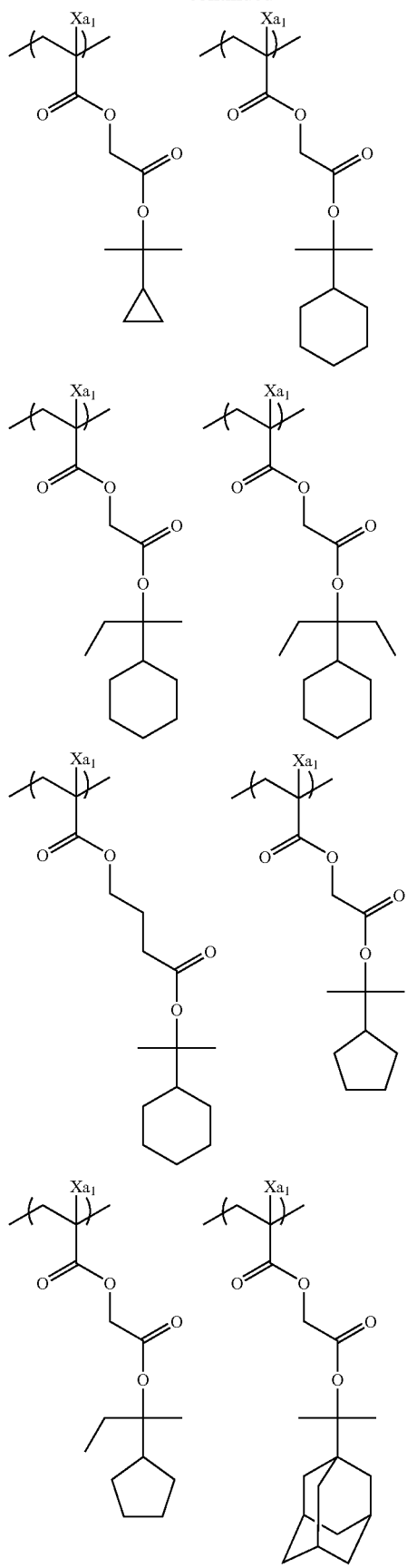
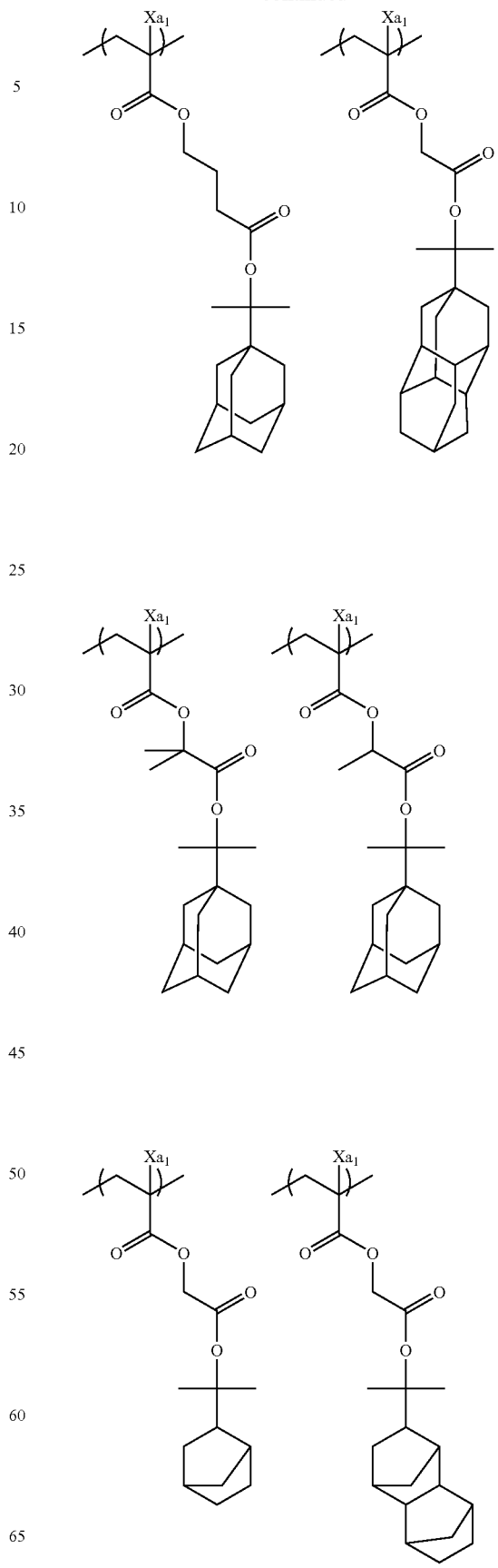

-continued
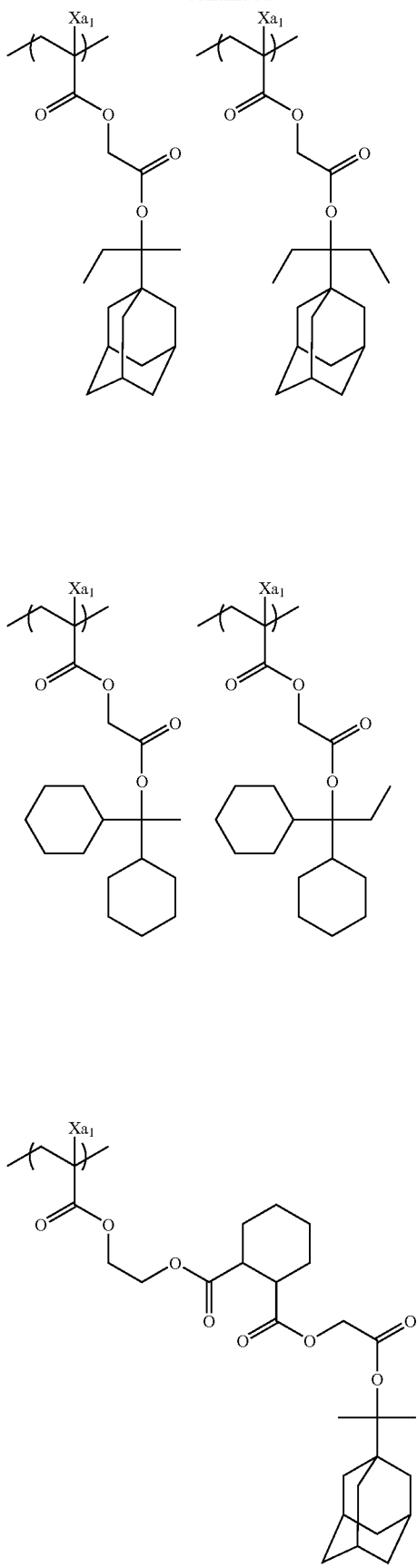
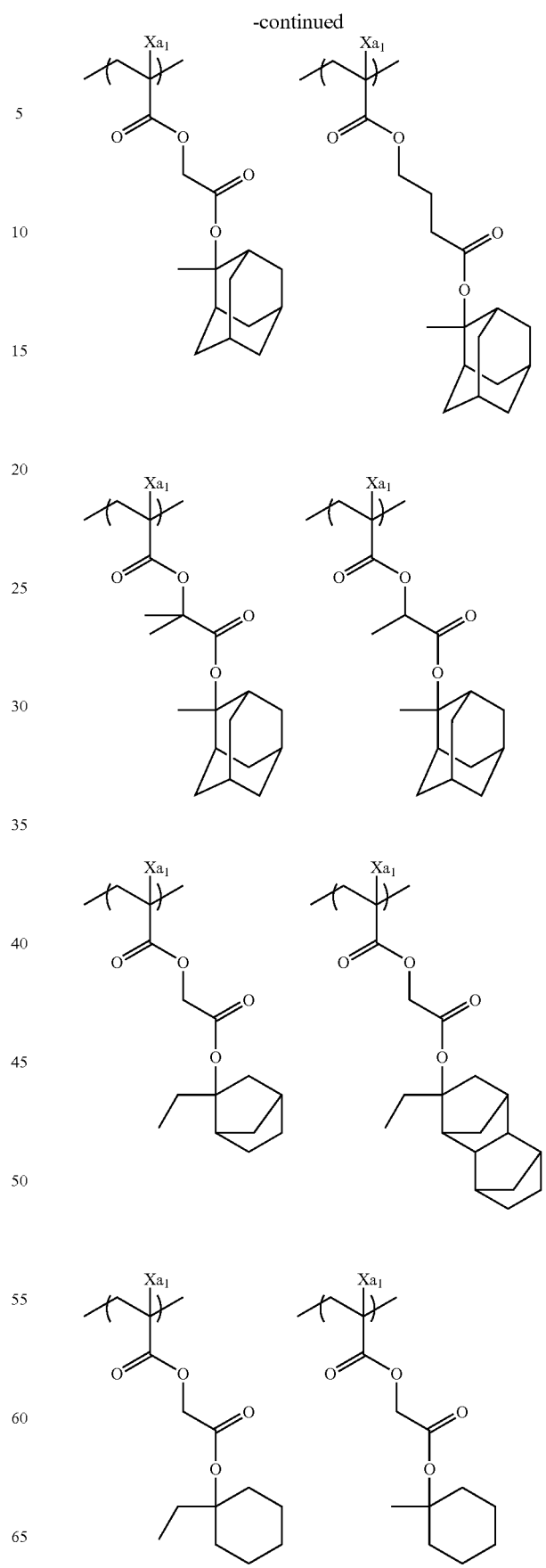

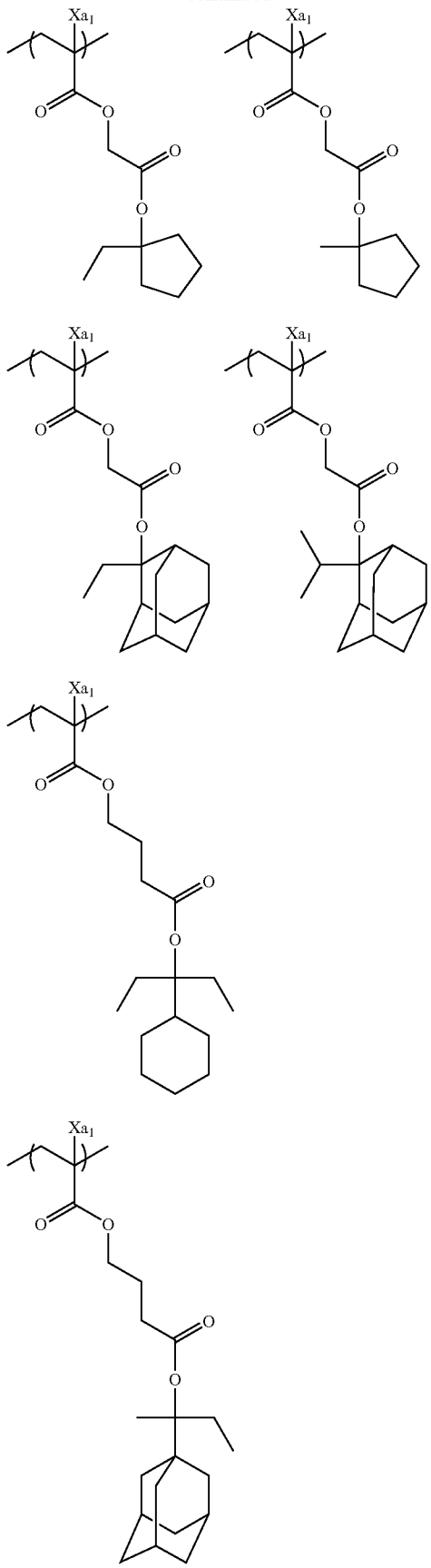
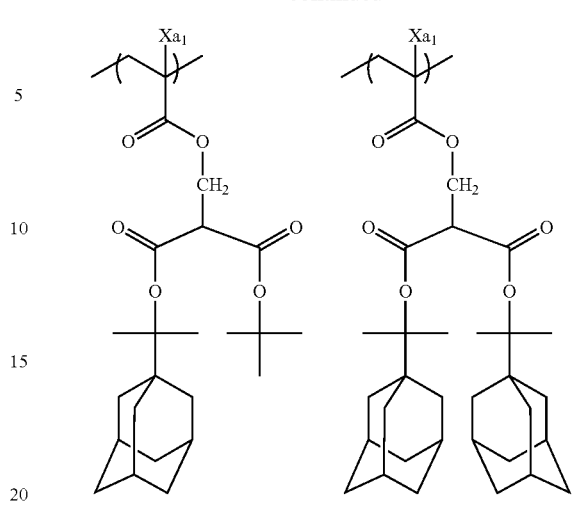

$Xa_1$ in formula (Ib) is the same as $Xa_1$ in formula (Ia).

The alkyl group of $Ry_4$ and $Ry_5$ may have a substituent and is preferably a linear or branched alkyl group having a carbon number of 1 to 20, more preferably a linear or branched alkyl group having a carbon number of 1 to 10, still more preferably a methyl group, an ethyl group, a propyl group, an isopropyl group, an n-butyl group, an isobutyl group, sec-butyl group, a tert-butyl group, a pentyl group, a hexyl group, a heptyl group, an octyl group, a nonyl group or a decyl group.

The cycloalkyl group of $Ry_4$ and $Ry_5$ may be monocyclic or polycyclic or may have a substituent and includes a group having a carbon number of 5 or more and having a monocyclo, bicyclo, tricyclo or tetracyclo structure. The carbon number thereof is preferably from 6 to 30, more preferably from 7 to 25.

Preferred examples of the cycloalkyl group include an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. Among these, more preferred are an adamantyl group, a decalin residue, a norbornyl group, a cedrol group, a cyclohexyl group, a cycloheptyl group, a cyclooctyl group, a cyclodecanyl group and a cyclododecanyl group.

Examples of the substituent which the alkyl group and cycloalkyl group each may have include a hydroxyl group, a carboxy group, a cyano group, a halogen atom (e.g., chlorine, bromine, fluorine, iodine), an alkoxy group (preferably having a carbon number of 1 to 4; e.g., methoxy, ethoxy, propoxy, butoxy), an acyl group (preferably having a carbon number of 2 to 5; e.g., formyl, acetyl), an acyloxy group (preferably having a carbon number of 2 to 5; e.g., acetoxy), an aryl group (preferably having a carbon number of 6 to 14; e.g., phenyl), and a cycloalkyl group (for example, the cycloalkyl group as $Ry_4$ and $Ry_5$).

As for the cyclic structure possessed by the substituent above, examples of the substituent further include an alkyl group (for example, the alkyl group as $Ry_4$ and $Ry_5$).

The (n+1)-valent linking group of $L_1$ includes, for example, an (n+1)-valent linking group formed by arbitrarily combining the following linking blocks or the bonds of two or more linking blocks, with each other.

Examples of the linking group include (L-1) to (L-23) shown below.

In the formulae shown below, each $R^L$ independently represents a hydrogen atom, a halogen atom, a hydroxyl group, a mercapto group, a monovalent organic group, or a single bond connecting to an arbitrary atom constituting the linking group. $Z^-$ is not particularly limited as long as it is an anion corresponding to the conjugate base of an organic or inorganic acid, and may be a polyvalent anion. The anion includes an anion corresponding to the conjugate base of an organic acid, such as $R^{a1}-SO_3^-$, $R^{a1}-SO_2^-$, $R^{a1}-CO_2^-$, $R^{a1}-CS_2^-$, $R^{a1}-O-CS_2^-$, $R^{a1}-S-CS_2^-$, $R^{a1}-O-PO_2^-$, $(R^{a1}-O)_2PO_2^-$, $R^{a1}(R^{a1}-O)PO_2^-$, $R^{a1}-EW^1-Z-EW^2-R^{a1}$, $(R^{a1})B^-$ and $Ar^xO^-$, and an anion corresponding to the conjugate base of an inorganic acid, such as $F^-$, $Cl^-$, $Br^-$, $I^-$, $PF_6^-$, $BF_4^-$, $SbF_6^-$, $ClO_4^-$, $SO_4^{2-}$, $NO_3^-$, $CO_3^{2-}$, $SCN^-$, $CN^-$, $SiF_6^-$, $FSO_3^-$, $I_3^-$, $Br_e^-$ and $Ibr_2^-$. Here, $R^{a1}$ is an organic substituent and represents an alkyl group, an alkenyl group, an alkynyl group, an aryl group, an aralkyl group, or a group further substituted by such a group. In the case where a plurality of $R^{a1}$'s are present in the molecule, these may be independently selected or may combine with each other to form a ring. $EW^1$ and $EW^2$ each represents an electron-withdrawing group, and specific examples thereof include —SO—, —CO—, —SO$_2$— and —CN. Z represents —$CR^{z1}$— or —N— ($R^{z1}$ is a hydrogen atom or a substituent). $Ar^x$ represents an aryl group.

(L-1) —O—
(L-2) —S—
(L-3) —N(R$^L$)—
(L-4) —C(R$^L$)(R$^L$)—
(L-5) —C(=C(R$^L$)(R$^L$))—
(L-6) —C(=O)—
(L-7) —C(=S)—
(L-8) —C(=N-R$^L$)—
(L-9) —S(=O)—
(L-10) —S(=O)$_2$—
(L-11) —C(R$^L$)=C(R$^L$)—
(L-12) —C≡C—
(L-13) —N=C(R$^L$)—
(L-14) —N=N—
(L-15) —N=C=N—
(L-16) (R$^L$)C=C=C(R$^L$)
(L-17) —B(R$^L$)—
(L-18) —P(R$^L$)—
(L-19) —P(=O)(R$^L$)—
(L-20) —Si(R$^L$)(R$^L$)—
(L-21) —N$^⊕$(R$^L$)(R$^L$)— $Z^⊖$
(L-22) —S$^⊕$(R$^L$)— $Z^⊖$
(L-23) —I$^⊕$— $Z^⊖$ $L_1$ is preferably a linking group having at least one block of (L-6), more preferably a linking group having at least one block of (L-4) and at least one block of (L-6), still more preferably a linking group having at least one block of (L-1), at least one block of (L-4) and at least one block of (L-6), yet still more preferably a linking group having at least one block of (L-1), at least one block of (L-4) and at least one block of (L-6), where the total number of blocks constituting the linking group is 4 or more (preferably from 4 to 20).

A preferred embodiment of formula (Ib) is a structure represented by the following formula (1-A).

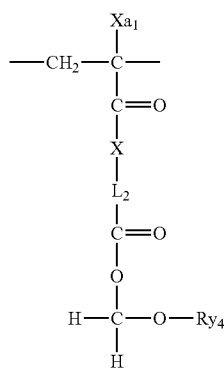

(1-A)

In formula (1-A), $Xa_1$ and $Ry_4$ have the same meanings as in formula (Ib).

$L_2$ represents a divalent linking group out of the (n+1)-valent linking groups of $L_1$ in formula (Ib).

X represents a linking group selected from —O—, —S— and —$NR^x$— (wherein $R^x$ represents a hydrogen atom, an alkyl group or an aryl group).

The linking group as $L_2$ is preferably a linking group having at least one block of (L-4), more preferably a linking group having 2 or more blocks of (L-4) (more preferably from 2 to 18 blocks of (L-4)) and having at least one ring structure formed by combining the plurality of $R^L$'s present in the block, still more preferably a linking group having 3 or more blocks of (L-4) and having at least one ring structure formed by combining the plurality of $R^L$'s present in the block.

X preferably represents a linking group selected from —O—, —S— and —$NR^x$— (wherein $R^x$ represents a hydrogen atom, an alkyl group having a carbon number of 1 to 12, or an aryl group having a carbon number of 6 to 12) and is more preferably —O— or —$NR^x$—, still more preferably —O—.

Suitable examples of the repeating unit represented by formula (Ib) are set forth below, but the present invention is not limited thereto.

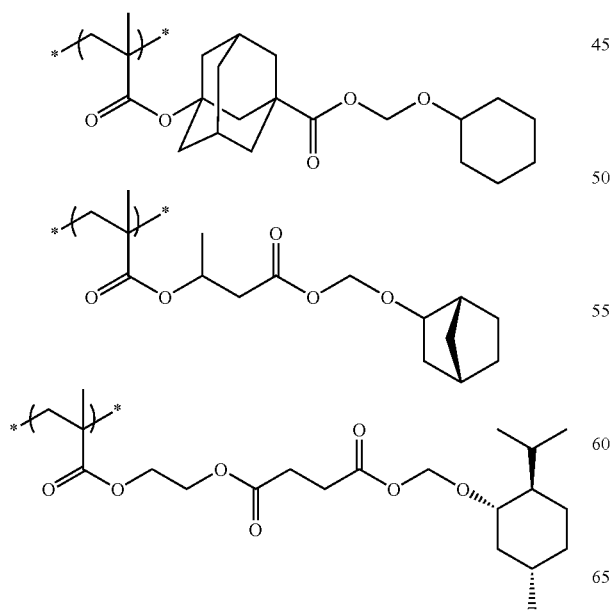

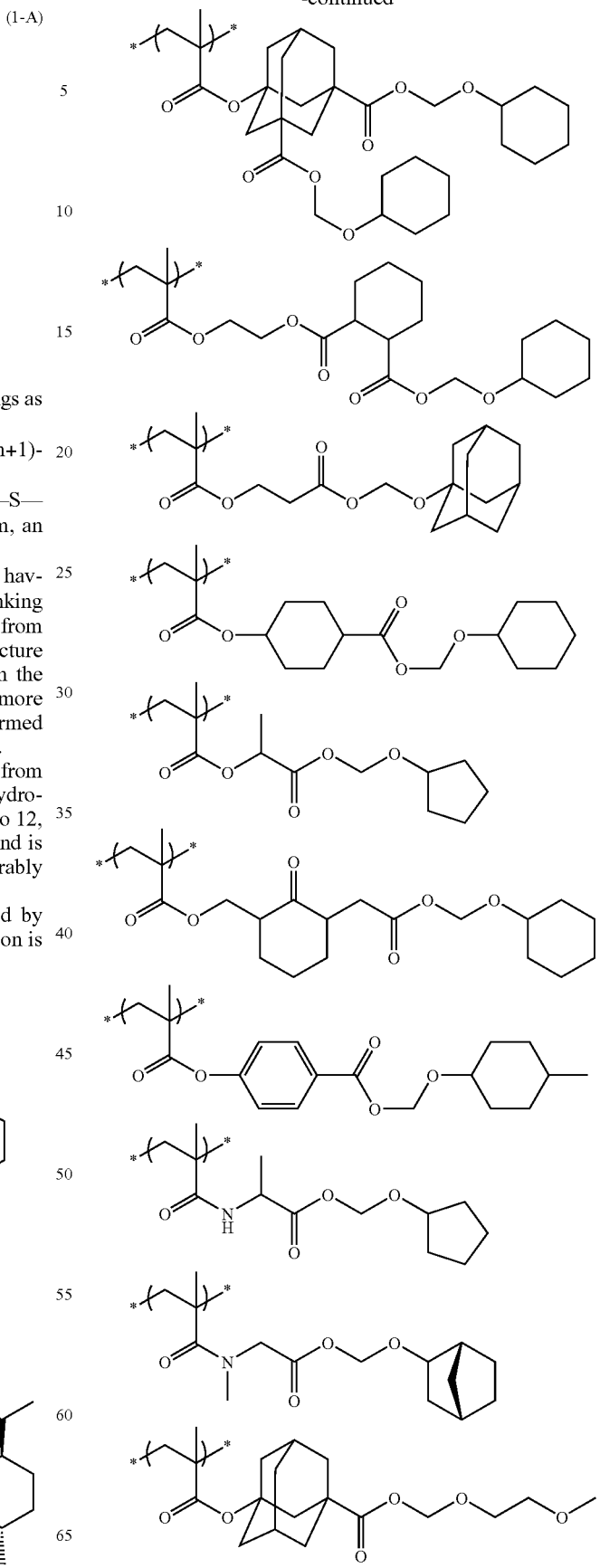

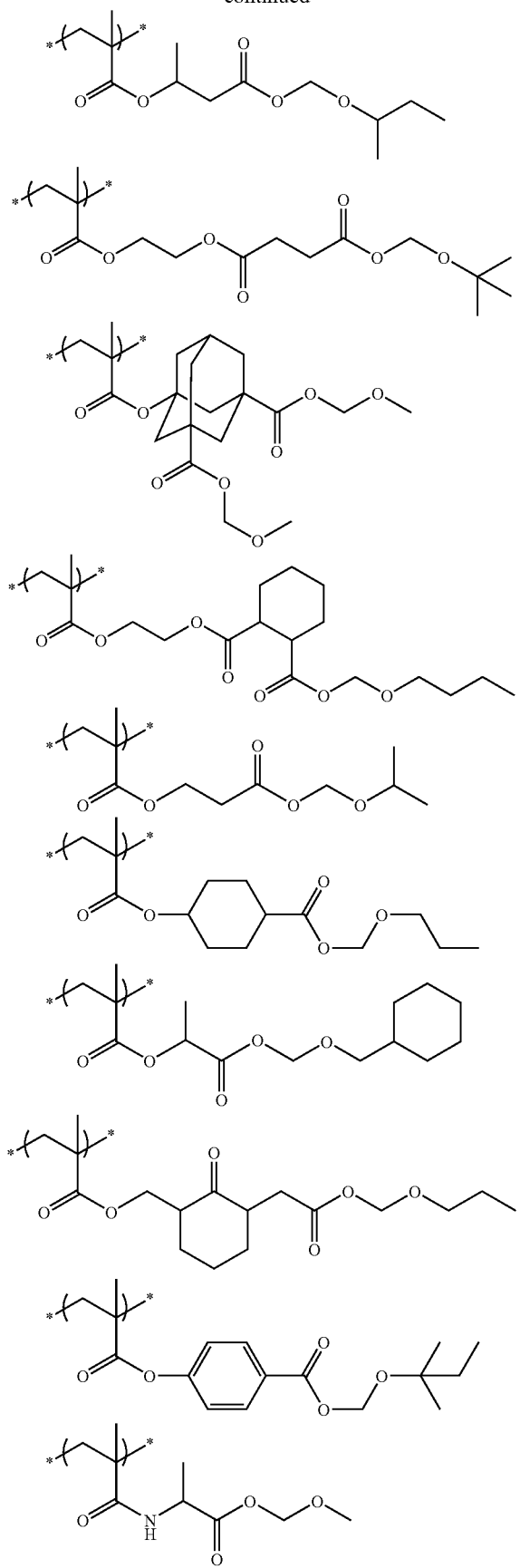
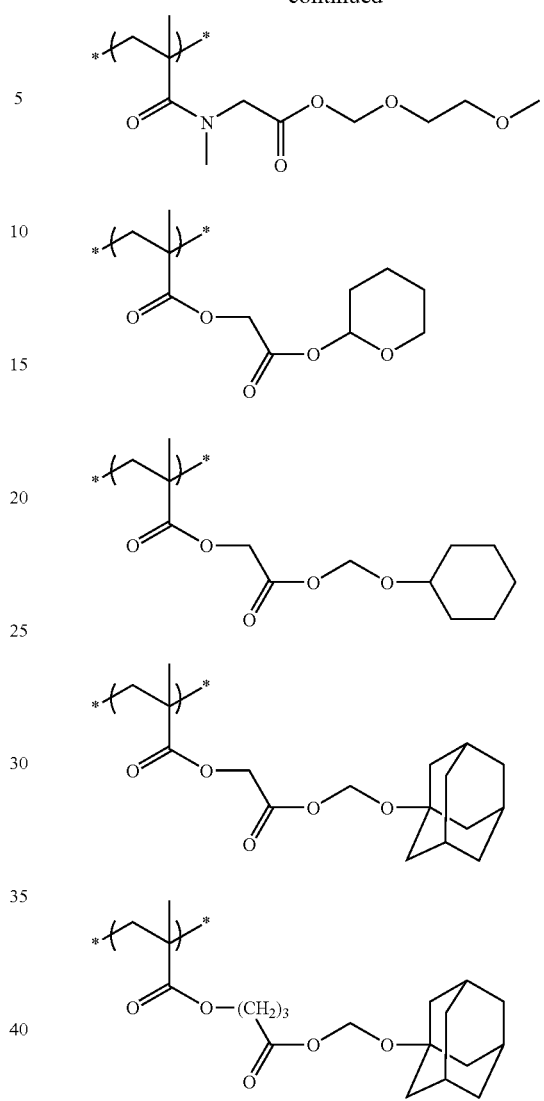

The monomer corresponding to the repeating unit represented by formula (Ib) can be synthesized by reacting $R^2$—O—$CH_2$—X and a polymerizable group-containing carboxylic acid in the presence of a base. Here, X represents a halogen atom such as Cl, or a leaving group represented by —$OR^{2a}$ (wherein $R^{2a}$ is an alkyl group, an aryl group, a hydrogen atom or the like). The monomer can be also obtained by a method of performing acetal exchange or the like.

The repeating units represented by formula (Ia) and/or formula (Ib) are an acid-decomposable repeating unit having a group capable of decomposing under the action of an acid to generate a carboxyl group and increasing the dissolution rate in an alkali developer (acid-decomposable group).

The resin (B) may further contain an acid-decomposable repeating unit other than the acid-decomposable repeating units represented by formula (Ia) and/or formula (Ib).

The acid-decomposable repeating unit other than the acid-decomposable repeating units represented by formula (Ia) and/or formula (Ib) is preferably a repeating unit represented by the following formula (II).

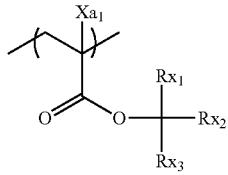
(II)

In formula (II), $Xa_1$ represents a hydrogen atom, an alkyl group, a cyano group or a halogen atom and is the same as $Xa_1$ in formula (Ia) and/or formula (Ib).

$Rx_1$ to $Rx_3$ each independently represents an alkyl group or a cycloalkyl group. At least two members out of $Rx_1$ to $Rx_3$ may combine to form a cycloalkyl group.

The alkyl group of $Rx_1$ to $Rx_3$ is preferably a linear or branched alkyl group having a carbon number of 1 to 4, such as methyl group, ethyl group, n-propyl group, isopropyl group, n-butyl group, isobutyl group and tert-butyl group.

The cycloalkyl group of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group formed by combining at least two members out of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

An embodiment where $Rx_1$ is a methyl group or an ethyl group and $Rx_2$ and $Rx_3$ are combined to form the above-described monocyclic or polycyclic cycloalkyl group is preferred.

The repeating unit represented by formula (II) preferably has a monocyclic or polycyclic alicyclic hydrocarbon structure.

Specific preferred examples of the repeating unit having an acid-decomposable group are set forth below, but the present invention is not limited thereto. (In the formulae, Rx represents H, $CH_3$, $CF_3$ or $CH_2OH$, and Rxa and Rxb each represents an alkyl group having a carbon number of 1 to 4.)

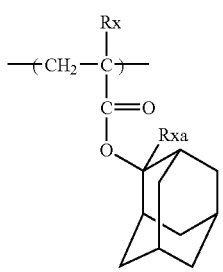
1

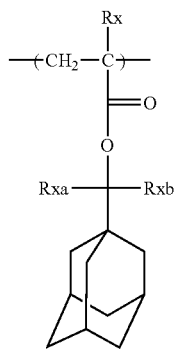
2

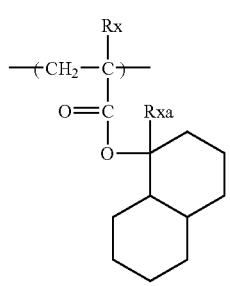
3

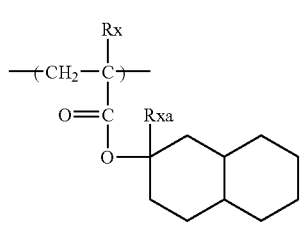
4

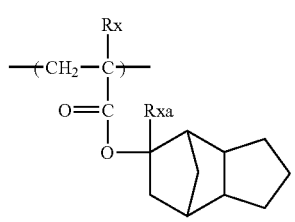
5

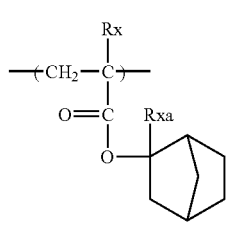
6

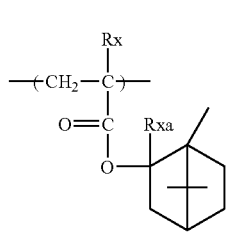
7

8
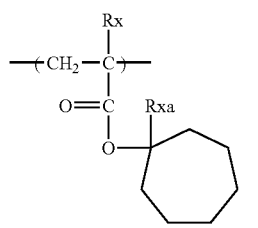
9
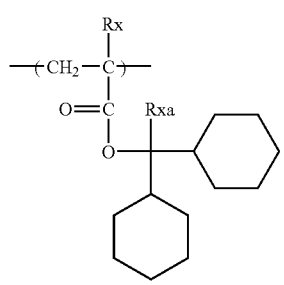
10
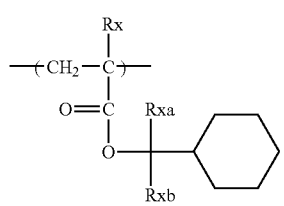
11
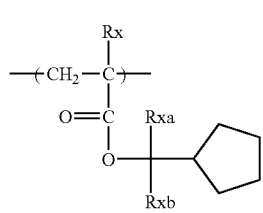
12
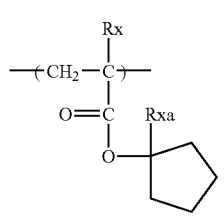
13
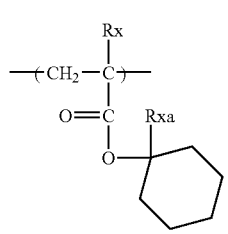
14
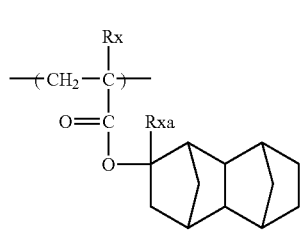
15
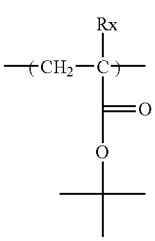
16
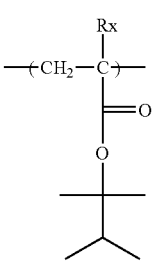
17
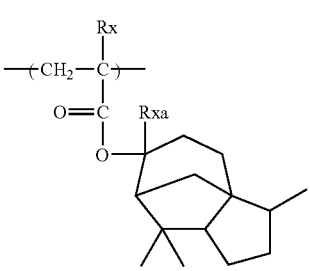
18
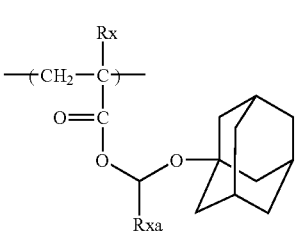
19
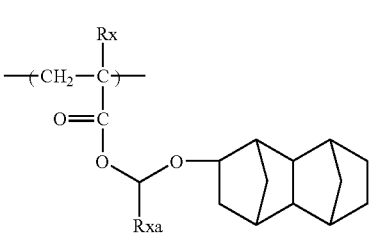
20
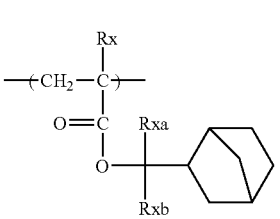

-continued

21
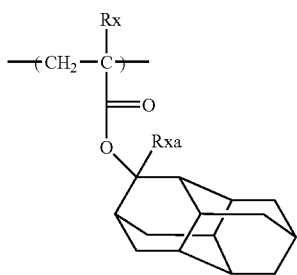

22
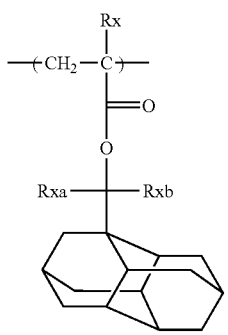

23
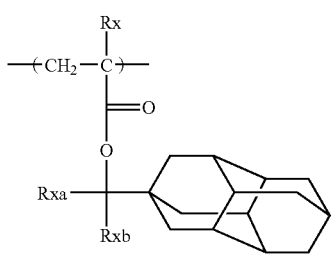

24
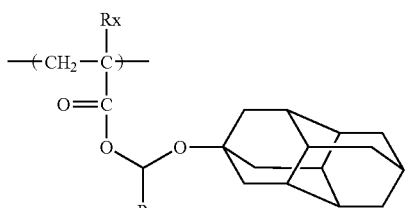

25
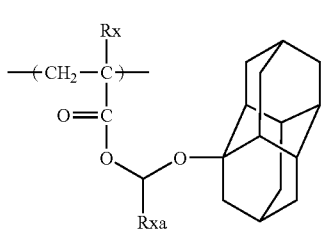

Among the repeating units represented by formula (II), preferred are repeating units 1, 2, 10, 11, 12, 13 and 14 in these specific examples.

In the case of using the acid-decomposable group-containing repeating units represented by formula (Ia) and/or formula (Ib) in combination with other acid-decomposable group-containing repeating units (preferably a repeating unit represented by formula (II), the ratio between the acid-decomposable group-containing repeating units represented by formula (Ia) and/or formula (Ib) and the other acid-decomposable group-containing repeating unit is, in terms of molar ratio, from 90:10 to 10:90, preferably from 80:20 to 20:80.

The content of all acid-decomposable group-containing repeating units in the resin (B) is preferably from 20 to 50 mol %, more preferably from 25 to 45 mol %, based on all repeating units in the polymer.

The resin (B) preferably further contains a repeating unit having at least one kind of a group selected from a lactone group, a hydroxyl group, cyano group and an alkali-soluble group.

The resin (B) preferably contains a repeating unit having a lactone structure.

As for the lactone structure, any repeating unit may be used as long as it has a lactone structure, but the lactone structure is preferably a 5- to 7-membered ring lactone structure, and a repeating unit where another ring structure is condensed to the 5- to 7-membered ring lactone structure in the form of forming a bicyclo or spiro structure is preferred. The resin more preferably contains a repeating unit having a lactone structure represented by any one of the following formulae (LC1-1) to (LC1-16). The lactone structure may be bonded directly to the main chain. Among these lactone structures, preferred are (LC1-1), (LC1-4), (LC1-5), (LC1-6), (LC1-13) and (LC1-14). By virtue of using a specific lactone structure, the line edge roughness and development defect are improved.

LC1-1
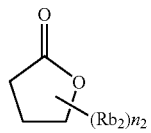

LC1-2
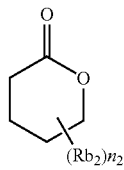

LC1-3
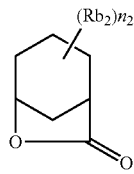

LC1-4
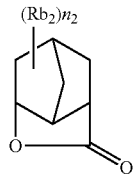

LC1-5
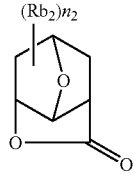

LC1-6
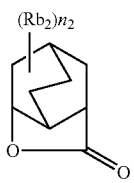

LC1-7
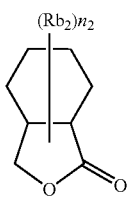

LC1-8
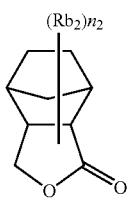

LC1-9
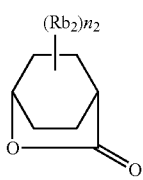

LC1-10
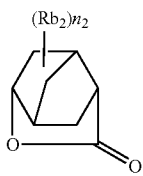

LC1-11
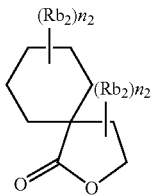

LC1-12
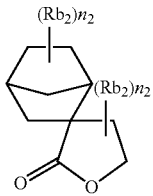

LC1-13
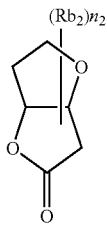

LC1-14
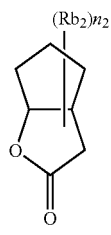

LC1-15
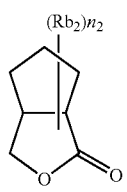

LC1-16
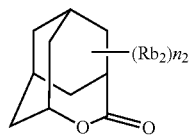

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 1 to 8, a carboxyl group, a halogen atom, a hydroxyl group, a cyano group and an acid-decomposable group. Among these, an alkyl group having a carbon number of 1 to 4, a cyano group and an acid-decomposable group are more preferred. $n_2$ represents an integer of 0 to 4. When $n_2$ is an integer of 2 or more, the plurality of substituents ($Rb_2$) present in the lactone structure may be the same or different and also, the plurality of substituents ($Rb_2$) present in the lactone structure may combine with each other to form a ring.

The repeating unit having a lactone structure represented by any one of formulae (LC1-1) to (LC1-16) includes a repeating unit represented by the following formula (AI).

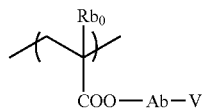

(AI)

In formula (AI), $Rb_0$ represents a hydrogen atom, a halogen atom or an alkyl group having a carbon number of 1 to 4. Preferred examples of the substituent which the alkyl group of $Rb_0$ may have include a hydroxyl group and a halogen atom. The halogen atom of $Rb_0$ includes a fluorine atom, a chlorine atom, a bromine atom and an iodine atom. $Rb_0$ is preferably a hydrogen atom or a methyl group.

Ab represents a single bond, an alkylene group, a divalent linking group having a monocyclic or polycyclic alicyclic hydrocarbon structure, an ether group, an ester group, a carbonyl group, a carboxyl group, or a divalent group comprising a combination thereof, and is preferably a single bond or a divalent linking group represented by -$Ab_1$-$CO_2$—. $Ab_1$ represents a linear or branched alkylene group or a monocyclic or polycyclic cycloalkylene group and is preferably a methylene group, an ethylene group, a cyclohexylene group, an adamantyl group or a norbornyl group.

V represents a group having a structure represented by any one of formulae (LC1-1) to (LC1-16).

The repeating unit having a lactone structure usually has an optical isomer, but any optical isomer may be used. One optical isomer may be used alone or a mixture of a plurality of optical isomers may be used. In the case of mainly using one optical isomer, the optical purity (ee) thereof is preferably 90 or more, more preferably 95 or more.

The content of the repeating unit having a lactone structure is preferably from 15 to 60 mol %, more preferably from 20 to 50 mol %, still more preferably from 30 to 50 mol %, based on all repeating units in the polymer.

Specific examples of the repeating unit having a lactone structure are set forth below, but the present invention is not limited thereto.

(In the formulae, Rx is H, $CH_3$, $CH_2OH$ or $CF_3$.)

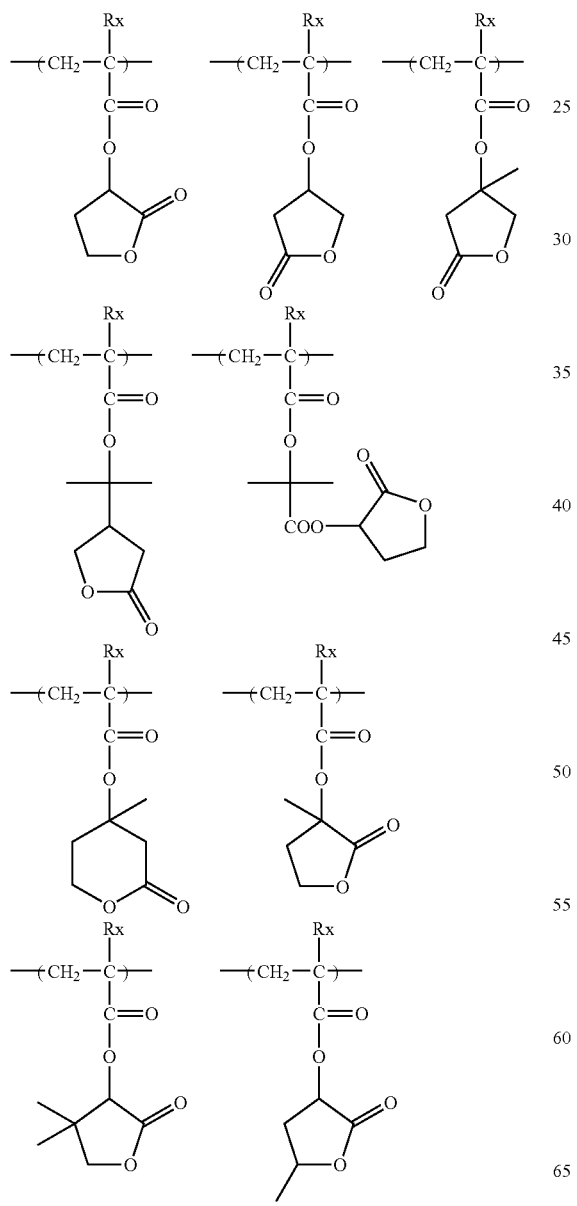
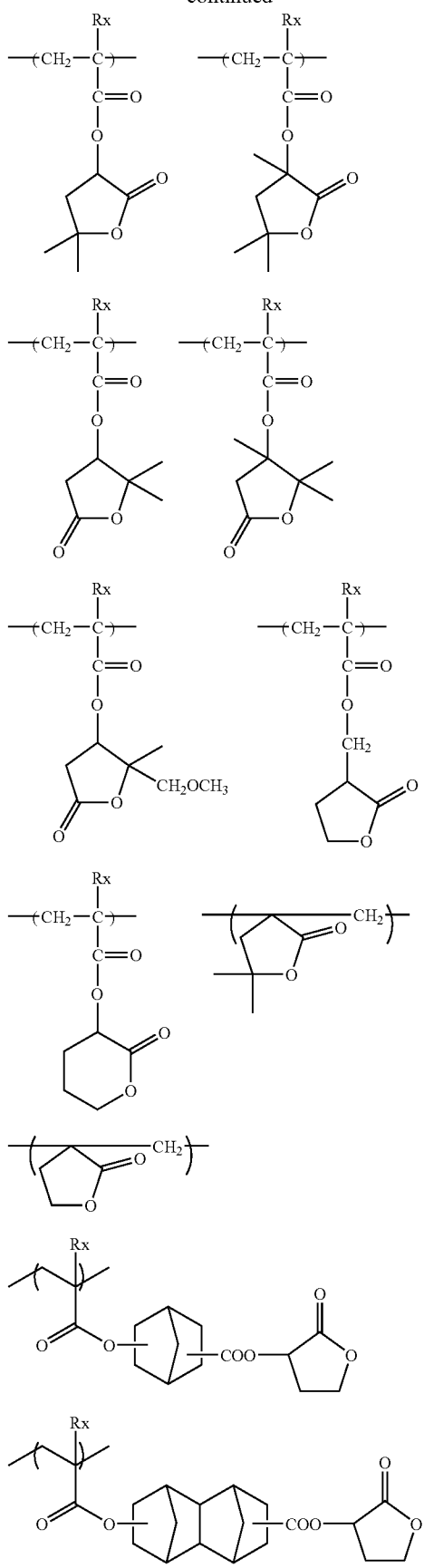

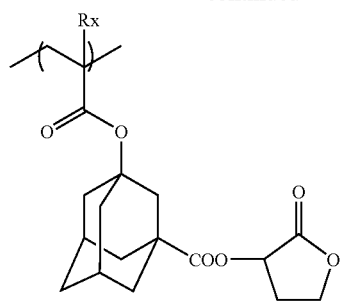
(In the formulae, Rx is H, CH₃, CH₂OH or CF₃.)
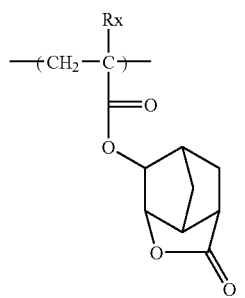 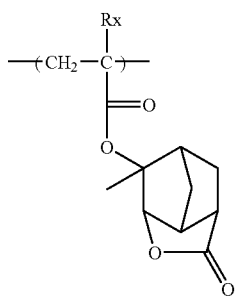
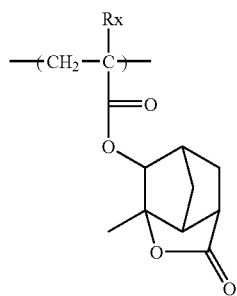 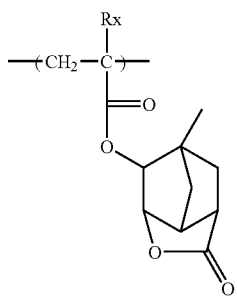
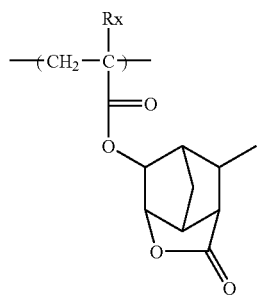 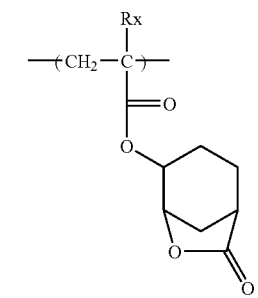
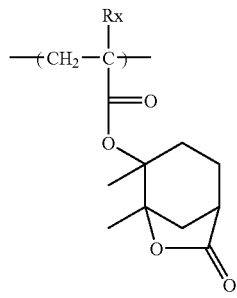 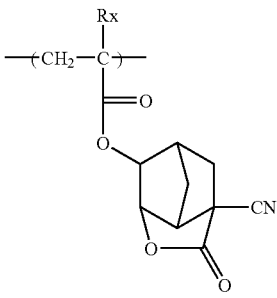
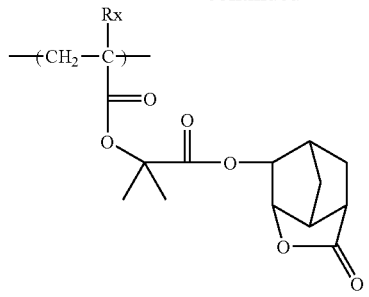
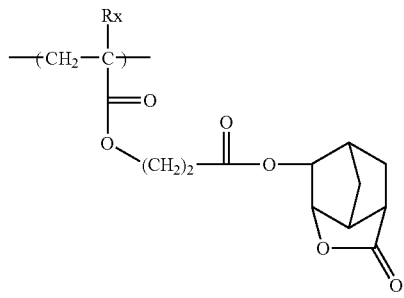
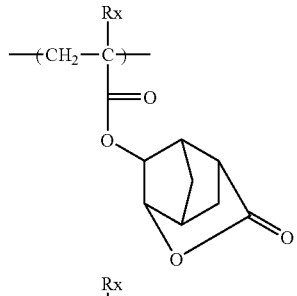
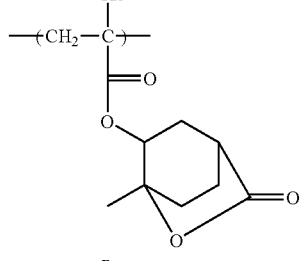
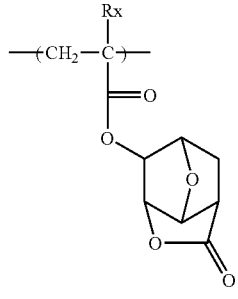
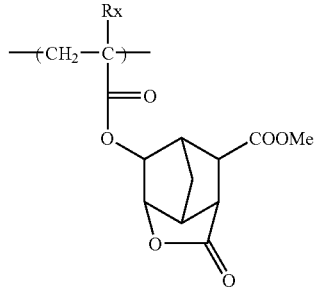

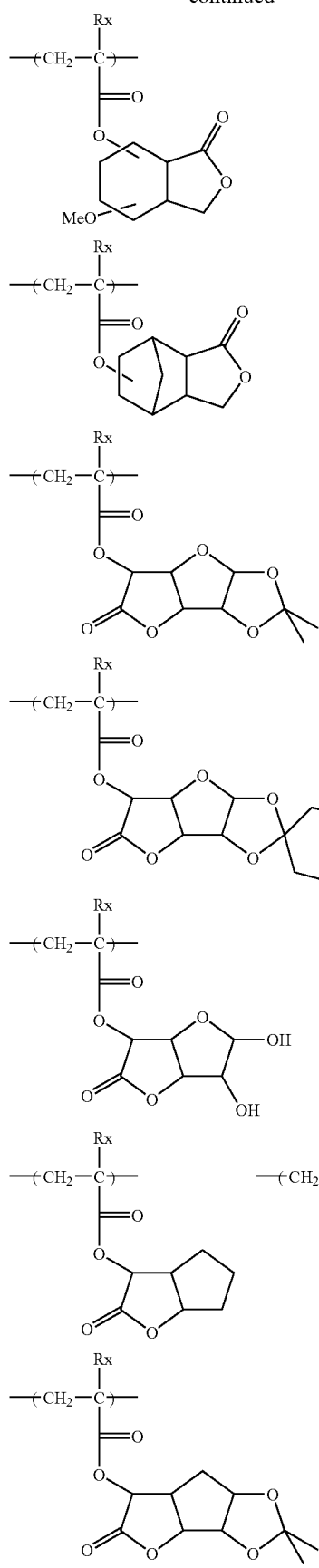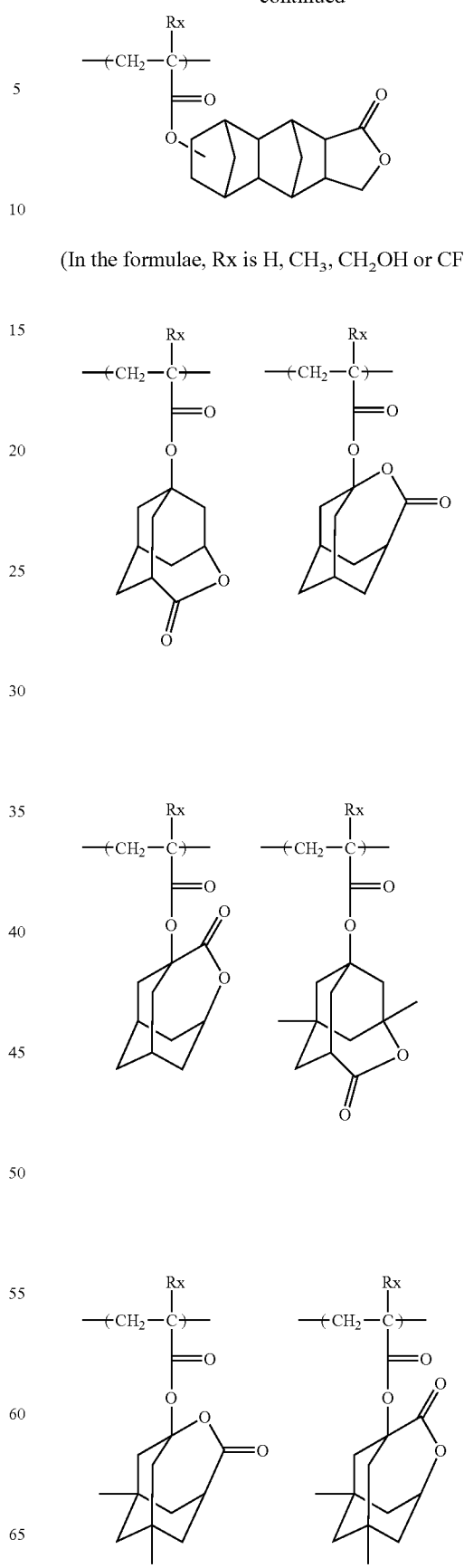
(In the formulae, Rx is H, CH₃, CH₂OH or CF₃.)

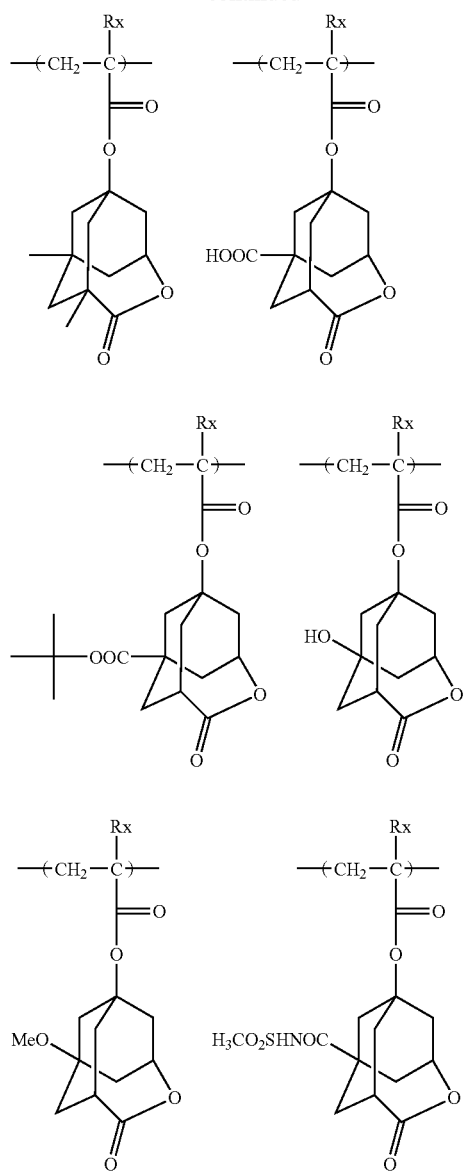
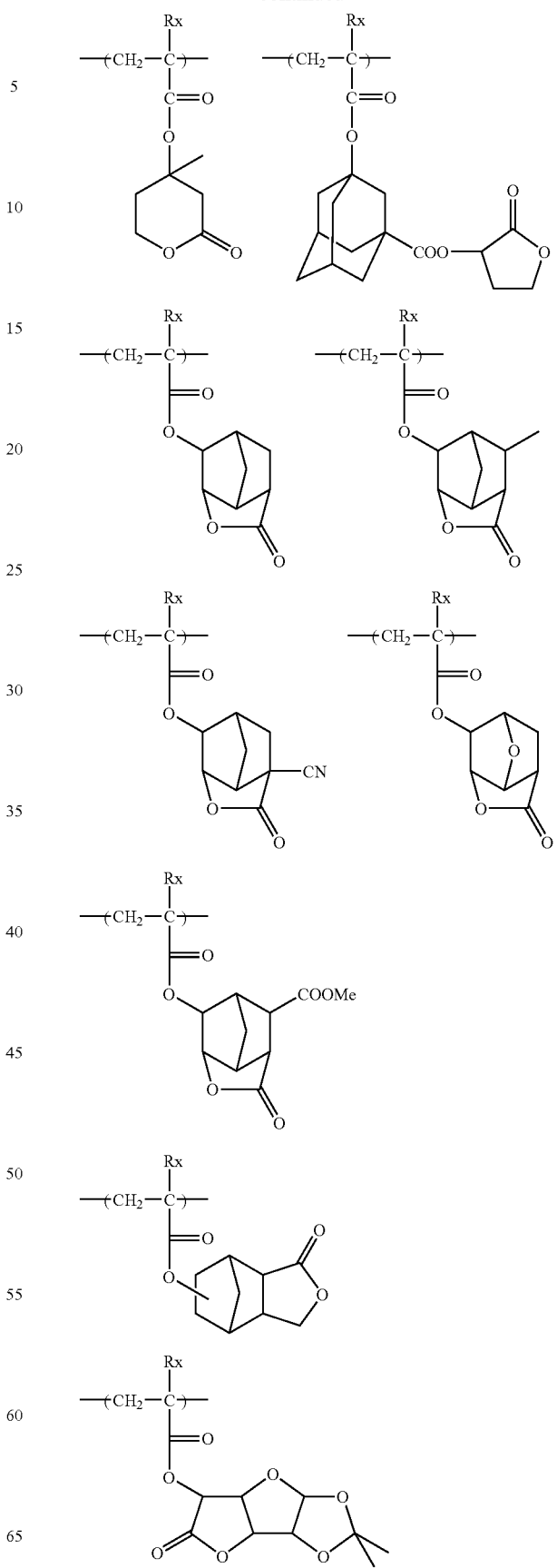
The repeating unit having a particularly preferred lactone structure includes the repeating units shown below. By selecting an optimal lactone structure, the pattern profile and defocus latitude depended on line pitch are enhanced.
(In the formulae, Rx is H, CH$_3$, CH$_2$OH or CF$_3$.)
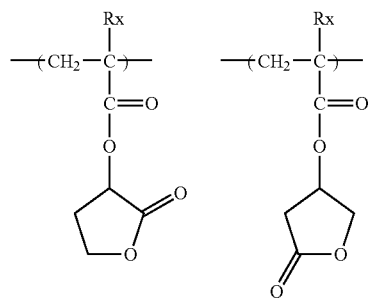

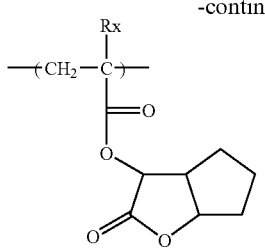

The resin (B) preferably contains a repeating unit having a hydroxyl group or a cyano group. By virtue of this repeating unit, the adhesion to substrate and the affinity for developer are enhanced. The repeating unit having a hydroxyl group or a cyano group is preferably a repeating unit having an alicyclic hydrocarbon structure substituted by a hydroxyl group or a cyano group. The alicyclic hydrocarbon structure in the alicyclic hydrocarbon structure substituted by a hydroxyl group or a cyano group is preferably an adamantyl group, a diamantyl group or a norbornane group. The alicyclic hydrocarbon structure substituted by a hydroxyl group or a cyano group is preferably a partial structure represented by any one of the following formulae (VIIa) to (VIId):

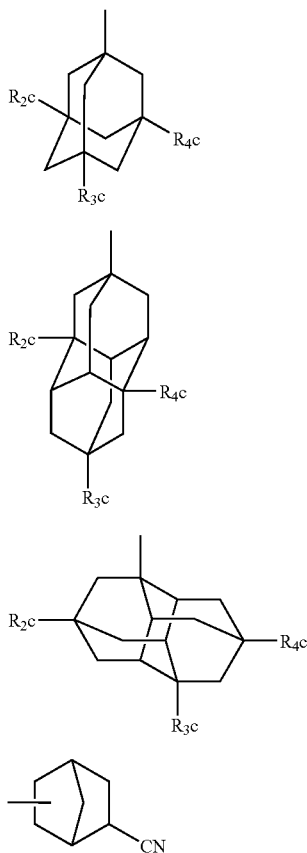

In formulae (VIIa) to (VIIc), $R_{2c}$ to $R_{4c}$ each independently represents a hydrogen atom, a hydroxyl group or a cyano group, provided that at least one of $R_{2c}$ to $R_{4c}$ represents a hydroxyl group or a cyano group. A structure where one or two members out of $R_{2c}$ to $R_{4c}$ are a hydroxyl group with the remaining being a hydrogen atom is preferred. In formula (VIIa), it is more preferred that two members out of $R_{2c}$ to $R_{4c}$ are a hydroxyl group and the remaining is a hydrogen atom.

The repeating unit having a partial structure represented by any one of formulae (VIIa) to (VIId) includes repeating units represented by the following formulae (AIIa) to (AIId).

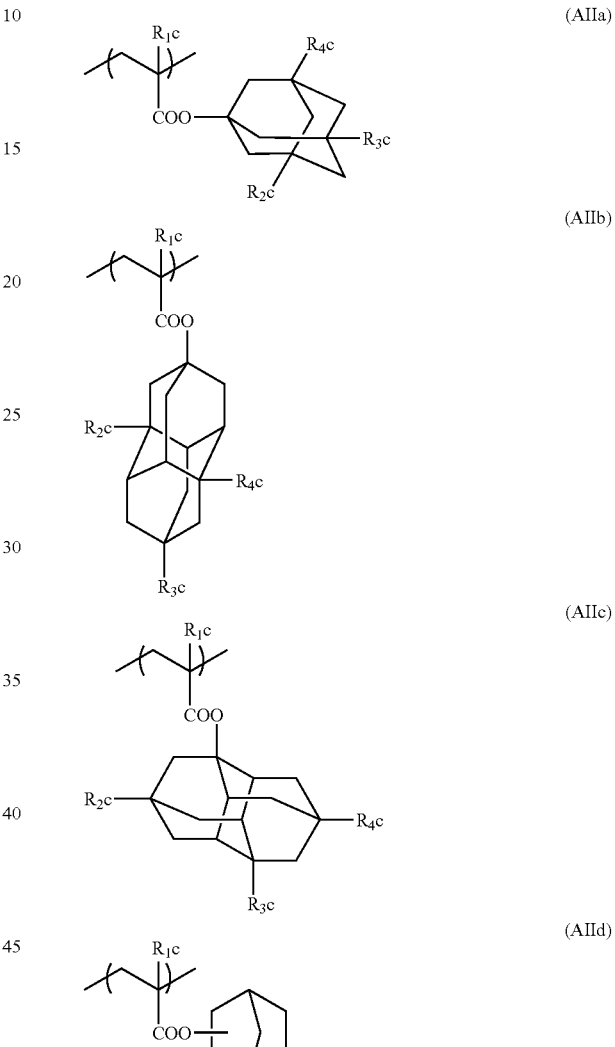

In formulae (AIIa) to (AIId), $R_{1c}$ represents a hydrogen atom, a methyl group, a trifluoromethyl group or a hydroxymethyl group.

$R_{2c}$ to $R_{4c}$ have the same meanings as $R_{2c}$ to $R_{4c}$ in formulae (VIIa) to (VIIc).

The content of the repeating unit having an alicyclic hydrocarbon structure substituted by a hydroxyl group or a cyano group is preferably from 5 to 40 mol %, more preferably from 5 to 30 mol %, still more preferably from 10 to 25 mol %, based on all repeating units in the polymer.

Specific examples of the repeating unit having a hydroxyl group or a cyano group are set forth below, but the present invention is not limited thereto.

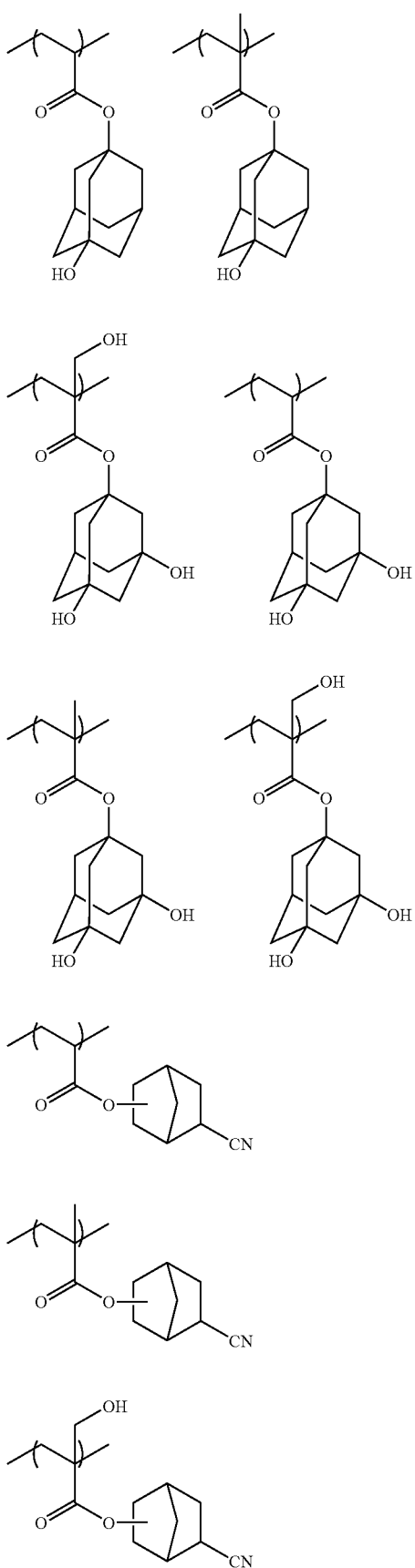

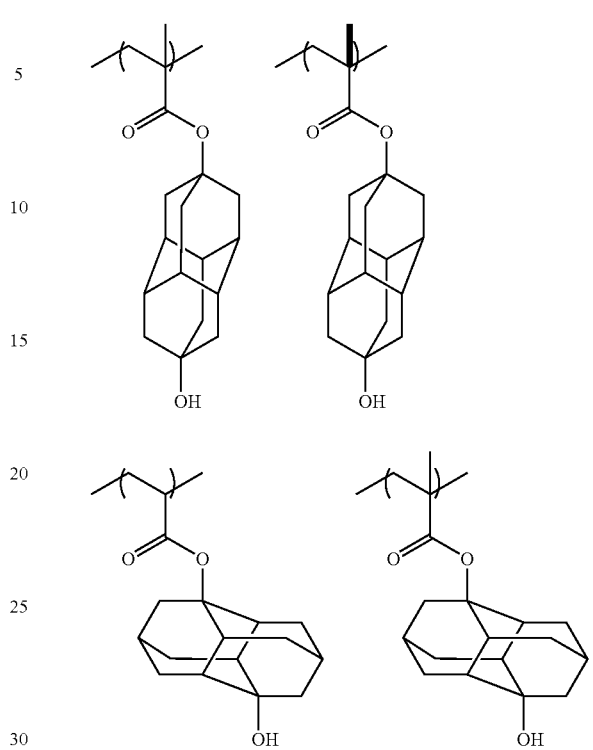

The resin (B) preferably contains a repeating unit having an alkali-soluble group. The alkali-soluble group includes a carboxyl group, a sulfonamide group, a sulfonylimide group, a bisulfonylimide group, and an aliphatic alcohol with the α-position being substituted by an electron-withdrawing group, such as hexafluoroisopropanol. The resin preferably contains a repeating unit having a carboxyl group. By virtue of containing the repeating unit having an alkali-soluble group, the resolution increases in the usage of forming contact holes. As for the repeating unit having an alkali-soluble group, all of a repeating unit where an alkali-soluble group is directly bonded to the resin main chain, such as repeating unit by an acrylic acid or a methacrylic acid, a repeating unit where an alkali-soluble group is bonded to the resin main chain through a linking group, and a repeating unit where an alkali-soluble group is introduced into the polymer chain terminal by using an alkali-soluble group-containing polymerization initiator or chain transfer agent at the polymerization, are preferred. The linking group may have a monocyclic or polycyclic cyclohydrocarbon structure. In particular, a repeating unit by an acrylic acid or a methacrylic acid is preferred.

The content of the repeating unit having an alkali-soluble group is preferably from 1 to 20 mol %, more preferably from 3 to 15 mol %, still more preferably from 5 to 10 mol %, based on all repeating units in the polymer.

Specific examples of the repeating unit having an alkali-soluble group are set forth below, but the present invention is not limited thereto.

(In the formulae, Rx is H, $CH_3$, $CF_3$ or $CH_2OH$.)

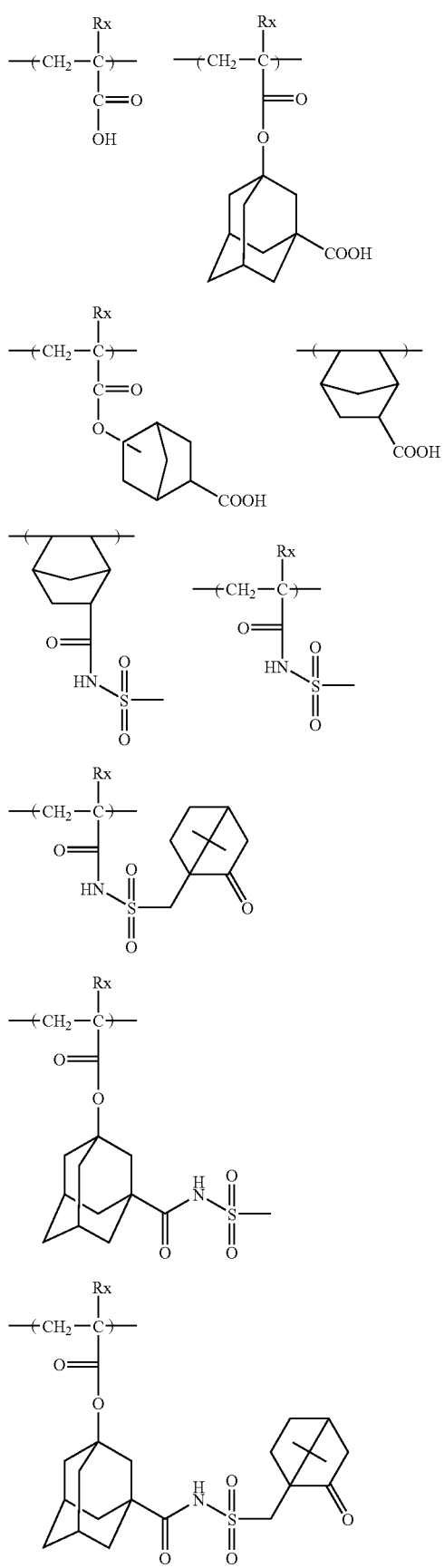
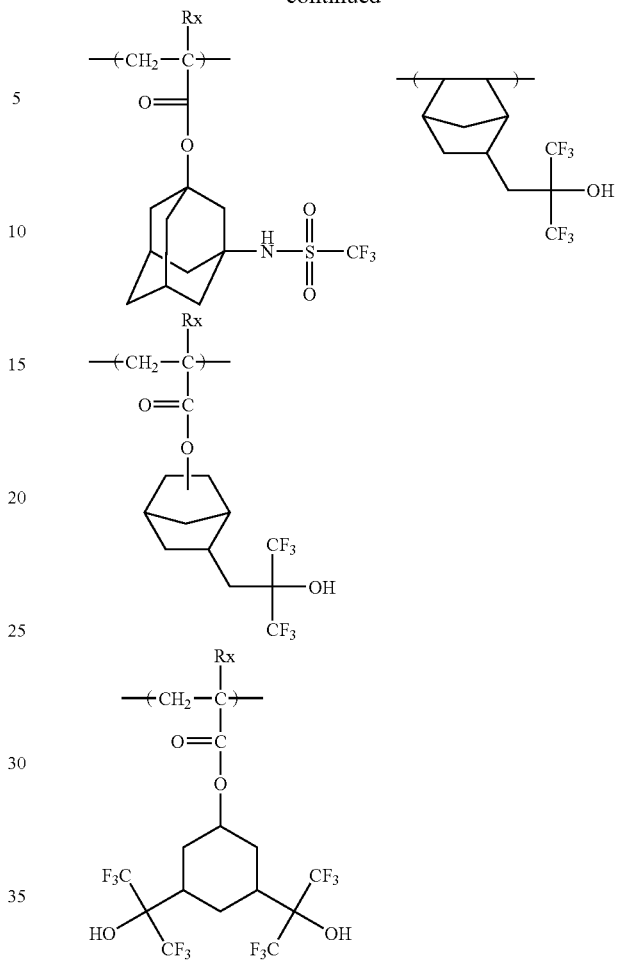

The repeating unit having at least one kind of a group selected from a lactone group, a hydroxyl group, a cyano group and an alkali-soluble group is more preferably a repeating unit having at least two groups selected from a lactone group, a hydroxyl group, a cyano group and an alkali-soluble group, still more preferably a repeating unit having a cyano group and a lactone group, yet still more preferably a repeating unit having a structure that a cyano group is substituted to the lactone structure of LCI-4 above.

The resin (B) may further contain a repeating unit having an alicyclic hydrocarbon structure and not exhibiting acid decomposability. By containing such a repeating unit, the dissolving out of low molecular components from the resist film to the immersion liquid at the immersion exposure can be reduced. Examples of this repeating unit include 1-adamantyl (meth)acrylate, diamantyl (meth)acrylate, tricyclodecanyl (meth)acrylate and cyclohexyl (meth)acrylate.

The resin (B) may further contain, in addition to the above-described repeating units, various repeating structural units for the purpose of controlling dry etching resistance, suitability for standard developer, adhesion to substrate, resist profile and properties generally required of the resist, such as resolving power, heat resistance and sensitivity.

Examples of such a repeating structural unit include, but are not limited to, repeating structural units corresponding to the monomers described below.

By virtue of such a repeating structural unit, the performance required of the resin (B), particularly, (1) solubility in coating solvent,
(2) film-forming property (glass transition point),
(3) alkali developability,
(4) film loss (selection of hydrophilic, hydrophobic or alkali-soluble group),
(5) adhesion of unexposed area to substrate,
(6) dry etching resistance and the like, can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomers corresponding to the above-described various repeating structural units may be copolymerized.

In the resin (B), the molar ratio of respective repeating structural units contained is appropriately determined to control the dry etching resistance of resist, suitability for standard developer, adhesion to substrate, resist profile and performances generally required of the resist, such as resolving power, heat resistance and sensitivity.

In the case of using the positive resist composition of the present invention for exposure with ArF, the resin (B) preferably has no aromatic group in view of transparency to ArF light.

The resin (B) is preferably a resin where all repeating units are composed of a (meth)acrylate-based repeating unit. In this case, the repeating units may be all a methacrylate-based repeating unit, all an acrylate-based repeating unit, or all a mixture of methacrylate-based repeating unit/acrylate-based repeating unit, but the content of the acrylate-based repeating unit is preferably 50 mol % or less based on all repeating units. The resin is more preferably a copolymerization polymer containing from 20 to 50 mol % of an acid decomposable group-containing (meth)acrylate-based repeating unit represented by formula (Ia) and/or formula (Ib), from 20 to 50 mol % of a (meth)acrylate-based repeating unit having a lactone structure, from 5 to 30 mol % of a (meth)acrylate-based repeating unit having an alicyclic hydrocarbon structure substituted by a hydroxyl group and a cyano group, and from 0 to 20 mol % of other (meth)acrylate-based repeating units.

In the case where the positive resist composition of the present invention is irradiated with KrF excimer laser light, electron beam, X-ray or high-energy beam at a wavelength of 50 nm or less (e.g., EUV), the resin (B) preferably further contains a hydroxystyrene-based repeating unit, more preferably a hydroxystyrene-based repeating unit, a hydroxystyrene-based repeating unit protected by an acid-decomposable group, and an acid-decomposable repeating unit such as tertiary alkyl (meth)acrylate, in addition to the repeating unit represented by formula (Ia) and/or the repeating unit represented by formula (Ib).

Preferred examples of the repeating unit having an acid-decomposable group include a tert-butoxycarbonyloxystyrene, a 1-alkoxyethoxystyrene and a tertiary alkyl (meth)acrylate. A 2-alkyl-2-adamantyl (meth)acrylate and a dialkyl (1-adamantyl)methyl (meth)acrylate are more preferred.

The resin (B) can be synthesized by an ordinary method (for example, radical polymerization). Examples of the synthesis method in general include a batch polymerization method of dissolving the monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and a solvent capable of dissolving the composition of the present invention, which is described later, such as propylene glycol monomethyl ether acetate, propylene glycol monomethyl ether and cyclohexanone. The polymerization is more preferably performed using the same solvent as the solvent used in the positive resist composition of the present invention. By the use of this solvent, production of particles during storage can be suppressed.

The polymerization reaction is preferably performed in an inert gas atmosphere such as nitrogen and argon. As for the polymerization initiator, the polymerization is initiated using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methyl-propionate). The initiator is added additionally or in parts, if desired. After the completion of reaction, the reaction product is charged into a solvent, and the desired polymer is recovered by a method such as powder or solid recovery. The reaction concentration is from 5 to 50 mass %, preferably from 10 to 30 mass %, and the reaction temperature is usually from 10 to 150° C., preferably from 30 to 120° C., more preferably from 60 to 100° C.

The weight average molecular weight of the resin (B) is preferably from 1,000 to 200,000, more preferably from 2,000 to 20,000, still more preferably from 3,000 to 15,000, yet still more preferably from 3,000 to 10,000, in terms of polystyrene by the GPC method. When the weight average molecular weight is from 1,000 to 200,000, the heat resistance, dry etching resistance and developability can be prevented from deterioration and also, the deterioration in the film-forming property due to high viscosity can be prevented.

The dispersity (molecular weight distribution) is usually from 1 to 3, preferably from 1 to 2, more preferably from 1.4 to 1.7. As the molecular weight distribution is smaller, the resolution and resist profile are more excellent, the side wall of the resist pattern is smoother, and the property in terms of roughness is more improved.

In the positive resist composition of the present invention, the amount of the resin (B) blended in the entire composition is preferably from 50 to 99.99 mass %, more preferably from 60 to 99.0 mass %, based on the entire solid content.

In the present invention, one resin (B) may be used or a plurality of resins may be used in combination.

(C) Compound Capable of Decomposing Under the Action of an Acid to Generate an Acid The positive resist composition of the present invention contains a compound capable of decomposing under the action of an acid to generate an acid (hereinafter sometimes referred to as an "acid-increasing agent").

The acid-increasing agent for use in the present invention is a compound which is stable in the absence of an acid but decomposes under the action of an acid generated from an acid generator upon exposure and produces an acid. The acid produced from the acid-increasing agent preferably has a large acid strength. Specifically, the dissociation constant (pKa) of the acid is preferably 3 or less, more preferably 2 or less. The acid generated from the acid-increasing agent is preferably a sulfonic acid having an alkyl group, a cycloalkyl group, an aryl group or an aralkyl group.

The acid-increasing agent is described, for example, in WO95/29968, WO98/24000, JP-A-8-305262, JP-A-9-34106, JP-A-8-248561, JP-T-8-503082 (the term "JP-T" as used herein means a "published Japanese translation of a PCT patent application"), U.S. Pat. No. 5,445,917, JP-T-8-503081, U.S. Pat. Nos. 5,534,393, 5,395,736, 5,741,630, 5,334,489, 5,582,956, 5,578,424, 5,453,345 and 5,445,917, European Patents 665,960, 757,628 and 665,961, U.S. Pat. No. 5,667,943, JP-A-10-1508, JP-A-10-282642, JP-A-9-512498, JP-A-2000-62337 and JP-A-2005-17730, and one species of these acid-increasing agents may be used, or two or more species thereof may be used in combination.

Specifically, compounds represented by the following formulae (1) to (6) are preferred.

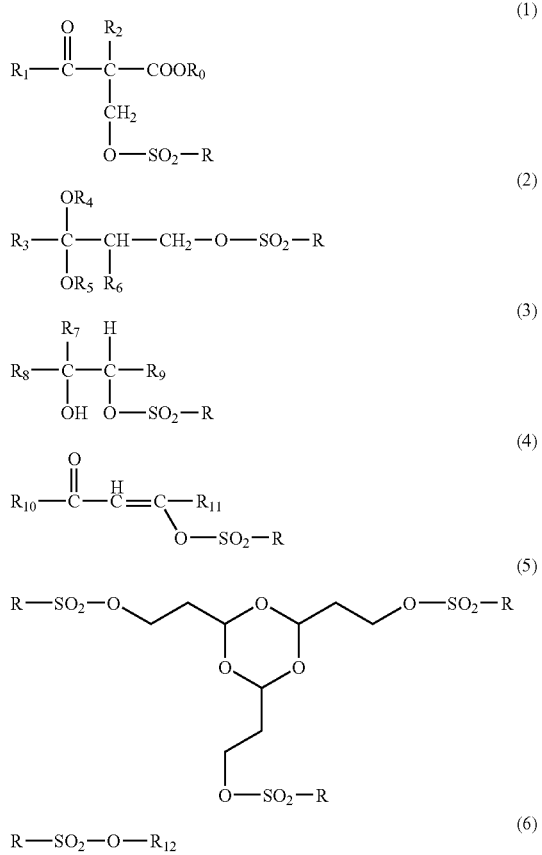

In formulae (1) to (6), R represents an alkyl group, a cycloalkyl group, an aryl group or an aralkyl group.

$R_0$ represents a group which leaves under the action of an acid.

$R_1$ represents an alkyl group, a cycloalkyl group, an aryl group, an aralkyl group, an alkoxy group or an aryloxy group.

$R_2$ represents an alkyl group or an aralkyl group.

$R_3$ represents an alkyl group, a cycloalkyl group, an aryl group or an aralkyl group.

$R_4$ and $R_5$ each independently represents an alkyl group, and $R_4$ and $R_5$ may combine with each other to form a ring.

$R_6$ represents a hydrogen atom or an alkyl group.

$R_7$ represents a hydrogen atom, an alkyl group, a cycloalkyl group, an aryl group or an aralkyl group.

$R_8$ represents an alkyl group, a cycloalkyl group, an aryl group or an aralkyl group.

$R_9$ represents a hydrogen atom, an alkyl group, a cycloalkyl group, an aryl group or an aralkyl group.

$R_9$ may combine with $R_7$ to form a ring.

$R_{10}$ represents an alkyl group, a cycloalkyl group, an alkoxy group, an aryl group, an aralkyl group, an aryloxy group or an alkenyloxy group.

$R_{11}$ represents an alkyl group, a cycloalkyl group, an alkoxy group, an aryl group, an aralkyl group, an aryloxy group or an alkenyl group.

$R_{10}$ and $R_{11}$ may combine with each other to form a ring.

$R_{12}$ represents an alkyl group, a cycloalkyl group, an aryl group, an alkenyl group or a cyclic imide group.

In formulae (1) to (6), the alkyl group includes an alkyl group having a carbon number of 1 to 8, and specific examples thereof include a methyl group, an ethyl group, a propyl group, an isopropyl group, a butyl group and an octyl group.

The cycloalkyl group includes a cycloalkyl group having a carbon number of 4 to 10, and specific examples thereof include a cyclopropyl group, a cyclopentyl group, a cyclohexyl group, a cycloheptyl group, an adamantyl group, a boronyl group, an isoboronyl group, a tricyclodecanyl group, a dicyclopentenyl group, a norbornane epoxy group, a menthyl group, an isomenthyl group, a neomenthyl group and a tetracyclododecanyl group.

The aryl group includes an aryl group having a carbon number of 6 to 14, and specific examples thereof include a phenyl group, a naphthyl group and a tolyl group.

The aralkyl group includes an aralkyl group having a carbon number of 7 to 20, and specific examples thereof include a benzyl group, a phenethyl group and a naphthylethyl group.

The alkoxy group includes an alkoxy group having a carbon number of 1 to 8, and specific examples thereof include a methoxy group, an ethoxy group, a propoxy group and a butoxy group.

The alkenyl group includes an alkenyl group having a carbon number of 2 to 6, and specific examples thereof include a vinyl group, a propenyl group, an allyl group, a butenyl group, a pentenyl group, a hexenyl group and a cyclohexenyl group.

The aryloxy group includes an aryloxy group having a carbon number of 6 to 14, and specific examples thereof include a phenoxy group and a naphthoxy group.

The alkenyloxy group includes an alkenyloxy group having a carbon number of 2 to 8, and specific examples thereof include a vinyloxy group and an allyloxy group.

These substituents each may further have a substituent, and examples of the substituent include a halogen atom such as Cl, Br and F, a —CN group, an —OH group, an alkyl group having a carbon number of 1 to 4, a cycloalkyl group having a carbon number of 3 to 8, an alkoxy group having a carbon number of 1 to 4, an acylamino group such as acetylamino group, an aralkyl group such as benzyl group and phenethyl group, an aryloxyalkyl group such as phenoxyethyl group, an alkoxycarbonyl group having a carbon number of 2 to 5, and an acyloxy group having a carbon number of 2 to 5. However, the range of the substituent is not limited thereto.

Examples of the ring formed by combining $R_4$ and $R_5$ with each other include a 1,3-dioxolane ring and a 1,3-dioxane ring.

Examples of the ring formed by combining $R_7$ and $R_9$ with each other include a cyclopentyl ring and a cylohexyl ring.

Examples of the ring formed by combining $R_{10}$ and $R_{11}$ with each other include a 3-oxocyclohexenyl ring and a 3-oxoindenyl ring, which rings each may contain an oxygen atom in the ring.

Examples of the group which leaves under the action of an acid, represented by $R_0$, include a tertiary alkyl group such as tert-butyl group and tert-amyl group, an isoboronyl group, a 1-alkoxyethyl group such as 1-ethoxyethyl group, 1-butoxyethyl group, 1-isobutoxyethyl group and 1-cyclohexyloxyethyl group, an alkoxymethyl group such as 1-methoxymethyl group and 1-ethoxymethyl group, a tetrahydropyranyl group, a tetrahydrofuranyl group, a trialkylsilyl group, and a 3-oxocyclohexyl group.

R, $R_0$ and $R_1$ to $R_{11}$ each is preferably as follows.

R: A methyl group, an ethyl group, a propyl group, a butyl group, an octyl group, a trifluoromethyl group, a nonafluorobutyl group, a heptadecafluorooctyl group, a 2,2,2-trifluoroethyl group, a phenyl group, a pentafluorophenyl group, a methoxyphenyl group, a toluyl group, a mesityl group, a fluorophenyl group, a naphthyl group, a cyclohexyl group and a camphor group.

$R_0$: A tert-butyl group, a methoxymethyl group, an ethoxymethyl group, a 1-ethoxyethyl group and a tetrahydropyranyl group.

$R_1$: A methyl group, an ethyl group, a propyl group, a cyclopropyl group, a cyclopentyl group, a cyclohexyl group, a phenyl group, a naphthyl group, a benzyl group, a phenethyl group, a methoxy group, an ethoxy group, a propoxy group, a phenoxy group and a naphthoxy group.

$R_2$: A methyl group, an ethyl group, a propyl group, a butyl group and a benzyl group.

$R_3$: A methyl group, an ethyl group, a propyl group, a cyclopropyl group, a cyclopentyl group, a cyclohexyl group, a phenyl group, a naphthyl group, a benzyl group, a phenethyl group and a naphthylmethyl group.

$R_4$ and $R_5$: A methyl group, an ethyl group, a propyl group, and an ethylene or propylene group formed by combining with each other.

$R_6$: A hydrogen atom, a methyl group and an ethyl group.

$R_7$ and $R_9$: A hydrogen atom, a methyl group, an ethyl group, a propyl group, a butyl group, a pentyl group, a cyclopropyl group, a cyclopentyl group, a cyclohexyl group, a phenyl group, a naphthyl group, a benzyl group, a phenethyl group, and a cyclopentyl or cyclohexyl ring formed by combining with each other.

$R_8$: A methyl group, an ethyl group, an isopropyl group, a tert-butyl group, a neopentyl group, a cyclohexyl group, a phenyl group and a benzyl group $R_{10}$: A methyl group, an ethyl group, a propyl group, an isopropyl group, a butyl group, an isobutyl group, a cyclopropyl group, a cyclopentyl group, a cyclohexyl group, a methoxy group, an ethoxy group, a phenyl group, a naphthyl group, a benzyl group, a phenoxy group, a naphthoxy group, a vinyloxy group, a methylvinyloxy group, and a 3-oxocyclohexenyl or 3-oxoindenyl ring formed by combining with $R_{11}$, which may contain an oxygen atom.

$R_{11}$: A methyl group, an ethyl group, a propyl group, an isopropyl group, a butyl group, an isobutyl group, a cyclopropyl group, a cyclopentyl group, a cyclohexyl group, a methoxy group, an ethoxy group, a phenyl group, a naphthyl group, a benzyl group, a phenoxy group, a naphthoxy group, a vinyl group, an allyl group, and a 3-oxocyclohexenyl or 3-oxoindenyl ring formed by combining with $R_{10}$, which may contain an oxygen atom.

In formula (6), when $R_{12}$ represents an alkyl group, the alkyl group includes a linear or branched alkyl group having a carbon number of 1 to 20. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a sec-butyl group, a tert-butyl group, an isopentyl group, a neopentyl group, a 1-methylbutyl group, an isohexyl group, a 2-ethylhexyl group and a 2-methylhexyl group. Among these, a linear alkyl group having a carbon number of 1 to 12 and a branched alkyl group having a carbon number of 3 to 12 are more preferred.

When $R_{12}$ represents a cycloalkyl group, the cycloalkyl group includes a cycloalkyl group having a carbon number of 3 to 20, and specific examples thereof include a cyclohexyl group, a cyclopentyl group and a 2-norbornyl group. Among these, a cycloalkyl group having a carbon number of 5 to 10 is more preferred.

When $R_{12}$ represents a substituted alkyl group or a substituted cycloalkyl group, the substituent is a monovalent non-metallic atom group excluding hydrogen, and preferred examples thereof include a halogen atom (e.g., —F, —Br, —Cl, —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and a conjugate base group thereof (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—$PO_3H_2$) and a conjugate base group thereof (hereinafter referred to as a "phosphonato group"), a dialkylphosphono group (—$PO_3(alkyl)_2$), a diarylphosphono group (—$PO_3(aryl)_2$), an alkylarylphosphono group (—$PO_3(alkyl)(aryl)$), a monoalkylphosphono group (—$PO_3H(alkyl)$) and a conjugate base group thereof (hereinafter referred to as an "alkylphosphonato group"), a monoarylphosphono group (—$PO_3H(aryl)$) and a conjugate base group thereof (hereinafter referred to as an "arylphosphonato group"), a phosphonoxy group (—OPO₃H₂) and a conjugate base group thereof (hereinafter referred to as a "phosphonatoxy group"), a dialkylphosphonoxy group (—OPO₃(alkyl)₂), a diarylphosphonoxy group (—OPO₃(aryl)₂), an alkylarylphosphonoxy group (—OPO₃(alkyl)(aryl)), a monoalkylphosphonoxy group (—OPO₃H(alkyl)) and a conjugate base group thereof (hereinafter referred to as an "alkylphosphonatoxy group"), a monoarylphosphonoxy group (—OPO₃H(aryl)) and a conjugate base group thereof (hereinafter referred to as an "arylphosphonatoxy group"), a cyano group, a nitro group, an aryl group, an alkenyl group and an alkynyl group.

In these substituents, specific examples of the alkyl group include the above-described alkyl groups, and specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a phenyl group, a cyanophenyl group, a sulfophenyl group, a sulfonatophenyl group, a phosphonophenyl group and a phosphonatophenyl group. Examples of the alkenyl group include a vinyl group, a 1-propenyl group, a 1-butenyl group, a cinnamyl group and a 2-chloro-1-ethenyl group, and examples of the alkynyl group include an ethynyl group, a 1-propynyl group, a 1-butynyl group and a trimethylsilylethynyl group. $R_{13}$ in the acyl group ($R_{13}CO$—) is hydrogen or the above-described alkyl, cycloalkyl or aryl group.

Among these substituents, more preferred are a halogen atom (e.g., —F, —Br, —Cl, —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonoxy group, a phosphonatoxy group, an aryl group and an alkenyl group.

Examples of the alkylene group in the substituted alkyl group include a divalent organic residue resulting from the elimination of any one hydrogen atom on the above-described alkyl group having a carbon number of 1 to 20, and a linear alkylene group having a carbon number of 1 to 12, a branched alkylene group having a carbon number of 3 to 12 and a cyclic alkylene group having a carbon number of 5 to 10 are preferred. Specific preferred examples of the substituted alkyl group obtained by combining the above-described substituent and an alkylene group include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoyl-propyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonoxypropyl group, a phosphonatoxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

When $R_{12}$ represents an aryl group, the aryl group includes a condensed ring formed by 1 to 3 benzene rings, and a condensed ring formed by a benzene ring and a 5-membered unsaturated ring, and specific examples thereof include a phenyl group, a naphthyl group, an anthryl group, a phenanthryl group, an indenyl group, an acenaphthenyl group and a fluorenyl group. Among these, a phenyl group and a naphthyl group are more preferred. Other than the above-described carbocyclic aryl group, the aryl group includes a heterocyclic (hetero) aryl group. As for the heterocyclic aryl group, those containing from 3 to 20 carbon atoms and from 1 to 5 heteroatoms, such as pyridyl group, furyl group, quinolyl group condensed with a benzene ring, benzofuryl group, thioxanthone group and carbazole group, are used.

When $R_{12}$ represents a substituted aryl group, the substituted aryl group is an aryl group having a monovalent nonmetallic atom group (excluding hydrogen) as a substituent on the ring-forming carbon atom of the above-described aryl group. Preferred examples of the substituent include those described above as the substituent of alkyl and cycloalkyl groups.

Specific preferred examples of the substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allyl group, a 1-propenylmethyl group, a 2-butenyl group, a 2-methylallylphenyl group, a 2-methylpropenylphenyl group, a 2-propenylphenyl group, a 2-butynylphenyl group and a 3-butynylphenyl group.

When $R_{12}$ represents an alkenyl group, a substituted alkenyl group [—C($R_{14}$)=C($R_{15}$)($R_{16}$)], an alkynyl group or a substituted alkynyl group [—C≡C($R_{17}$)], $R_{14}$ to $R_{17}$ may be a monovalent nonmetallic atom group. Preferred examples of $R_{14}$ to $R_{17}$ include a hydrogen atom, a halogen atom, an alkyl group, a substituted alkyl group, an aryl group and a substituted aryl group. Specific examples of these groups include those described above as examples. The substituents $R_{14}$ to $R_{17}$ each is more preferably a hydrogen atom, a halogen atom, or a linear, branched or cyclic alkyl group having a carbon number of 1 to 10. Specific examples of the alkenyl group, substituted alkenyl group, alkynyl group and substituted alkynyl group include a vinyl group, a 1-butenyl group, a 1-pentenyl group, a 1-hexenyl group, a 1-octenyl group, a 1-methyl-1-propenyl group, a 2-methyl-1-propenyl group, a 2-methyl-1-butenyl group, a 2-phenyl-1-ethenyl group, a 2-chloro-1-ethenyl group, an ethynyl group, a propynyl group, and a phenylethyl group.

When $R_{12}$ represents a cyclic imide, the cyclic imide may be a cyclic imide having a carbon number of 4 to 20, such as succinic acid imide, phthalic acid imide, cyclo-hexanedicarboxylic acid imide and norbornenedicarboxylic acid imide.

Specific examples of the compounds represented by formulae (1) to (6) are set forth below, but the present invention is not limited thereto.

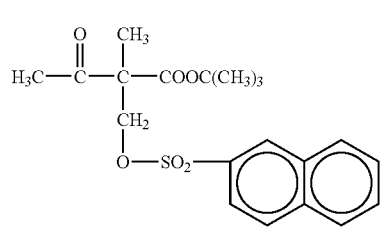
(1-1)

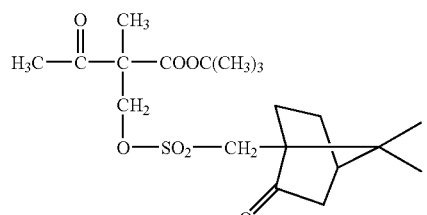
(1-2)

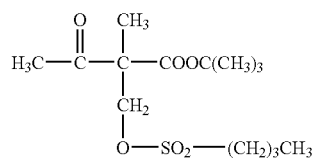
(1-3)

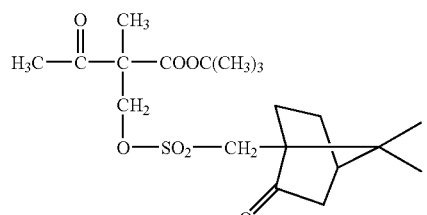
(1-4)

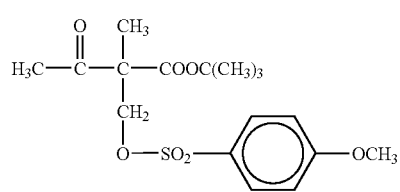
(1-5)

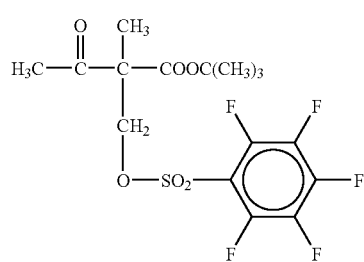
(1-6)

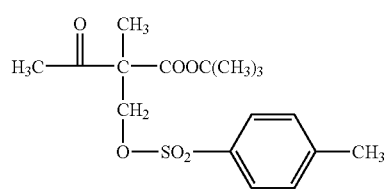
(1-7)

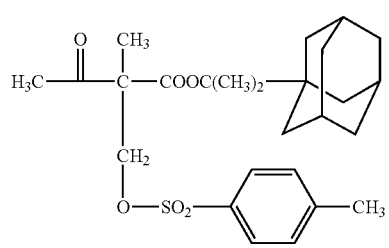
(1-8)

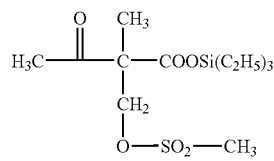
(1-9)

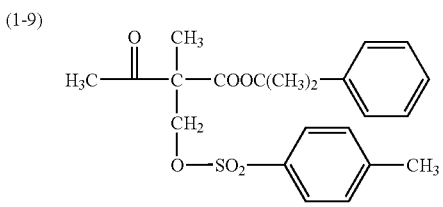
(1-10)

-continued
(1-11)
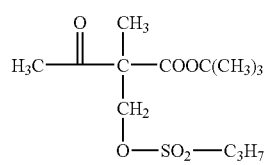
(2-1)
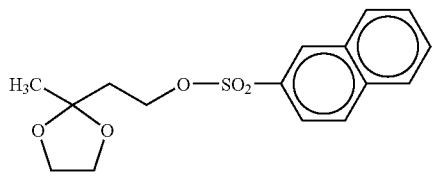
(2-2)
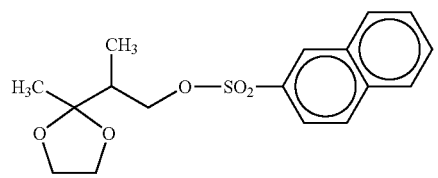
(2-3)
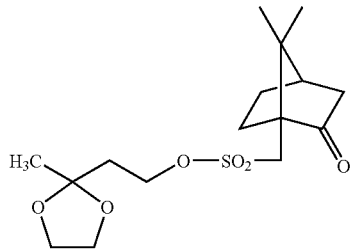
(2-4)
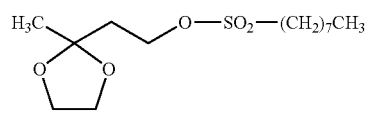
(2-5)
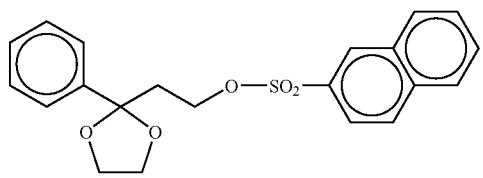
(2-6)
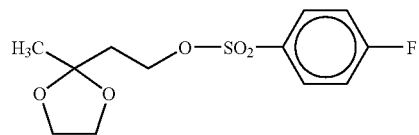
(3-1)
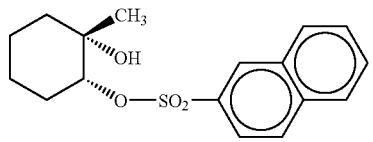
(3-2)
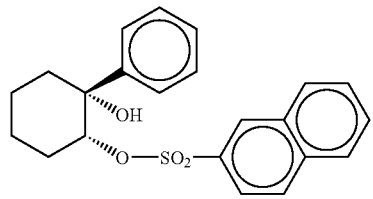
(3-3)
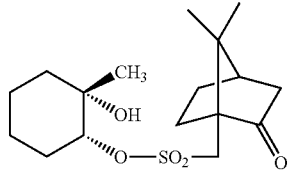
(3-4)
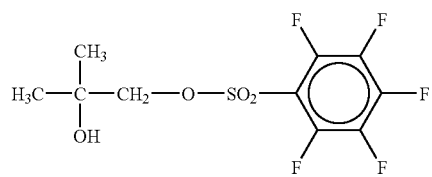
(3-5)
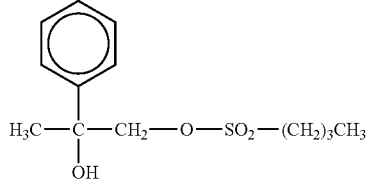
(3-6)
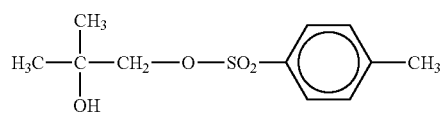
(4-1)
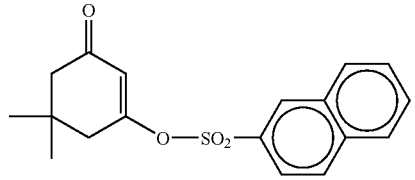
(4-2)
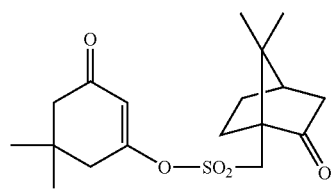
(4-3)
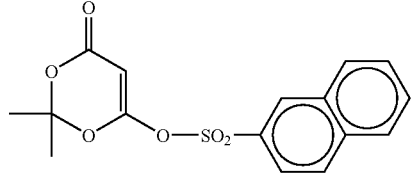

-continued
(4-4)
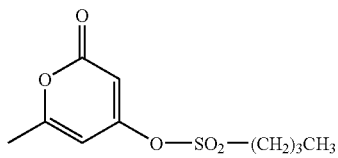
(4-5)
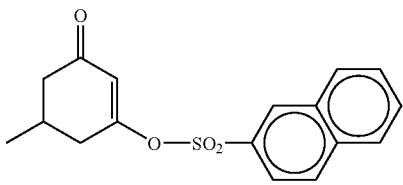
(4-6)
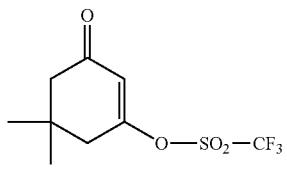
(4-7)
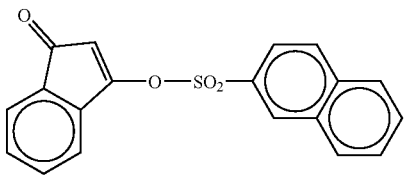
(5-1)
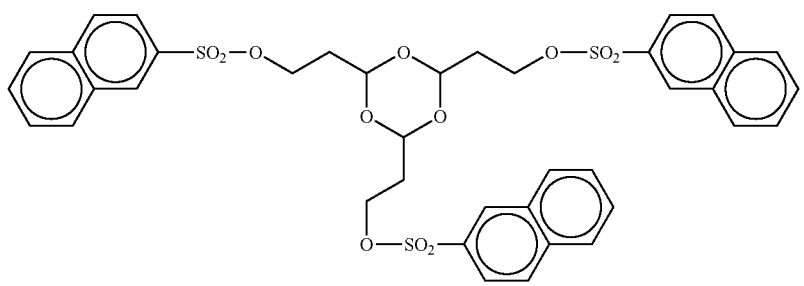
(5-2)
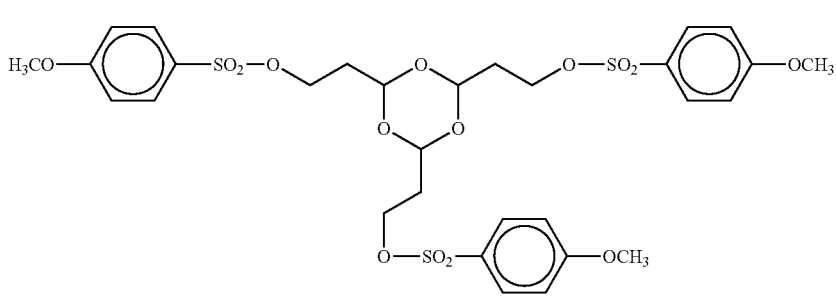
(5-3)
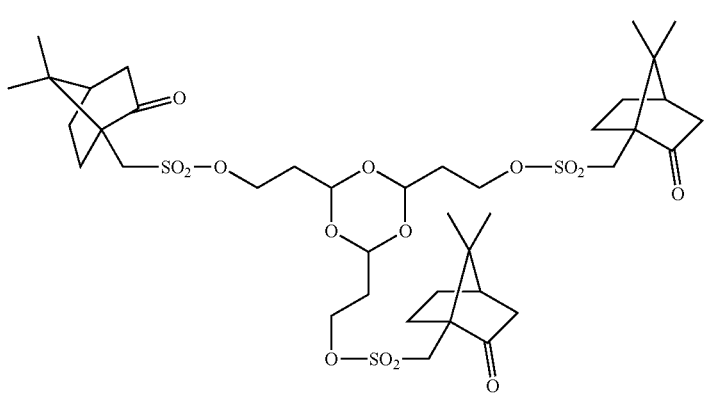
(5-4)
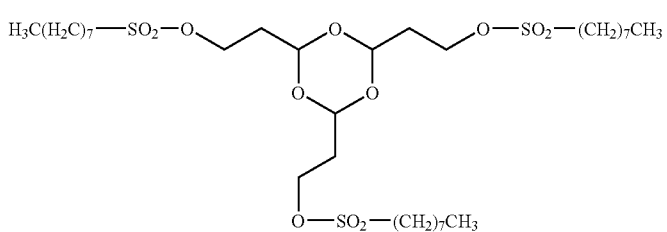

-continued
(6-1) 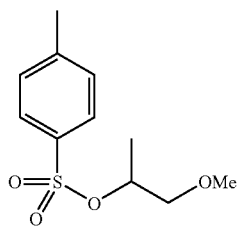
(6-2) 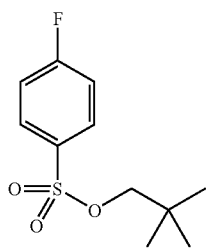
(6-3) 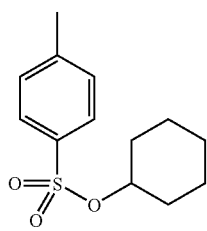
(6-4) 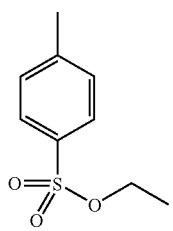
(6-5) 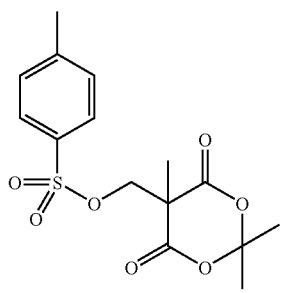
(6-6) 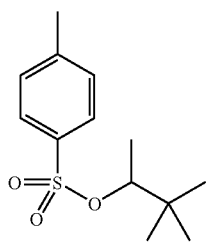
(6-7) 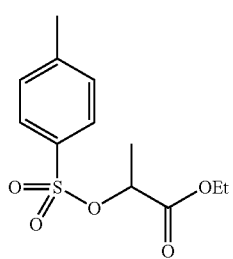
(6-8) 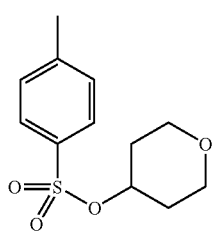
(6-9) 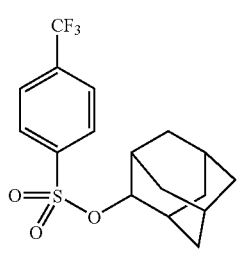
(6-10) 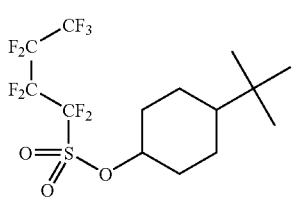
(6-11) 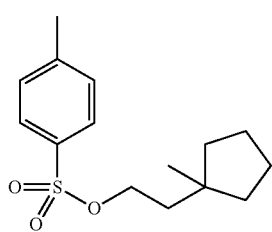
(6-12) 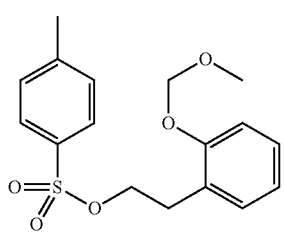

-continued

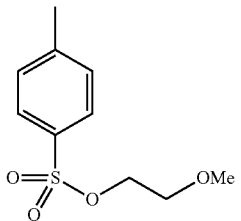
(6-13)

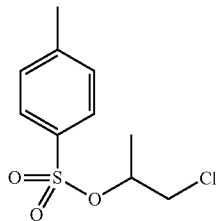
(6-14)

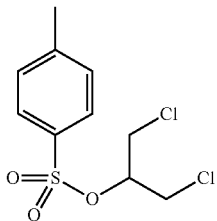
(6-15)

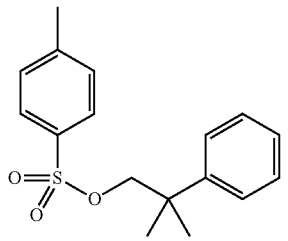
(6-16)

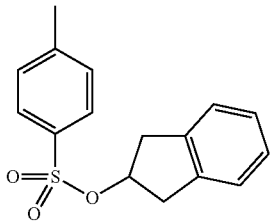
(6-17)

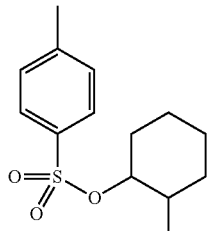
(6-18)

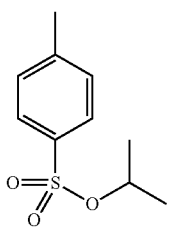
(6-19)

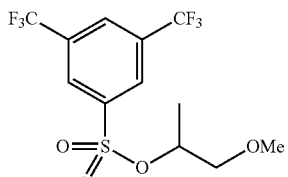
(6-20)

In the present invention, above all, the compound represented by formula (4) is preferred as the acid-increasing agent.

In the present invention, the amount of the acid-increasing agent added to the composition is preferably from 0.01 to 10 mass %, more preferably from 0.05 to 5 mass %, based on the entire solid content of the composition.

Solvent:

Examples of the solvent which can be used at the time of preparing a positive resist composition by dissolving respective components described above include an organic solvent such as alkylene glycol monoalkyl ether carboxylate, alkylene glycol monoalkyl ether, alkyl lactate, alkyl alkoxypropionate, cyclic lactone having a carbon number of 4 to 10, monoketone compound having a carbon number of 4 to 10 which may contain a ring, alkylene carbonate, alkyl alkoxyacetate and alkyl pyruvate.

Preferred examples of the alkylene glycol monoalkyl ether carboxylate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

Preferred examples of the alkylene glycol monoalkyl ether include propylene glycol monomethyl ether, propylene glycol monoethyl ether, propylene glycol monopropyl ether, propylene glycol monobutyl ether, ethylene glycol monomethyl ether and ethylene glycol monoethyl ether.

Preferred examples of the alkyl lactate include methyl lactate, ethyl lactate, propyl lactate and butyl lactate.

Preferred examples of the alkyl alkoxypropionate include ethyl 3-ethoxypropionate, methyl 3-methoxypropionate, methyl 3-ethoxypropionate and ethyl 3-methoxypropionate.

Preferred examples of the cyclic lactone having a carbon number of 4 to 10 include β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

Preferred examples of the monoketone compound having a carbon number of 4 to 10 which may contain a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

Preferred examples of the alkylene carbonate include propylene carbonate, vinylene carbonate, ethylene carbonate and butylene carbonate.

Preferred examples of the alkyl alkoxyacetate include 2-methoxyethyl acetate, 2-ethoxyethyl acetate, 2-(2-ethoxyethoxy)ethyl acetate, 3-methoxy-3-methylbutyl acetate and 1-methoxy-2-propyl acetate.

Preferred examples of the alkyl pyruvate include methyl pyruvate, ethyl pyruvate and propyl pyruvate.

The solvent which can be preferably used is a solvent having a boiling point of 130° C. or more at ordinary temperature under atmospheric pressure, and specific examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate and propylene carbonate.

In the present invention, one of these solvents may be used alone, or two or more species thereof may be used in combination.

In the present invention, a mixed solvent prepared by mixing a solvent containing a hydroxyl group in the structure and a solvent not containing a hydroxyl group may be used as the organic solvent.

Examples of the solvent containing a hydroxyl group include ethylene glycol, ethylene glycol monomethyl ether, ethylene glycol monoethyl ether, propylene glycol, propylene glycol monomethyl ether, propylene glycol monoethyl ether and ethyl lactate. Among these, propylene glycol monomethyl ether and ethyl lactate are preferred.

Examples of the solvent not containing a hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide and dimethylsulfoxide. Among these, propylene glycol monomethyl ether acetate, ethyl ethoxy-propionate, 2-heptanone, γ-butyrolactone, cyclohexanone and butyl acetate are preferred, and propylene glycol monomethyl ether acetate, ethyl ethoxypropionate and 2-heptanone are most preferred.

The mixing ratio (by mass) of the solvent containing a hydroxyl group and the solvent not containing a hydroxyl group is from 1/99 to 99/1, preferably from 10/90 to 90/10, more preferably from 20/80 to 60/40. A mixed solvent in which the solvent not containing a hydroxyl group is contained in an amount of 50 mass % or more is preferred in view of coating uniformity.

The solvent is preferably a mixed solvent of two or more species including propylene glycol monomethyl acetate.

Basic Compound:

The positive resist composition of the present invention preferably comprises a basic compound for reducing the change of performance in aging from exposure until heating.

Preferred examples of the basic compound include compounds having a structure represented by any one of the following formulae (A) to (E).

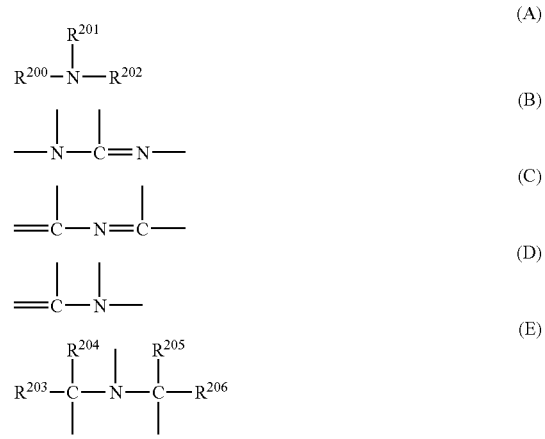

In formulae (A) to (E), $R^{200}$, $R^{201}$ and $R^{202}$, which may be the same or different, each represents a hydrogen atom, an alkyl group (preferably having a carbon number of 1 to 20), a cycloalkyl group (preferably having a carbon number of 3 to 20) or an aryl group (having a carbon number of 6 to 20), and $R^{201}$ and $R^{202}$ may combine with each other to form a ring.

As for the alkyl group, the alkyl group having a substituent is preferably an aminoalkyl group having a carbon number of 1 to 20, a hydroxyalkyl group having a carbon number of 1 to 20, or a cyanoalkyl group having a carbon number of 1 to 20.

$R^{203}$, $R^{204}$, $R^{205}$ and $R^{206}$, which may be the same or different, each represents an alkyl group having a carbon number of 1 to 20.

The alkyl group in these formulae (A) to (E) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole and benzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include triarylsulfonium hydroxide, phenacylsulfonium hydroxide and sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. Examples of the compound having an onium carboxylate structure include a compound where the anion moiety of the compound having an onium hydroxide structure is converted into a carboxylate, such as acetate, adamantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline, N,N-dimethylaniline, N,N-dibutylaniline and N,N-dihexylaniline. Examples of the alkylamine derivative having a hydroxyl group and/or an ether bond include ethanolamine, diethanolamine, triethanolamine and tris (methoxyethoxyethyl)amine. Examples of the aniline derivative having a hydroxyl group and/or an ether bond include N,N-bis(hydroxyethyl)aniline.

One of these basic compounds is used alone, or two or more species thereof are used in combination.

The amount of the basic compound used is usually from 0.001 to 10 mass %, preferably from 0.01 to 5 mass %, based on the solid content of the positive resist composition.

The ratio of the acid generator and the basic compound used in the composition is preferably acid generator/basic compound (by mol)=from 2.5 to 300. That is, the molar ratio is preferably 2.5 or more in view of sensitivity and resolution and preferably 300 or less from the standpoint of suppressing the reduction in resolution due to thickening of the resist pattern in aging after exposure until heat treatment. The acid generator/basic compound (by mol) is more preferably from 5.0 to 200, still more preferably from 7.0 to 150.

Surfactant:

The positive resist composition of the present invention preferably further comprises a surfactant, more preferably any one fluorine-containing and/or silicon-containing surfactant (a fluorine-containing surfactant, a silicon-containing surfactant or a surfactant containing both a fluorine atom and a silicon atom) or two or more species thereof.

When the positive resist composition of the present invention contains the above-described surfactant, a resist pattern with good sensitivity, resolution and adhesion as well as less development defects can be obtained on use of an exposure light source of 250 nm or less, particularly 220 nm or less.

Examples of the fluorine-containing and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing surfactant and a silicon-containing surfactant, such as EFtop EF301 and EF303 (produced by Shin-Akita Kasei K.K.); Florad FC430, 431 and 4430 (produced by Sumitomo 3M Inc.); Megafac F171, F173, F176, F189, F113, F110, F177, F120 and R08 (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); Eftop EF121, EF122A, EF122B, RF122C, EF125M, EF135M, EF351, 352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). In addition, polysiloxane polymer KP-341 (produced by Shin-Etsu Chemical Co., Ltd.) may also be used as a silicon-containing surfactant.

Other than those known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene)) acrylate and/or a (poly(oxyalkylene)) methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer and a (poly(oxyalkylene)) acrylate (or methacrylate) is not limited only to a binary copolymer but may also be a ternary or greater copolymer obtained by simultaneously copolymerizing two or more different fluoro-aliphatic group-containing monomers or two or more different (poly(oxyalkylene)) acrylates (or methacrylates).

Examples thereof include, as the commercially available surfactant, Megafac F178, F-470, F-473, F-475, F-476 and F-472 (produced by Dainippon Ink & Chemicals, Inc.) and further include a copolymer of a $C_6F_{13}$ group-containing acrylate (or methacrylate) with a (poly(oxyalkylene)) acrylate (or methacrylate), and a copolymer of a $C_3F_7$ group-containing acrylate (or methacrylate) with a (poly(oxyethylene)) acrylate (or methacrylate) and a (poly(oxypropylene)) acrylate (or methacrylate).

In the present invention, a surfactant other than the fluorine-containing and/or silicon-containing surfactant may also be used. Specific examples thereof include a nonionic surfactant such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylallyl ethers (e.g., polyoxyethylene octylphenol ether, polyoxyethylene nonylphenol ether), polyoxyethylene.polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate).

One of these surfactants may be used alone, or several species thereof may be used in combination.

The amount of the surfactant used is preferably from 0.01 to 10 mass %, more preferably from 0.1 to 5 mass %, based on the entire amount of the positive resist composition (excluding the solvent).

Onium Carboxylate:

The positive resist composition of the present invention may comprise an onium carboxylate. Examples of the onium carboxylate include sulfonium carboxylate, iodonium carboxylate and ammonium carboxylate. In particular, the onium carboxylate is preferably an iodonium salt or a sulfonium salt. Furthermore, the carboxylate residue of the onium carboxylate for use in the present invention preferably contains no aromatic group and no carbon-carbon double bond. The anion moiety is preferably a linear, branched, monocyclic or polycyclic alkylcarboxylate anion having a carbon number of 1 to 30, more preferably an anion of carboxylic acid with the alkyl group being partially or entirely fluorine-substituted. The alkyl chain may contain an oxygen atom. By virtue of such a construction, the transparency to light of 220 nm or less is ensured, the sensitivity and resolution are enhanced, and the defocus latitude depended on line pitch and the exposure margin are improved.

Examples of the anion of fluorine-substituted carboxylic acid include anions of fluoroacetic acid, difluoroacetic acid, trifluoroacetic acid, pentafluoropropionic acid, heptafluorobutyric acid, nonafluoropentanoic acid, perfluorododecanoic acid, perfluoro-tridecanoic acid, perfluorocyclohexanecarboxylic acid and 2,2-bistrifluoromethylpropionic acid.

These onium carboxylates can be synthesized by reacting a sulfonium, iodonium or ammonium hydroxide and a carboxylic acid with silver oxide in an appropriate solvent.

The content of the onium carboxylate in the composition is generally from 0.1 to 20 mass %, preferably from 0.5 to 10 mass %, more preferably from 1 to 7 mass %, based on the entire solid content of the composition.

Dissolution Inhibiting Compound Capable of Decomposing Under the Action of an Acid to Increase the Solubility in an Alkali Developer and Having a Molecular Weight of 3,000 or Less:

The dissolution inhibiting compound capable of decomposing under the action of an acid to increase the solubility in an alkali developer and having a molecular weight of 3,000 or less (hereinafter, sometimes referred to as a "dissolution inhibiting compound") is preferably an alicyclic or aliphatic compound containing an acid-decomposable group, such as acid-decomposable group-containing cholic acid derivatives described in Proceeding of SPIE, 2724, 355 (1996), so as not to reduce the transmission of light at 220 nm or less. The acid-decomposable group and alicyclic structure include those described above for the alicyclic hydrocarbon-based acid-decomposable resin.

The positive resist composition of the present invention, in the case of being exposed by a KrF excimer laser or irradiated with electron beams, preferably contains a structure where the phenolic hydroxyl group of a phenol compound is substituted by an acid-decomposable group. The phenol compound is preferably a phenol compound containing from 1 to 9 phenol skeletons, more preferably from 2 to 6 phenol skeletons.

The molecular weight of the dissolution inhibiting compound for use in the present invention is 3,000 or less, preferably from 300 to 3,000, more preferably from 500 to 2,500.

The amount of the dissolution inhibiting compound added is preferably from 3 to 50 mass %, more preferably from 5 to 40 mass %, based on the solid content of the positive resist composition.

Specific examples of the dissolution inhibiting compound are set forth below, but the present invention is not limited thereto.

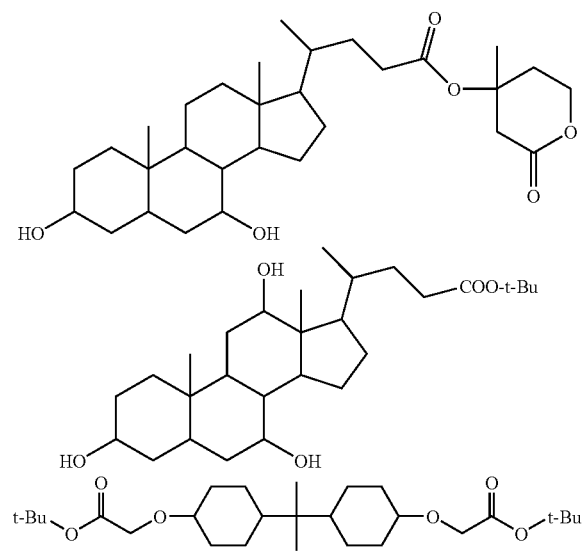

-continued

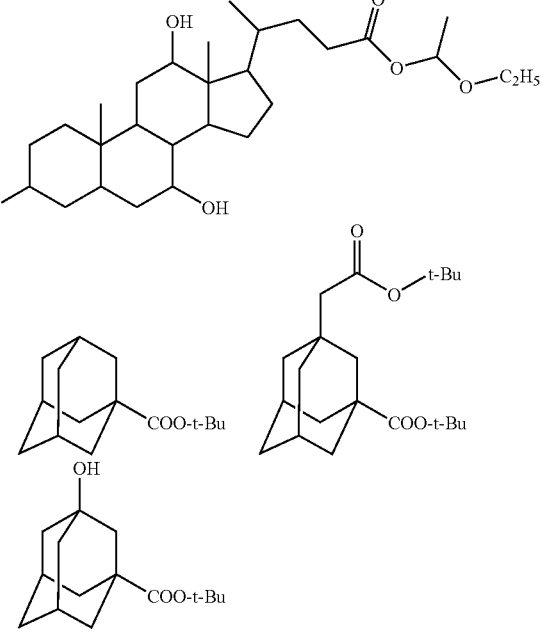

Other Additives:

The positive resist composition of the present invention may further contain, for example, a dye, a plasticizer, a photosensitizer, a light absorbent and a compound for accelerating dissolution in a developer (for example, a phenol compound having a molecular weight of 1,000 or less, or a carboxyl group-containing alicyclic or aliphatic compound), if desired.

The phenol compound having a molecular weight of 1,000 or less can be easily synthesized by one skilled in the art with reference to the methods described, for example, in JP-A-4-122938, JP-A-2-28531, U.S. Patent 4,916,210 and European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid and a cyclohexanedicarboxylic acid.

Pattern Forming Method:

From the standpoint of enhancing the resolution, the positive resist composition of the present invention is preferably used in a film thickness of 30 to 250 nm, more preferably from 30 to 200 nm. Such a film thickness can be obtained by setting the solid content concentration in the positive resist composition to fall within a proper range so as to impart an appropriate viscosity and enhance the coatability and film-forming property.

The entire solid content concentration in the positive resist composition is generally from 1 to 10 mass %, preferably from 1 to 8.0 mass %, more preferably from 1.0 to 6.0 mass %.

The positive resist composition of the present invention is used by dissolving the components described above in a predetermined organic solvent, preferably in the above-described mixed solvent, filtering the solution through a filter, and coating it on a predetermined support as follows. The filter used for filtering is preferably a filter made of polytetrafluoroethylene, polyethylene or nylon and having a pore size of 0.1 micron or less, more preferably 0.05 microns or less, still more preferably 0.03 microns or less.

For example, the positive resist composition is coated on a substrate (e.g., silicon/silicon dioxide-coated substrate) as those used in the production of a precision integrated circuit device, by an appropriate coating method such as spinner or coater, and dried to form a resist film.

The resist film formed is irradiated with actinic rays or radiation through a predetermined mask and preferably after baking (heating), subjected to development and rinsing, whereby a good pattern can be obtained.

Examples of the actinic rays or radiation include infrared light, visible light, ultraviolet light, far ultraviolet light, X-ray and electron beam, but the radiation is preferably far ultraviolet light at a wavelength of 250 nm or less, more preferably 220 nm or less, still more preferably from 1 to 200 nm. Specific examples thereof include KrF excimer laser light (248 nm), ArF excimer laser light (193 nm), $F_2$ excimer laser light (157 nm), X-ray and electron beam. ArF excimer laser light, $F_2$ excimer laser light, EUV (13 nm) and electron beam are preferred.

Before forming the resist film, an antireflection film may be previously provided by coating on the substrate.

The antireflection film used may be either an inorganic film type such as titanium, titanium dioxide, titanium nitride, chromium oxide, carbon and amorphous silicon, or an organic film type comprising a light absorbent and a polymer material. Also, the organic antireflection film may be a commercially available organic antireflection film such as DUV30 Series and DUV-40 Series produced by Brewer Science, Inc., and AR-2, AR-3 and AR-5 produced by Shipley Co., Ltd.

In the development step, an alkali developer is used as follows. The alkali developer which can be used for the positive resist composition is an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, and cyclic amines such as pyrrole and piperidine.

Furthermore, this alkali developer may be used after adding thereto an appropriate amount of alcohols or a surfactant.

The alkali concentration of the alkali developer is usually from 0.1 to 20 mass %.

The pH of the alkali developer is usually from 10.0 to 15.0.

Also, the above-described alkaline aqueous solution may be used after adding thereto an appropriate amount of alcohols or a surfactant.

As for the rinsing solution, pure water is used and the pure water may be used after adding thereto an appropriate amount of a surfactant.

After the development or rinsing, the developer or rinsing solution adhering on the pattern may removed by a supercritical fluid.

The exposure may be performed by filling a liquid (immersion medium) having a refractive index higher than that of air between the resist film and a lens at the irradiation with actinic rays or radiation (immersion exposure). By this exposure, the resolution can be enhanced. The immersion medium may be any liquid as long as it has a refractive index higher than that of air, but pure water is preferred.

The immersion liquid used in the immersion exposure is described below.

The immersion liquid is preferably a liquid transparent to light at the exposure wavelength and having a small temperature coefficient of refractive index as much as possible so as to minimize the distortion of an optical image projected on the resist film. Particularly, when the exposure light source is an ArF excimer laser (wavelength: 193 nm), water is preferably used in view of easy availability and easy handleability, in addition to the above-described aspects.

Furthermore, a medium having a refractive index of 1.5 or more can also be used because the refractive index can be more enhanced. This medium may be either an aqueous solution or an organic solvent.

In the case of using water as the immersion liquid, for the purpose of decreasing the surface tension of water and increasing the surface activity, an additive (liquid) which does not dissolve the resist film on a wafer and at the same time, gives only a negligible effect on the optical coat at the undersurface of the lens element, may be added in a small ratio. The additive is preferably an aliphatic alcohol having a refractive index nearly equal to that of water, and specific examples thereof include methyl alcohol, ethyl alcohol and isopropyl alcohol. By adding an alcohol having a refractive index nearly equal to that of water, even when the alcohol component in water is evaporated and its concentration is changed, the change in the refractive index of the liquid as a whole can be advantageously made very small. On the other hand, if a substance opaque to light at 193 nm or an impurity greatly differing in the refractive index from water is mingled, this incurs distortion of the optical image projected on the resist. Therefore, the water used is preferably distilled water. Pure water after further filtration through an ion exchange filter or the like may also be used.

The electrical resistance of water is preferably 18.3 MΩcm or more, and TOC (organic material concentration) is preferably 20 ppb or less. Also, the water is preferably subjected to a deaeration treatment.

The lithography performance can be enhanced by increasing the refractive index of the immersion liquid. From such an aspect, an additive for increasing the refractive index may be added to water, or heavy water ($D_2O$) may be used in place of water.

In the case where the resist composition comprising the positive resist composition of the present invention is exposed through an immersion medium, a hydrophobic resin (HR) may be further added, if desired. By this addition, a hydrophobic resin (HR) is unevenly distributed to the surface layer of the resist film and when the immersion medium is water, the resist film formed can be enhanced in the receding contact angle on the resist film surface for water as well as in the followability to the immersion liquid. The hydrophobic resin (HR) may be any resin as long as the receding contact angle on the surface is enhanced by its addition, but a resin having at least either one of a fluorine atom and a silicon atom is preferred. The receding contact angle of the resist film is preferably from 60 to 90°, more preferably 70° or more. The amount of the hydrophobic resin added may be appropriately adjusted to give a resist film having a receding contact angle in the range above but is preferably from 0.1 to 10 mass %, more preferably from 0.1 to 5 mass %, based on the entire solid content of the positive resist composition. The hydrophobic resin (HR) is, as described above, unevenly distributed to the interface but unlike a surfactant, need not have necessarily a hydrophilic group in the molecule and may not contribute to uniform mixing of polar/nonpolar substances.

The fluorine atom or silicon atom in the hydrophobic resin (HR) may be present in the main chain of the resin or may be substituted to the side chain.

The hydrophobic resin (HR) is preferably a resin having a fluorine atom-containing alkyl group, a fluorine atom-containing cycloalkyl group or a fluorine atom-containing aryl group, as a fluorine atom-containing partial structure.

The fluorine atom-containing alkyl group (preferably having a carbon number of 1 to 10, more preferably from 1 to 4) is a linear or branched alkyl group with at least one hydrogen atom being substituted by a fluorine atom and may further have another substituent.

The fluorine atom-containing cycloalkyl group is a monocyclic or polycyclic cycloalkyl group with at least one hydrogen atom being substituted by a fluorine atom and may further have another substituent.

The fluorine atom-containing aryl group is an aryl group (e.g., phenyl, naphthyl) with at least one hydrogen atom being substituted by a fluorine atom and may further have another substituent.

Preferred examples of the fluorine atom-containing alkyl group, fluorine atom-containing cycloalkyl group and fluorine atom-containing aryl group include the groups represented by the following formulae (F2) to (F4), but the present invention is not limited thereto.

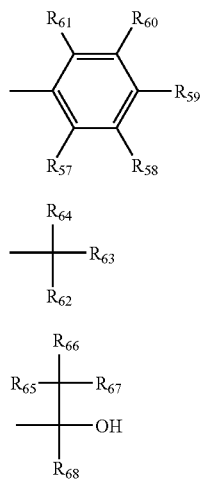

In formulae (F2) to (F4), $R_{57}$ to $R_{68}$ each independently represents a hydrogen atom, a fluorine atom or an alkyl group, provided that at least one of $R_{57}$ to $R_{61}$, at least one of $R_{62}$ to $R_{64}$ and at least one of $R_{65}$ to $R_{68}$ are a fluorine atom or an alkyl group (preferably having a carbon number of 1 to 4) with at least one hydrogen atom being substituted by a fluorine atom. It is preferred that $R_{57}$ to $R_{61}$ and $R_{65}$ to $R_{67}$ all are a fluorine atom. $R_{62}$, $R_{63}$ and $R_{68}$ each is preferably an alkyl group (preferably having a carbon number of 1 to 4) with at least one hydrogen atom being substituted by a fluorine atom, more preferably a perfluoroalkyl group having a carbon number of 1 to 4. $R_{62}$ and $R_{63}$ may combine with each other to form a ring.

Specific examples of the group represented by formula (F2) include p-fluorophenyl group, pentafluorophenyl group and 3,5-di(trifluoromethyl)phenyl group.

Specific examples of the group represented by formula (F3) include trifluoroethyl group, pentafluoropropyl group, pentafluoroethyl group, heptafluorobutyl group, hexafluoroisopropyl group, heptafluoroisopropyl group, hexafluoro(2-methyl)isopropyl group, nonafluorobutyl group, octafluoroisobutyl group, nonafluorohexyl group, nonafluoro-tert-butyl group, perfluoroisopentyl group, perfluorooctyl group, perfluoro(trimethyl)hexyl group, 2,2,3,3-tetrafluorocyclobutyl group and perfluorocyclohexyl group. Among these, hexafluoroisopropyl group, heptafluoroisopropyl group, hexafluoro(2-methyl)isopropyl group, octafluoroisobutyl group, nonafluoro-tert-butyl group and perfluoroisopentyl group are preferred, and hexafluoroisopropyl group and heptafluoroisopropyl group are more preferred.

Specific examples of the group represented by formula (F4) include —C(CF$_3$)$_2$OH, —C(C$_2$F$_5$)$_2$OH, —C(CF$_3$)(CH$_3$)OH and —CH(CF$_3$)OH, with —C(CF$_3$)$_2$OH being preferred.

Specific examples of the repeating unit having a fluorine atom are set forth below, but the present invention is not limited thereto.

In specific examples, $X_1$ represents a hydrogen atom, —CH$_3$, —F or —CF$_3$.

$X_2$ represents —F or —CF$_3$.

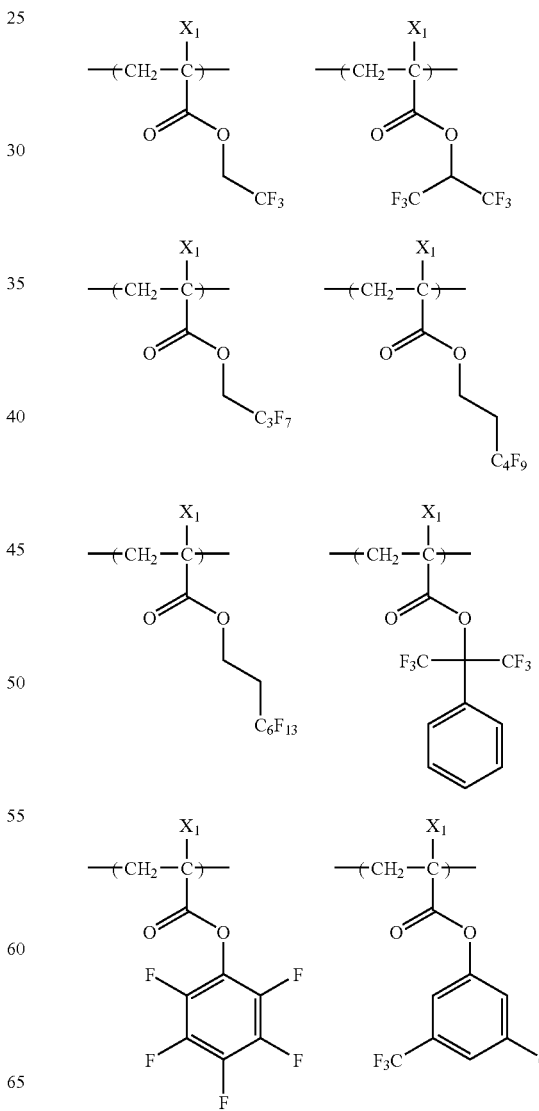

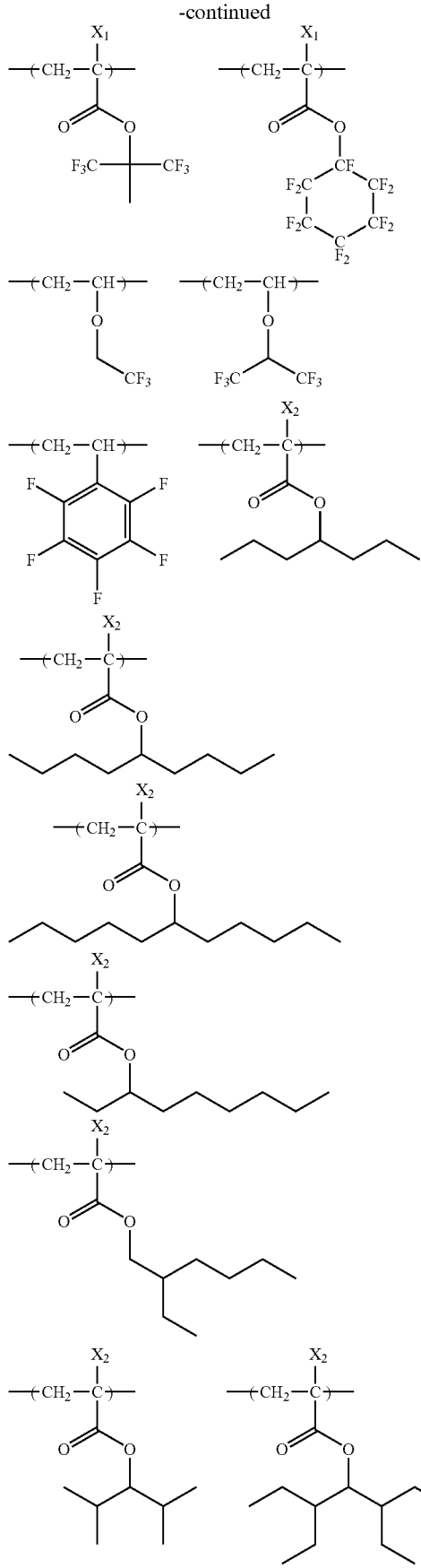
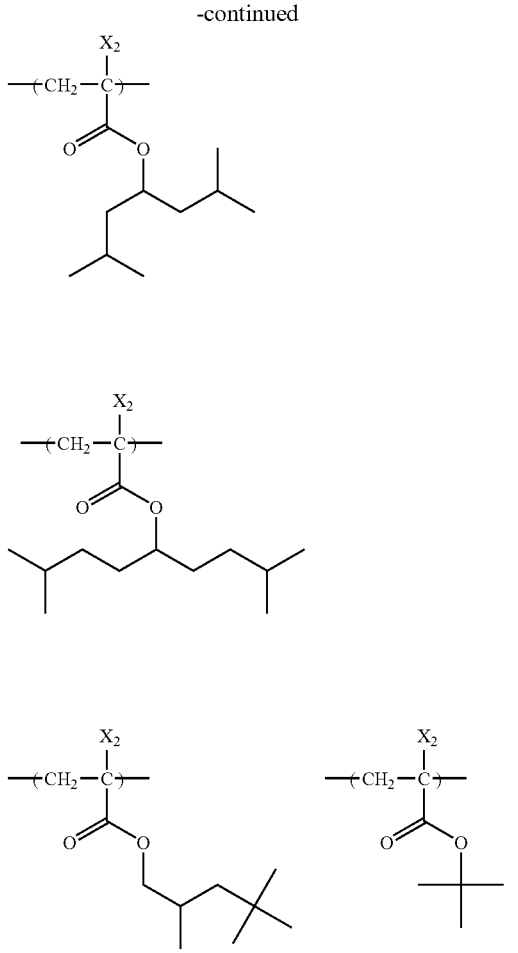
The hydrophobic resin (HR) is preferably a resin having an alkylsilyl structure (preferably a trialkylsilyl group) or a cyclic siloxane structure, as a silicon atom-containing partial structure.
Specific examples of the alkylsilyl structure and cyclic siloxane structure include the groups represented by the following formulae (CS-1) to (CS-3):
(CS-1)
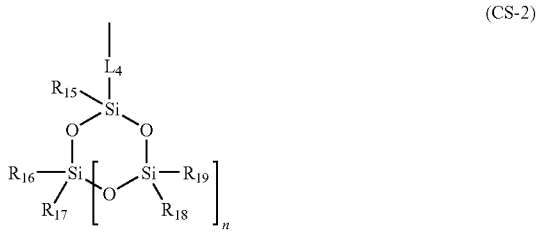
(CS-2)

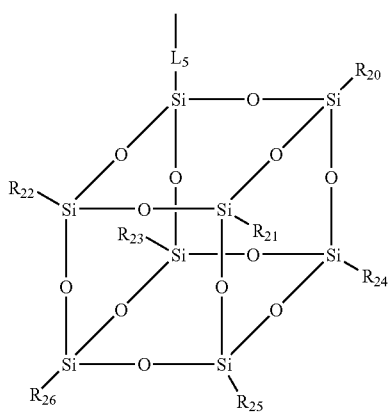

(CS-3)

In formulae (CS-1) to (CS-3), $R_{12}$ to $R_{26}$ each independently represents a linear or branched alkyl group (preferably having a carbon number of 1 to 20) or a cycloalkyl group (preferably having a carbon number of 3 to 20).

$L_3$ to $L_5$ each represents a single bond or a divalent linking group. The divalent linking group is a sole group or a combination of two or more groups selected from the group consisting of an alkylene group, a phenyl group, an ether group, a thioether group, a carbonyl group, an ester group, an amide group, a urethane group and a urea group.

n represents an integer of 1 to 5.

Specific examples of the repeating unit having a silicon atom are set forth below, but the present invention is not limited thereto.

In specific examples, $X_1$ represents a hydrogen atom, —$CH_3$, —F or —$CF_3$.

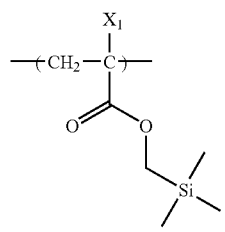
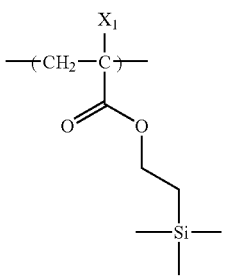
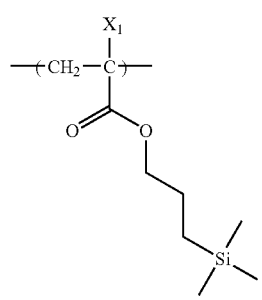
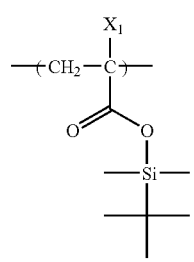

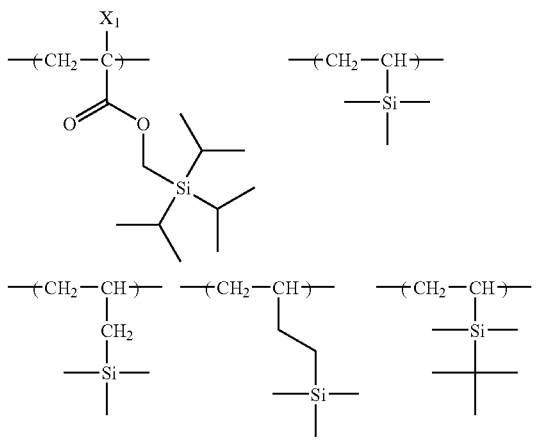
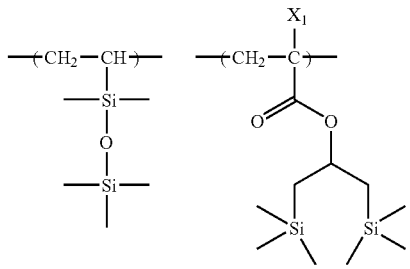
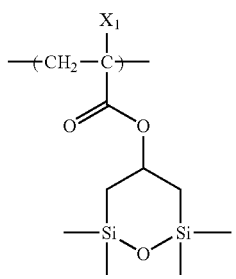
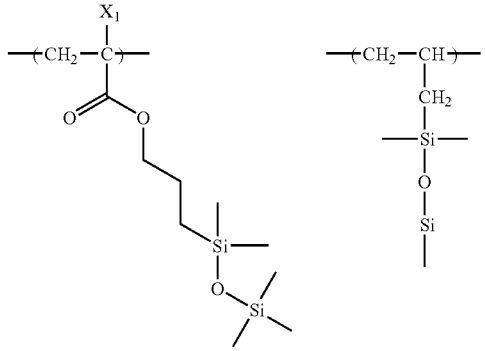
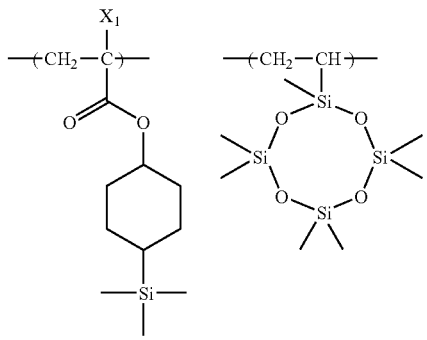

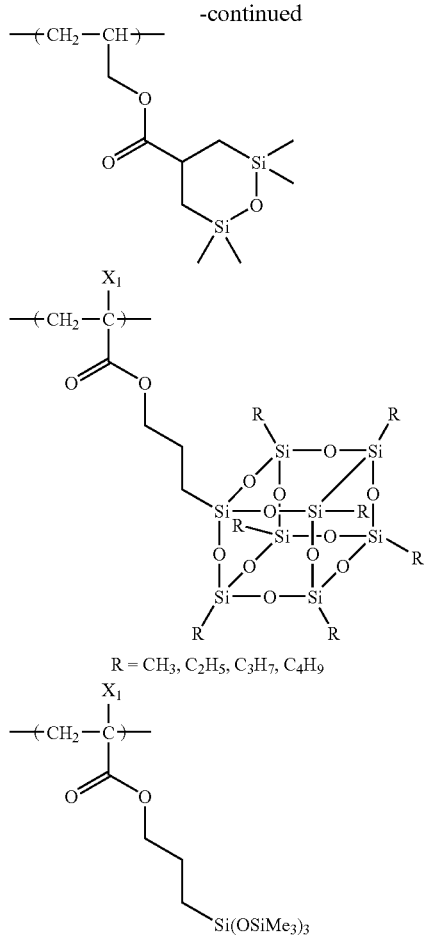

The hydrophobic resin (HR) may further contain at least one group selected from the group consisting of the following (x) to (z):

(x) an alkali-soluble group,
(y) a group which decomposes under the action of an alkali developer to increase the solubility in an alkali developer, and
(z) a group which decomposes under the action of an acid.

Examples of the (x) alkali-soluble group include groups having a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)-imide group, a tris(alkylcarbonyl)methylene group or a tris(alkylsulfonyl)methylene group.

Preferred alkali-soluble groups are a fluorinated alcohol group (preferably hexafluoroisopropanol), a sulfonimide group and a bis(carbonyl)methylene group.

As for the repeating unit having (x) an alkali-soluble group, all of a repeating unit where an alkali-soluble group is directly bonded to the resin main chain, such as repeating unit by an acrylic acid or a methacrylic acid, a repeating unit where an alkali-soluble group is bonded to the resin main chain through a linking group, and a repeating unit where an alkali-soluble group is introduced into the polymer chain terminal by using an alkali-soluble group-containing polymerization initiator or chain transfer agent at the polymerization, are preferred.

The content of the repeating unit having (x) an alkali-soluble group is preferably from 1 to 50 mol %, more preferably from 3 to 35 mol %, still more preferably from 5 to 20 mol %, based on all repeating units in the polymer.

Specific examples of the repeating unit having (x) an alkali-soluble group are set forth below, but the present invention is not limited thereto.

In the formulae, Rx represents H, CH₃, CF₃ or CH₂OH.

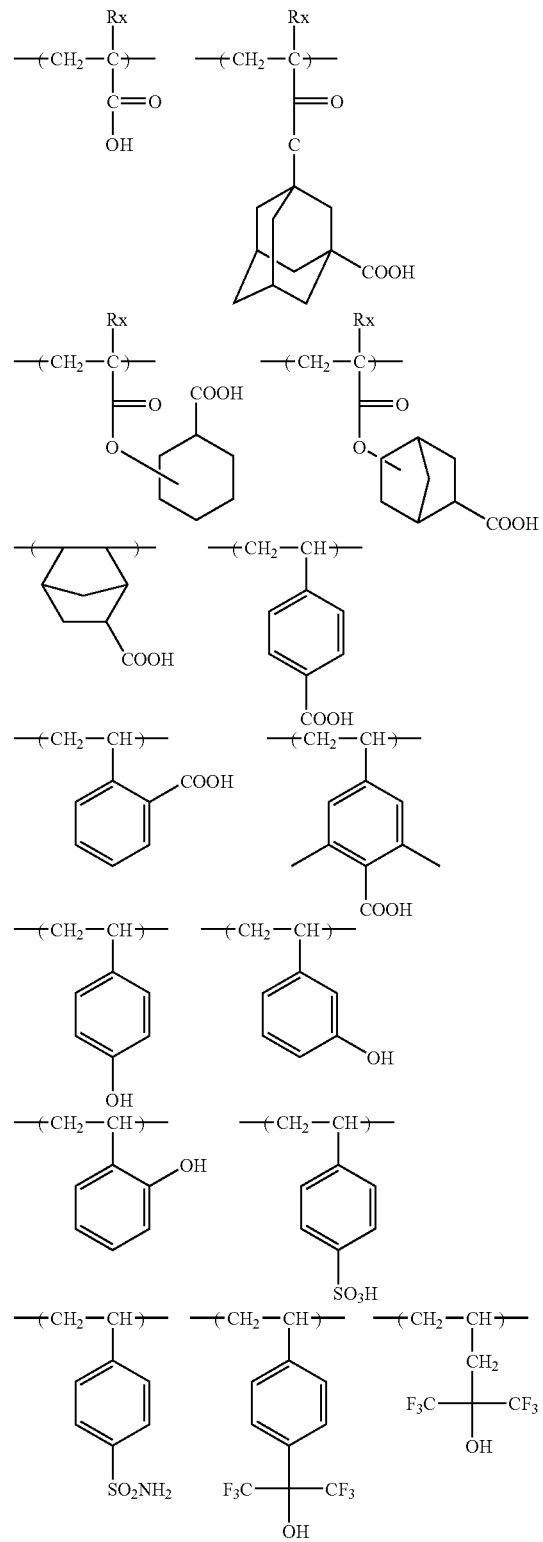

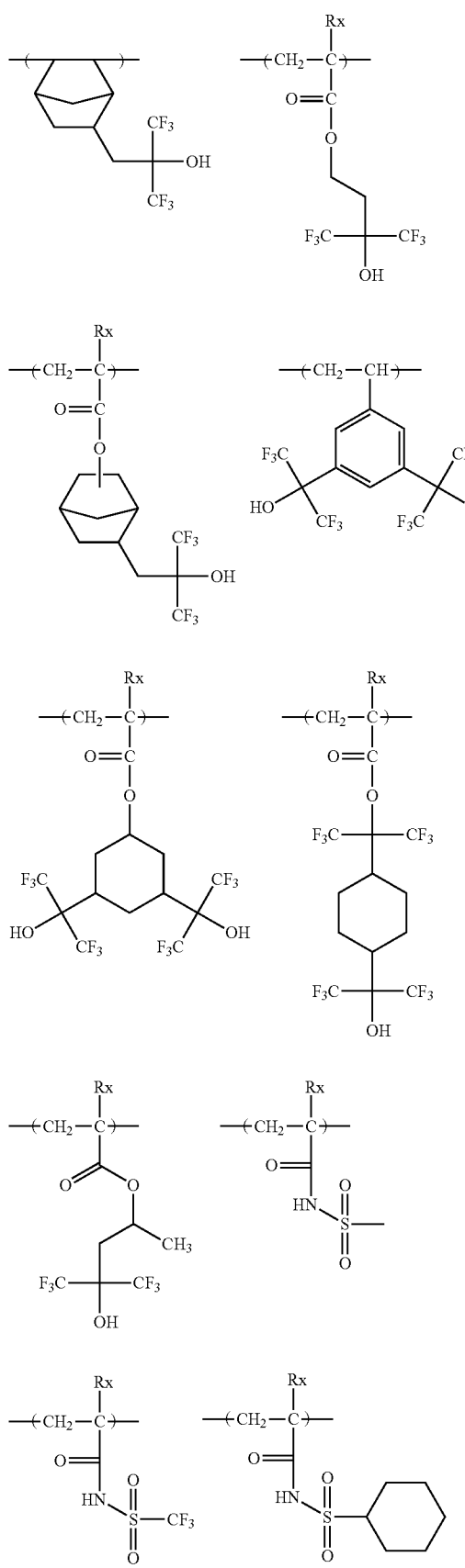
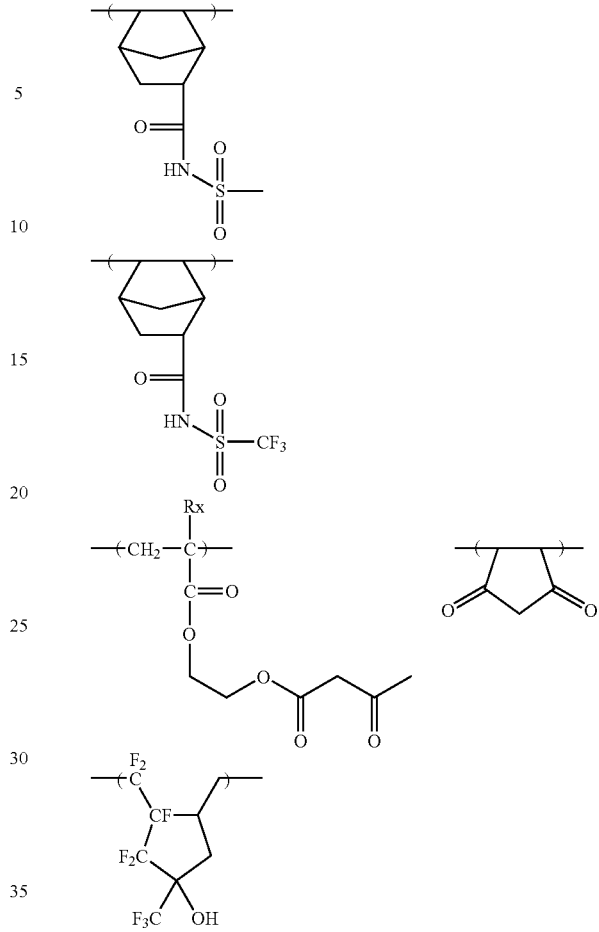

Examples of the (y) group which decomposes under the action of an alkali developer to increase the solubility in an alkali developer include a lactone structure-containing group, an acid anhydride and an acid imide group, with a lactone group being preferred.

As for the repeating unit having (y) a group which decomposes under the action of an alkali developer to increase the solubility in an alkali developer, both a repeating unit where (y) a group which decomposes under the action of an alkali developer to increase the solubility in an alkali developer is bonded to the resin main chain, such as repeating unit by an acrylic acid ester or a methacrylic acid ester, and a repeating unit where a group which decomposes under the action of an alkali developer to increase the solubility in an alkali developer is introduced into the polymer chain terminal by using, at the polymerization, a polymerization initiator or chain transfer agent having (y) a group which is increased in the solubility in an alkali developer, are preferred.

The content of the repeating unit having (y) a group which is increased in the solubility in an alkali developer is preferably from 1 to 40 mol %, more preferably from 3 to 30 mol %, still more preferably from 5 to 15 mol %, based on all repeating units in the polymer.

Specific examples of the repeating unit having (y) a group which is increased in the solubility in an alkali developer are the same as those of the repeating unit having a lactone structure described for the resin (B).

Examples of the repeating unit having (z) a group which decomposes under the action of an acid, contained in the hydrophobic resin (HR), are the same as those of the repeating unit having an acid-decomposable group described for the resin (B). In the hydrophobic resin (HR), the content of the repeating unit having (z) a group which decomposes under the action of an acid is preferably from 1 to 80 mol %, more preferably from 10 to 80 mol %, still more preferably from 20 to 60 mol %.

The hydrophobic resin (HR) may further contain a repeating unit represented by the following formula (III).

In formula (III), $R_4$ represents a group having an alkyl group, a cycloalkyl group, an alkenyl group or a cycloalkenyl group.

$L_6$ represents a single bond or a divalent linking group.

In formula (III), the alkyl group of $R_4$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The divalent linking group of $L_6$ is preferably an alkylene group (preferably having a carbon number of 1 to 5) or an oxy group.

In the case where the hydrophobic resin (HR) contains a fluorine atom, the fluorine atom content is preferably from 5 to 80 mass %, more preferably from 10 to 80 mass %, based on the molecular weight of the hydrophobic resin (HR). Also, the fluorine atom-containing repeating unit preferably occupies from 10 to 100 mass %, more preferably from 30 to 100 mass %, in the hydrophobic resin (HR).

In the case where the hydrophobic resin (HR) contains a silicon atom, the silicon atom content is preferably from 2 to 50 mass %, more preferably from 2 to 30 mass %, based on the molecular weight of the hydrophobic resin (HR). Also, the silicon atom-containing repeating unit preferably occupies from 10 to 100 mass %, more preferably from 20 to 100 mass %, in the hydrophobic resin (HR).

The standard polystyrene-reduced weight average molecular of the hydrophobic resin (HR) is preferably from 1,000 to 100,000, more preferably from 1,000 to 50,000, still more preferably from 2,000 to 15,000.

Similarly to the resin (B), it is preferred that, as a matter of course, the hydrophobic resin (HR) has less impurities such as metal and also, the content of the residual monomer or oligomer component is from 0 to 10 mass %, more preferably from 0 to 5 mass %, still more preferably from 0 to 1 mass %. When these conditions are satisfied, a resist free from foreign matters in liquid or change in the sensitivity and the like with the lapse of time can be obtained. Also, in view of the resolution, resist profile, and sidewall, roughness or the like of the resist pattern, the molecular weight distribution (Mw/Mn, also called dispersity) is preferably from 1 to 5, more preferably from 1 to 3, still more preferably from 1 to 2.

As for the hydrophobic resin (HR), various commercially available products may be used or the resin may be synthesized by an ordinary method (for example, radical polymerization)). Examples of the synthesis method in general include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and a solvent capable of dissolving the composition of the present invention, which is described later, such as propylene glycol monomethyl ether acetate, propylene glycol monomethyl ether and cyclohexanone. The polymerization is more preferably performed using the same solvent as the solvent used in the positive resist composition of the present invention. By the use of this solvent, generation of particles during storage can be suppressed.

The polymerization reaction is preferably performed in an inert gas atmosphere such as nitrogen and argon. As for the polymerization initiator, the polymerization is initiated using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methyl-propionate). The reaction concentration is from 5 to 50 mass %, preferably from 30 to 50 mass %, and the reaction temperature is usually from 10 to 150° C., preferably from 30 to 120° C., more preferably from 60 to 100° C.

After the completion of reaction, the reaction product is allowed to cool to room temperature and purified. The purification may be performed by a normal method, for example, a liquid-liquid extraction method of applying water washing or combining an appropriate solvent to remove residual monomers or oligomer components; a purification method in a solution sate, such as ultrafiltration of removing by extraction only polymers having a molecular weight not more than a specific molecular weight; a reprecipitation method of adding dropwise the resin solution in a bad solvent to solidify the resin in the bad solvent and thereby remove residual monomers or the like; and a purification method in a solid state, such as washing the resin slurry with a bad solvent after separation by filtration. For example, the resin is precipitated as a solid matter through contact with a solvent in which the resin is sparingly soluble or insoluble (bad solvent) and which is in a volume amount of 10 times or less, preferably from 10 to 5 times, the reaction solution.

The solvent used at the operation of precipitation or reprecipitation from the polymer solution (precipitation or reprecipitation solvent) may be sufficient if it is a bad solvent to the polymer, and the solvent used may be appropriately selected from a hydrocarbon, a halogenated hydrocarbon, a nitro compound, an ether, a ketone, an ester, a carbonate, an alcohol, a carboxylic acid, water, a mixed solvent containing such a solvent, and the like, according to the kind of the polymer. Among these solvents, the precipitation or reprecipitation solvent is preferably a solvent containing at least an alcohol (particularly methanol or the like) or water.

The amount of the precipitation or reprecipitation solvent used may be appropriately selected by taking into account the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into account the efficiency or operability, but the temperature is usually on the order of 0 to 50° C., preferably in the vicinity of room temperature (for example, approximately from 20 to 35° C.). The precipitation or reprecipitation operation may be performed using a commonly employed mixing vessel such as stirring tank, by a known method such as batch system and continuous system.

The precipitated or reprecipitated polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble. More specifically, there may be used a method comprising, after the completion of radical polymerization reaction, bringing the polymer into contact with a solvent in which the polymer is sparingly soluble or insoluble, to precipitate a resin (step a), separating the resin from the solution (step b), anew dissolving the resin in a solvent to prepare a resin solution A (step c), bringing the resin solution A into contact with a solvent in which the resin is sparingly soluble or insoluble and which is in a volume amount of less than 10 times (preferably a volume amount of 5 times or less) the resin solution A, to precipitate a resin solid (step d), and separating the precipitated resin (step e).

Specific examples of the hydrophobic resin (HR) are set forth below. Also, the molar ratio of repeating units (corresponding to repeating units from the left), weight average molecular weight and dispersity of each resin are shown in Table 1 below.

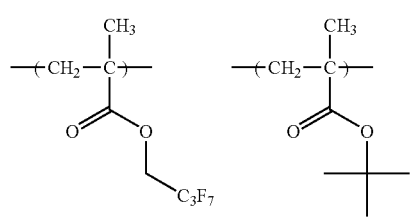

(HR-1)

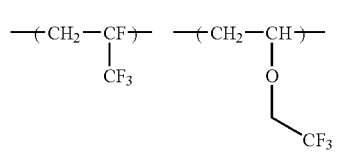

(HR-2)

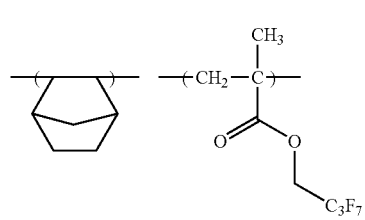

(HR-3)

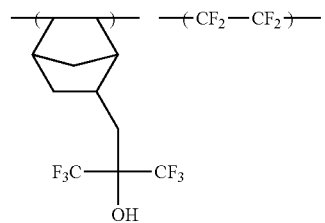

(HR-4)

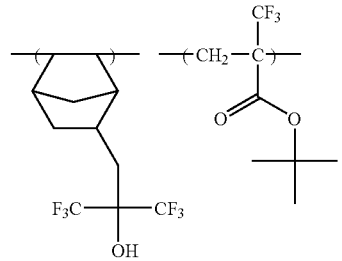

(HR-5)

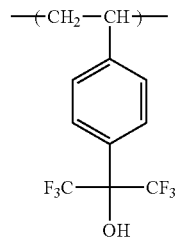

(HR-6)

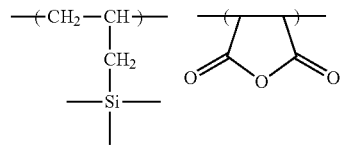

(HR-7)

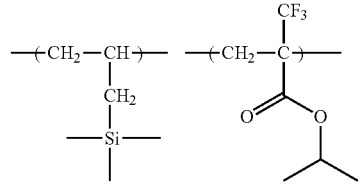

(HR-8)

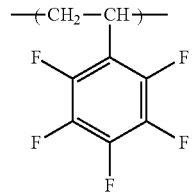

(HR-9)

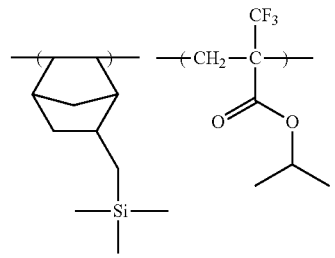

(HR-10)

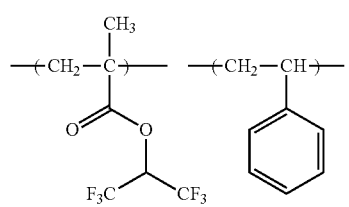
(HR-11)
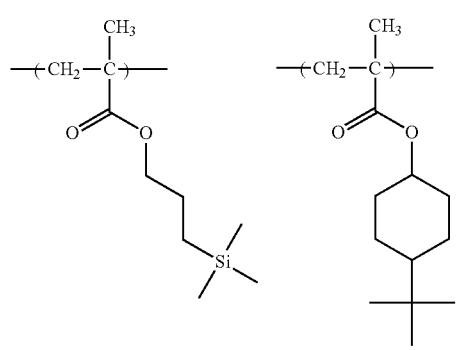
(HR-12)
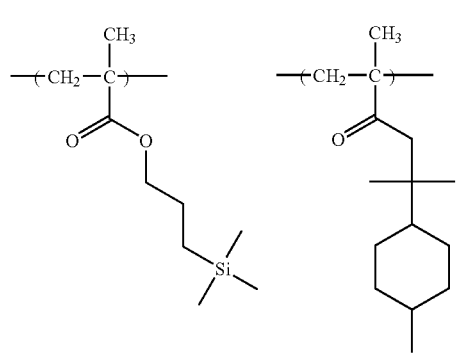
(HR-13)
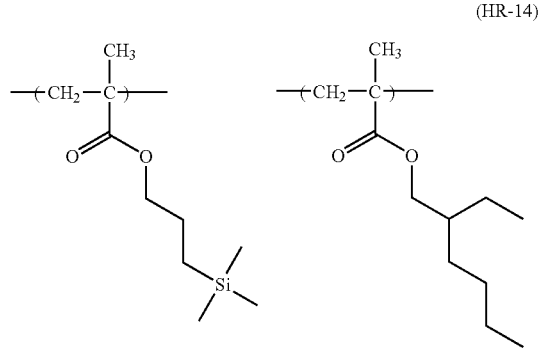
(HR-14)
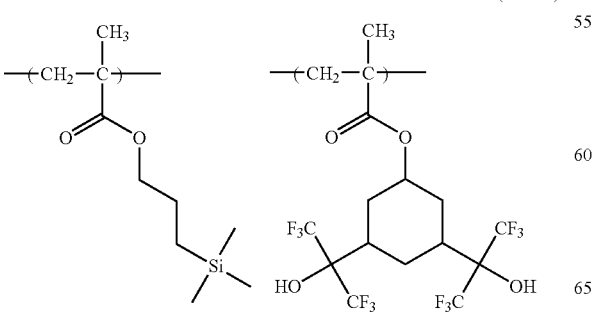
(HR-15)
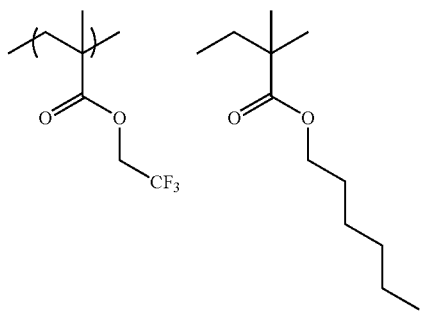
(HR-16)
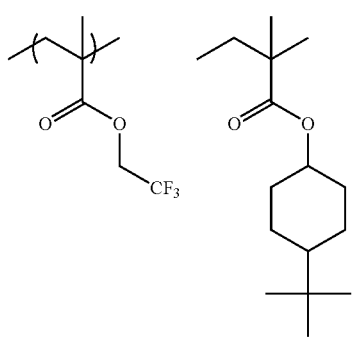
(HR-17)
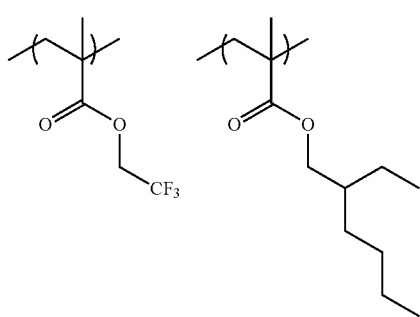
(HR-18)
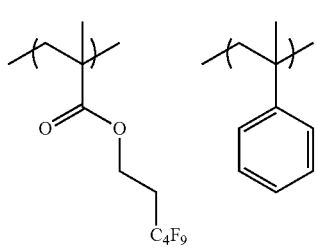
(HR-19)
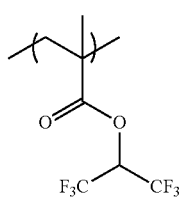
(HR-20)
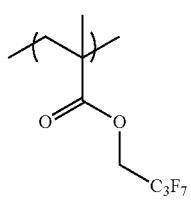
(HR-21)

(HR-22)
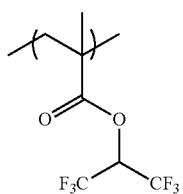
(HR-23)
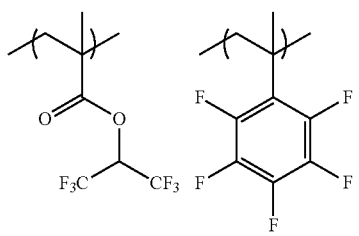
(HR-24)
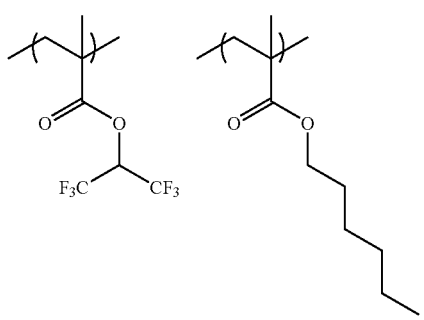
(HR-25)
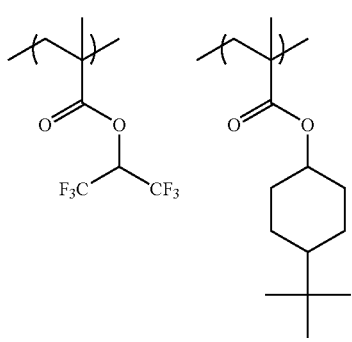
(HR-26)
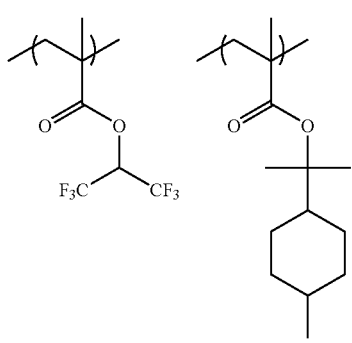
(HR-27)
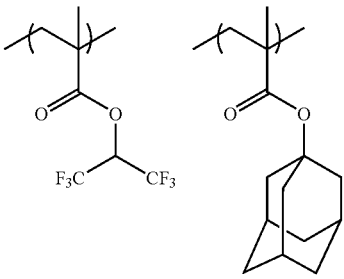
(HR-28)
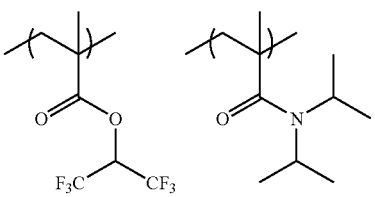
(HR-29)
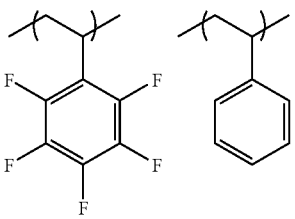
(HR-30)
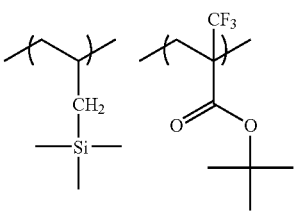
(HR-31)
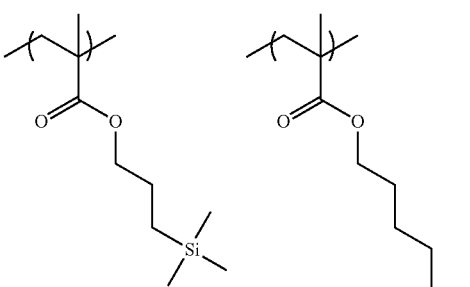
(HR-32)

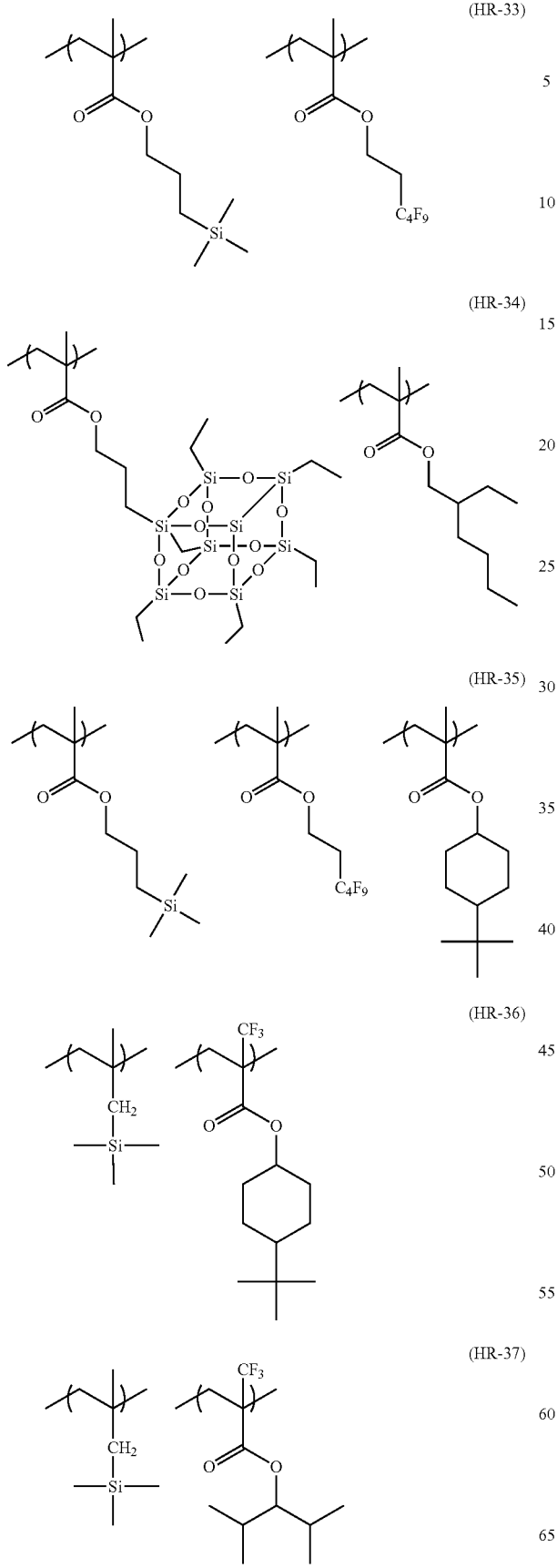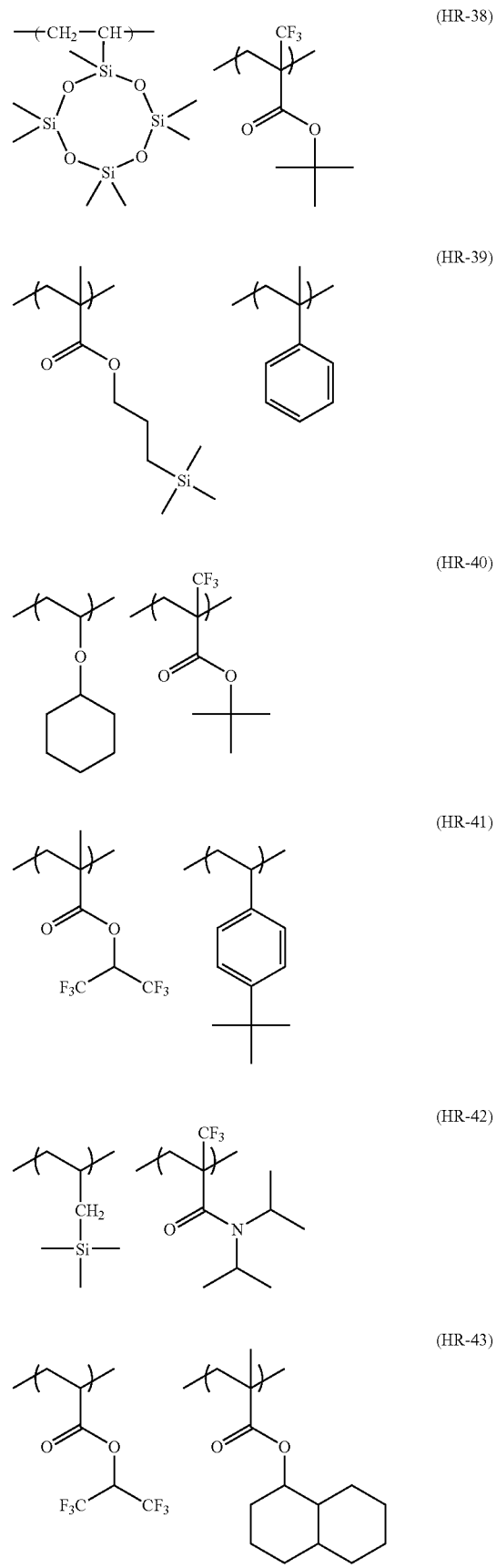

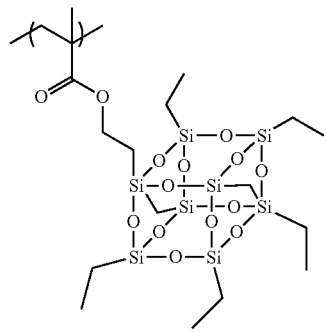 (HR-44)
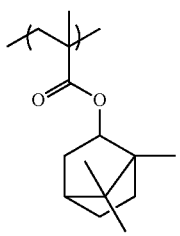
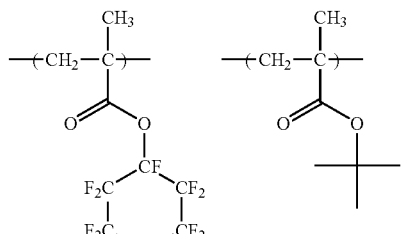 (HR-49)
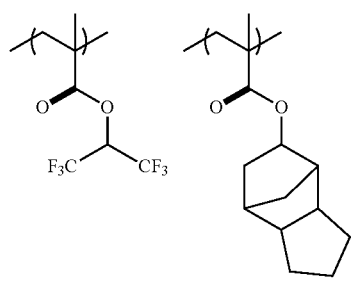 (HR-45)
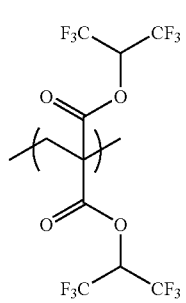 (HR-50)
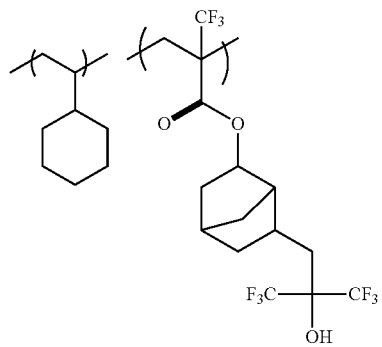 (HR-46)
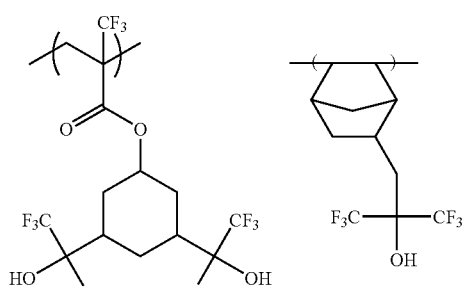 (HR-51)
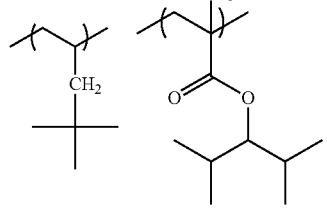 (HR-47)
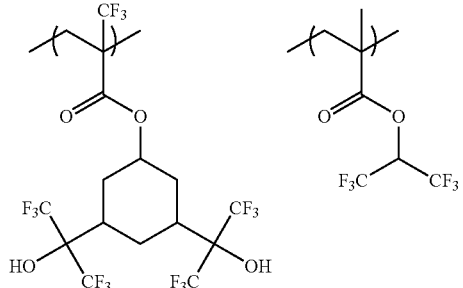 (HR-52)
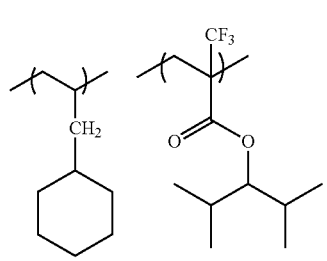 (HR-48)
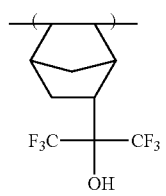 (HR-53)

(HR-54)
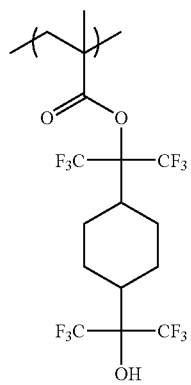
(HR-55)
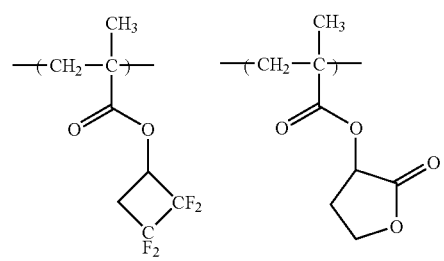
(HR-56)
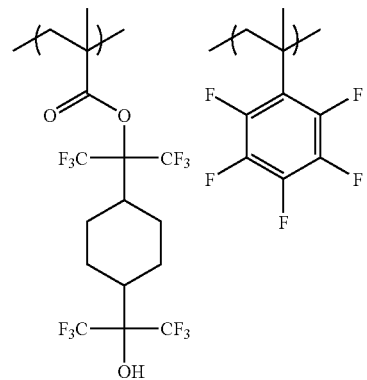
(HR-57)
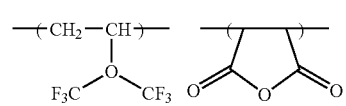
(HR-58)
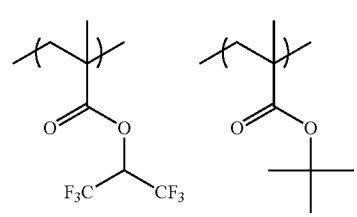
(HR-59)
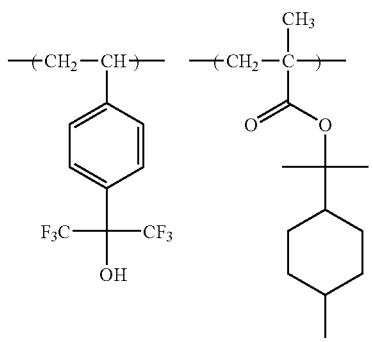
(HR-60)
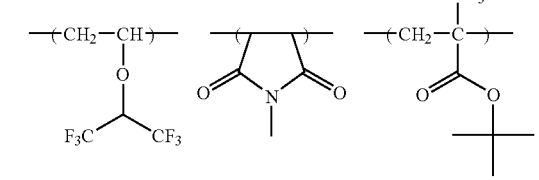
(HR-61)
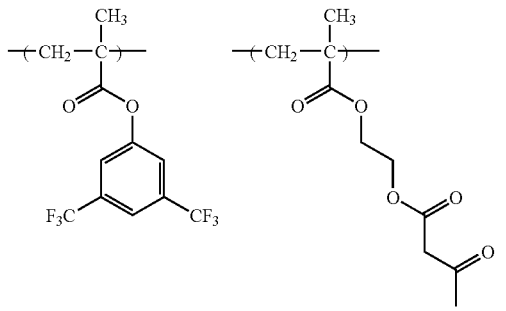
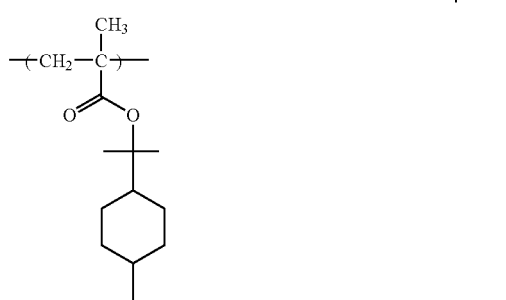
(HR-62)
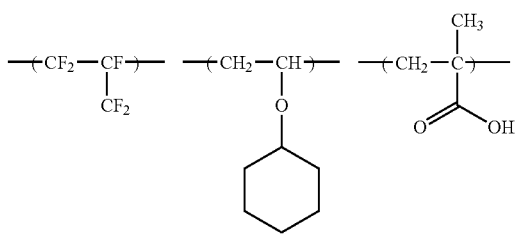

(HR-63) 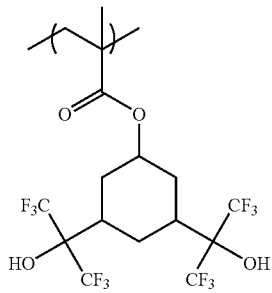
(HR-64) 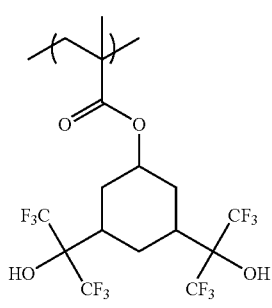
(HR-65) 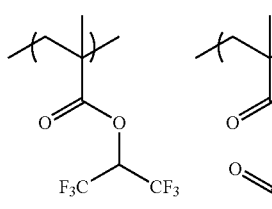
(HR-66) 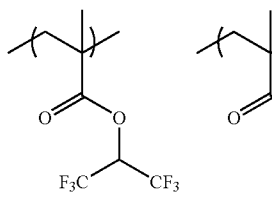
(HR-67) 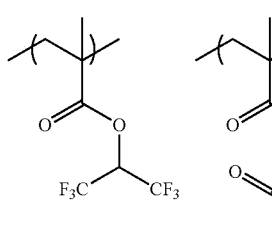
(HR-68) 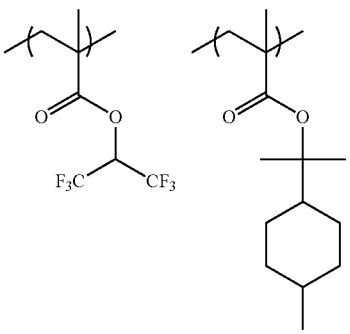
(HR-69) 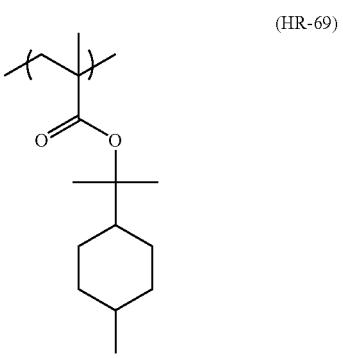
(HR-70) 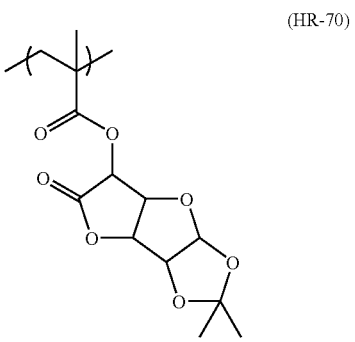
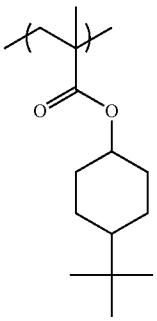
(HR-71) 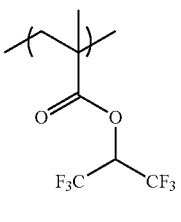 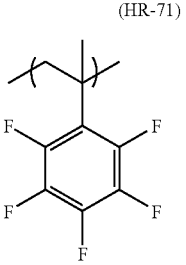

(HR-72)
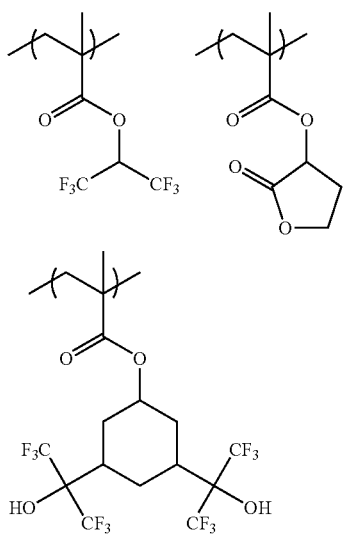
(HR-73)
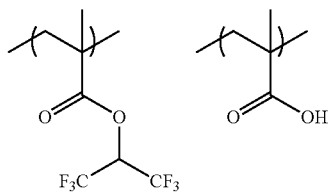
(HR-74)
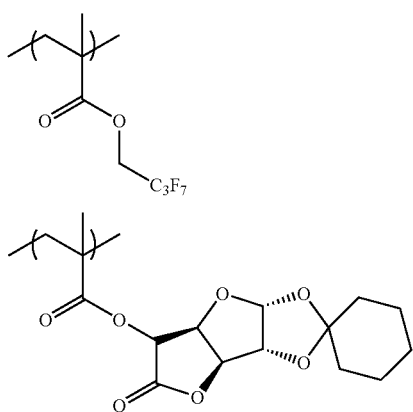
(HR-75)
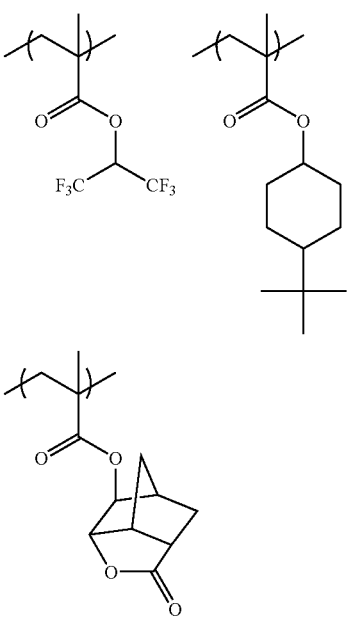
(HR-76)
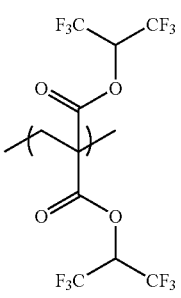
(HR-77)
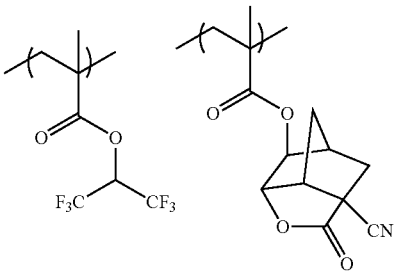

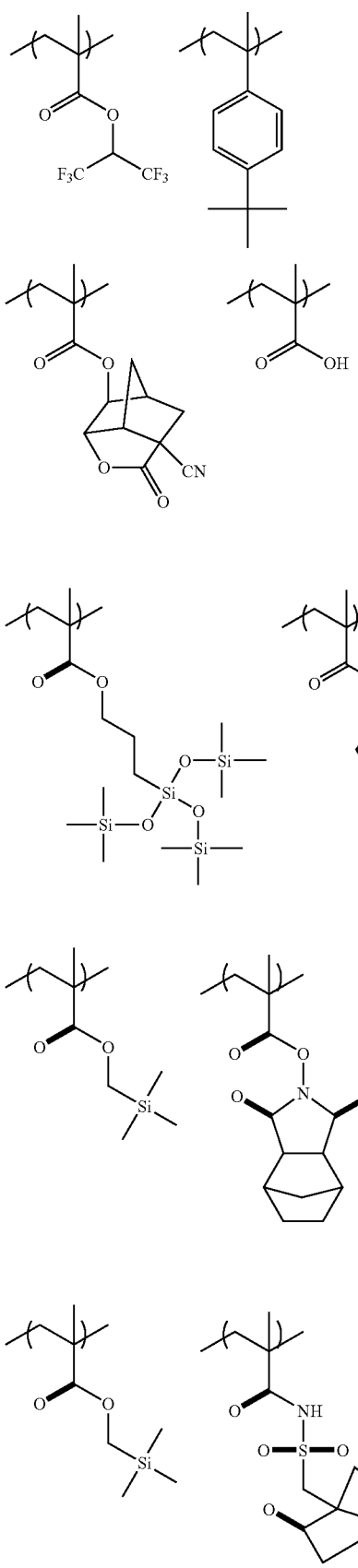
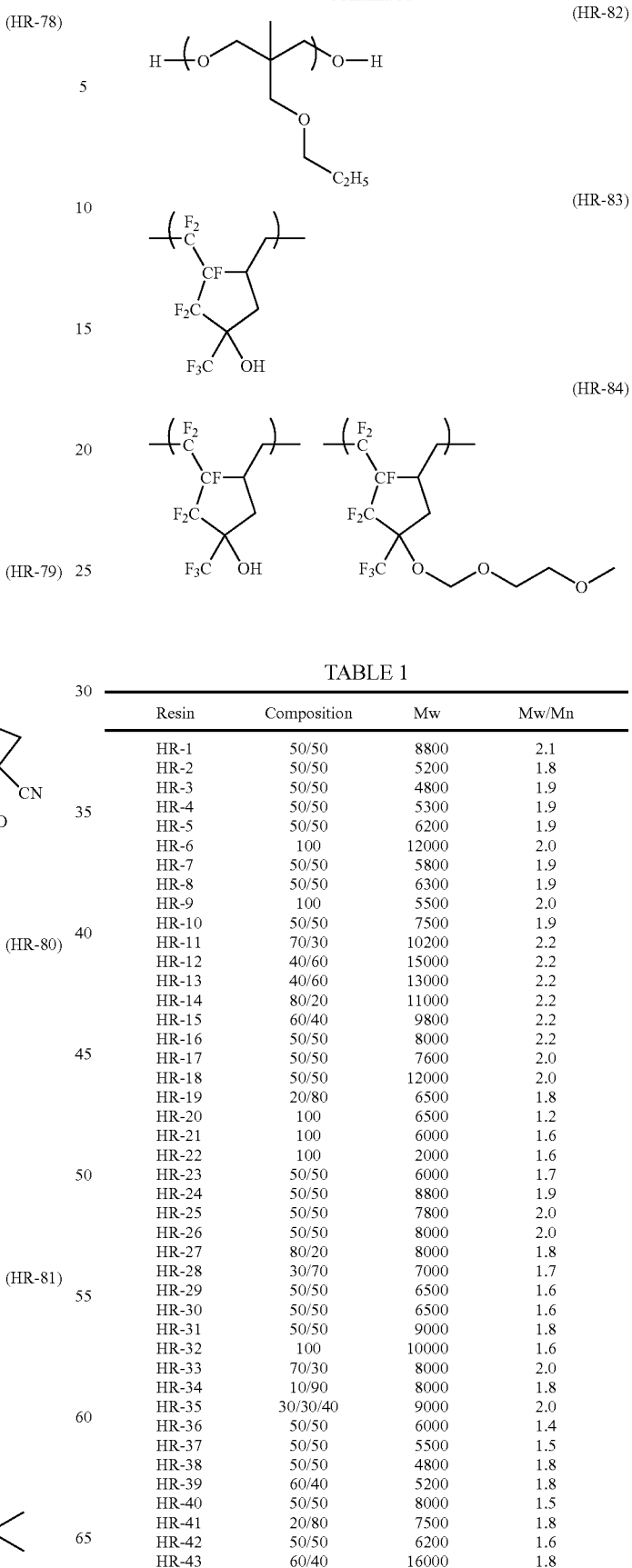
| Resin | Composition | Mw | Mw/Mn |
|---|---|---|---|
| HR-1 | 50/50 | 8800 | 2.1 |
| HR-2 | 50/50 | 5200 | 1.8 |
| HR-3 | 50/50 | 4800 | 1.9 |
| HR-4 | 50/50 | 5300 | 1.9 |
| HR-5 | 50/50 | 6200 | 1.9 |
| HR-6 | 100 | 12000 | 2.0 |
| HR-7 | 50/50 | 5800 | 1.9 |
| HR-8 | 50/50 | 6300 | 1.9 |
| HR-9 | 100 | 5500 | 2.0 |
| HR-10 | 50/50 | 7500 | 1.9 |
| HR-11 | 70/30 | 10200 | 2.2 |
| HR-12 | 40/60 | 15000 | 2.2 |
| HR-13 | 40/60 | 13000 | 2.2 |
| HR-14 | 80/20 | 11000 | 2.2 |
| HR-15 | 60/40 | 9800 | 2.2 |
| HR-16 | 50/50 | 8000 | 2.2 |
| HR-17 | 50/50 | 7600 | 2.0 |
| HR-18 | 50/50 | 12000 | 2.0 |
| HR-19 | 20/80 | 6500 | 1.8 |
| HR-20 | 100 | 6500 | 1.2 |
| HR-21 | 100 | 6000 | 1.6 |
| HR-22 | 100 | 2000 | 1.6 |
| HR-23 | 50/50 | 6000 | 1.7 |
| HR-24 | 50/50 | 8800 | 1.9 |
| HR-25 | 50/50 | 7800 | 2.0 |
| HR-26 | 50/50 | 8000 | 2.0 |
| HR-27 | 80/20 | 8000 | 1.8 |
| HR-28 | 30/70 | 7000 | 1.7 |
| HR-29 | 50/50 | 6500 | 1.6 |
| HR-30 | 50/50 | 6500 | 1.6 |
| HR-31 | 50/50 | 9000 | 1.8 |
| HR-32 | 100 | 10000 | 1.6 |
| HR-33 | 70/30 | 8000 | 2.0 |
| HR-34 | 10/90 | 8000 | 1.8 |
| HR-35 | 30/30/40 | 9000 | 2.0 |
| HR-36 | 50/50 | 6000 | 1.4 |
| HR-37 | 50/50 | 5500 | 1.5 |
| HR-38 | 50/50 | 4800 | 1.8 |
| HR-39 | 60/40 | 5200 | 1.8 |
| HR-40 | 50/50 | 8000 | 1.5 |
| HR-41 | 20/80 | 7500 | 1.8 |
| HR-42 | 50/50 | 6200 | 1.6 |
| HR-43 | 60/40 | 16000 | 1.8 |

TABLE 1-continued

| Resin | Composition | Mw | Mw/Mn |
|---|---|---|---|
| HR-44 | 80/20 | 10200 | 1.8 |
| HR-45 | 50/50 | 12000 | 2.6 |
| HR-46 | 50/50 | 10900 | 1.9 |
| HR-47 | 50/50 | 6000 | 1.4 |
| HR-48 | 50/50 | 4500 | 1.4 |
| HR-49 | 50/50 | 6900 | 1.9 |
| HR-50 | 100 | 2300 | 2.6 |
| HR-51 | 60/40 | 8800 | 1.5 |
| HR-52 | 68/32 | 11000 | 1.7 |
| HR-53 | 100 | 8000 | 1.4 |
| HR-54 | 100 | 8500 | 1.4 |
| HR-55 | 80/20 | 13000 | 2.1 |
| HR-56 | 70/30 | 18000 | 2.3 |
| HR-57 | 50/50 | 5200 | 1.9 |
| HR-58 | 50/50 | 10200 | 2.2 |
| HR-59 | 60/40 | 7200 | 2.2 |
| HR-60 | 32/32/36 | 5600 | 2.0 |
| HR-61 | 30/30/40 | 9600 | 1.6 |
| HR-62 | 40/40/20 | 12000 | 2.0 |
| HR-63 | 100 | 6800 | 1.6 |
| HR-64 | 50/50 | 7900 | 1.9 |
| HR-65 | 40/30/30 | 5600 | 2.1 |
| HR-66 | 50/50 | 6800 | 1.7 |
| HR-67 | 50/50 | 5900 | 1.6 |
| HR-68 | 49/51 | 6200 | 1.8 |
| HR-69 | 50/50 | 8000 | 1.9 |
| HR-70 | 30/40/30 | 9600 | 2.3 |
| HR-71 | 30/40/30 | 9200 | 2.0 |
| HR-72 | 40/29/31 | 3200 | 2.1 |
| HR-73 | 90/10 | 6500 | 2.2 |
| HR-74 | 50/50 | 7900 | 1.9 |
| HR-75 | 20/30/50 | 10800 | 1.6 |
| HR-76 | 50/50 | 2200 | 1.9 |
| HR-77 | 50/50 | 5900 | 2.1 |
| HR-78 | 40/20/30/10 | 14000 | 2.2 |
| HR-79 | 50/50 | 5500 | 1.8 |
| HR-80 | 50/50 | 10600 | 1.9 |
| HR-81 | 50/50 | 8600 | 2.3 |
| HR-82 | 100 | 15000 | 2.1 |
| HR-83 | 100 | 6900 | 2.5 |
| HR-84 | 50/50 | 9900 | 2.3 |

In order to prevent the resist film from directly contacting with the immersion liquid, an immersion liquid sparingly soluble film (hereinafter sometimes referred to as "a topcoat") may be provided between the immersion liquid and the resist film formed from the positive resist composition of the present invention. Functions required of the topcoat are suitability for coating on the resist upper layer part, transparency to radiation particularly at 193 nm, and sparing solubility in the immersion liquid. It is preferred that the topcoat does not intermix with the resist and can be uniformly coated on the resist upper layer.

In view of transparent to light at 193 nm, the topcoat is preferably an aromatic-poor polymer, and specific examples thereof include a hydrocarbon polymer, an acrylic acid ester polymer, a polymethacrylic acid, a polyacrylic acid, a polyvinyl ether, a silicon-containing polymer and a fluorine-containing polymer. The hydrophobic resin (HR) described above is suitable also as a topcoat. From the standpoint that an impurity when dissolved out from the topcoat into the immersion liquid contaminates the optical lens, the residual monomer component of the polymer is preferably less contained in the topcoat.

At the time of peeling off the topcoat, a developer may be used or a releasing agent may be separately used. The releasing agent is preferably a solvent less permeating into the resist film. From the standpoint that the peeling step can be performed simultaneously with the development step of the resist film, the topcoat is preferably peelable with an alkali developer and in view of peeling with an alkali developer, the topcoat is preferably acidic, but in terms of non-intermixing with the resist film, the topcoat may be neutral or alkaline.

With no difference in the refractive index between the topcoat and the immersion liquid, the resolving power is enhanced. In the case where water is used as the immersion liquid at the exposure with an ArF excimer laser (wavelength: 193 nm), the topcoat for ArF immersion exposure preferably has a refractive index close to the refractive index of the immersion liquid. From the standpoint of having a refractive index close to that of the immersion liquid, a fluorine atom is preferably contained in the topcoat. Also, in view of transparency and refractive index, the topcoat is preferably a thin film.

The topcoat is preferably not intermixed with the resist film and further not intermixed with the immersion liquid. In this respect, when the immersion liquid is water, the solvent used for the topcoat is preferably a water-insoluble medium sparingly soluble in the solvent used for the positive resist composition. In the case where the immersion liquid is an organic solvent, the topcoat may be water-soluble or water-insoluble.

The double exposure process as used in the present invention is, as described in JP-A-2002-75857, a process of performing exposure twice on the same photoresist film, which is a method of dividing the pattern in the exposure field into two pattern groups and exposing respective divided pattern groups in twice. In the specific dividing method, as shown in FIG. 1, two masks having a pattern of 60-nm line and 180-nm space are used and exposure is performed twice by displacing the masks by 120 nm to form a 60-nm 1:1 line-and-space pattern. In general, as the pitch of the pattern (in the 60-nm 1:1 line-and-space pattern, the pitch is 120 nm) becomes narrow, the optical resolution decreases. However, in the double exposure, the divided respective patterns come to give a pitch of 2 times the pitch in the original pattern and the resolution is enhanced.

The positive resist composition of the present invention may be applied to a multilayer resist process (particularly, a three-layer resist process). The multilayer resist process comprises the following steps:

(a) forming a lower resist layer comprising an organic material on a substrate to be processed, (b) sequentially stacking on the lower resist layer an intermediate layer and an upper resist layer comprising an organic material capable of crosslinking or decomposing upon irradiation with radiation, and (c) forming a predetermined pattern on the upper resist layer and then sequentially etching the intermediate layer, the lower layer and the substrate.

An organopolysiloxane (silicone resin) or $SiO_2$ coating solution (SOG) is generally used for the intermediate layer. As for the lower layer resist, an appropriate organic polymer film is used, but various known photoresists may be used. Examples thereof include various series such as FH Series and FHi Series produced by Fujifilm Arch Co., Ltd., and PFI Series produced by Sumitomo Chemical Co., Ltd.

The film thickness of the lower resist layer is preferably from 0.1 to 4.0 μm, more preferably from 0.2 to 2.0 μm, still more preferably from 0.25 to 1.5 μm. The film thickness is preferably 0.1 μm or more in view of antireflection or dry etching resistance and preferably 4.0 μm or less in view of aspect ratio or pattern collapse of the fine pattern formed.

EXAMPLES

The present invention is described in greater detail below by referring to Examples, but the present invention should not be construed as being limited thereto.

Synthesis Example 1

Synthesis of Resin (1)

Under a nitrogen stream, 8.8 g of cyclohexanone was charged into a three-neck flask and heated at 80° C. Thereto, a solution prepared by dissolving 8.5 g of γ-butyrolactone methacrylate, 4.7 g of 3-hydroxyadamantyl-1-methacrylate, 8.8 g of 2-methyl-2-adamantyloxycarbonyl methacrylate, and polymerization initiator V-60 (produced by Wako Pure Chemical Industries, Ltd.) in an amount of 13 mol % based on the monomer, in 79 g of cyclohexanone was added dropwise over 6 hours. After the completion of dropwise addition, the reaction was further allowed to proceed at 80° C. for 2 hours. The reaction solution was left standing to cool and then added dropwise to a mixed solution of 900-ml methanol/100-ml water over 20 minutes, and the precipitated powder material was collected by filtration and dried to obtain 18 g of Resin (1). The weight average molecular weight of Resin (1) obtained was 6,200 in terms of standard polystyrene, and the dispersity (Mw/Mn) was 1.6.

Other resins were synthesized in the same manner. The weight average molecular weight was adjusted by changing the amount of the polymerization initiator.

Regarding Resins (1) to (20) of the present invention and Resins (RI) to (R4), the monomers used for the synthesis, the molar ratio of repeating units corresponding to the monomers, the weight average molecular weight (Mw) and the dispersity (Mw/Mn) are shown in Tables 2 to 4 below.

TABLE 2

| No | Monomer (1) | Monomer (2) | Monomer (3) | Monomer (4) | Molar Ratio | Mw | Mw/Mn |
|----|-------------|-------------|-------------|-------------|-------------|------|-------|
| 1 | [structure] | [structure] | [structure] | — | 50/20/30 | 6200 | 1.6 |
| 2 | [structure] | [structure] | — | — | 89/11 | 9600 | 2.1 |
| 3 | [structure] | [structure] | [structure] | — | 42/10/48 | 8700 | 2.1 |

TABLE 2-continued

| No | Monomer (1) | Monomer (2) | Monomer (3) | Monomer (4) | Molar Ratio | Mw | Mw/Mn |
|---|---|---|---|---|---|---|---|
| 4 | | | | | 40/10/26/24 | 9900 | 2.3 |
| 5 | | | | — | 50/10/40 | 7400 | 2.3 |
| 6 | | | — | — | 50/50 | 6300 | 2.2 |

TABLE 2-continued

| No | Monomer (1) | Monomer (2) | Monomer (3) | Monomer (4) | Molar Ratio | Mw | Mw/Mn |
|---|---|---|---|---|---|---|---|
| 7 | (structure) | — | — | — | 100 | 3200 | 1.5 |
| 8 | (structure) | (structure) | (structure) | — | 40/30/30 | 9000 | 2.1 |
| 9 | (structure) | (structure) | (structure) | (structure) | 20/50/20/10 | 8000 | 2.2 |

TABLE 2-continued

| No | Monomer (1) | Monomer (2) | Monomer (3) | Monomer (4) | Molar Ratio | Mw | Mw/Mn |
|----|-------------|-------------|-------------|-------------|-------------|------|-------|
| 10 | (structure) | (structure) | — | — | 50/50 | 8500 | 1.9 |

TABLE 3

| No | Monomer (1) | Monomer (2) | Monomer (3) | Monomer (4) | Molar Ratio | Mw | Mw/Mn |
|----|-------------|-------------|-------------|-------------|-------------|------|-------|
| 11 | (structure) | (structure) | (structure) | (structure) | 40/20/20/20 | 7900 | 2.0 |
| 12 | (structure) | (structure) | (structure) | (structure) | 30/15/11/44 | 5900 | 1.9 |

TABLE 3-continued
| | | | | | | | |
|---|---|---|---|---|---|---|---|
| 13 | 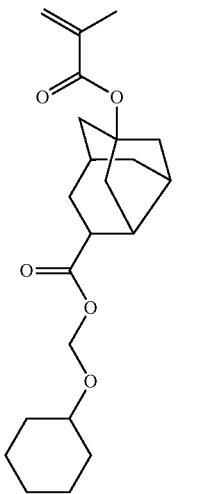 [SMILES: C=C(C)C(=O)OC12CC3CC(C1)C(C2)C(C(=O)OCOC1CCCCC1)C3] | 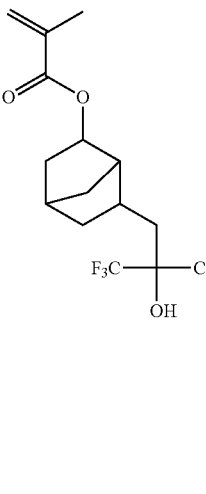 | — | — | 50/50 | 6300 | 1.8 |
| 14 | 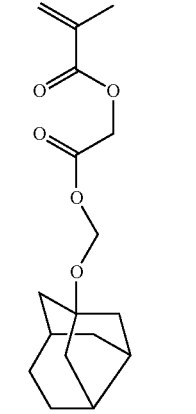 | — | — | — | 100 | 6200 | 1.7 |
| 15 | 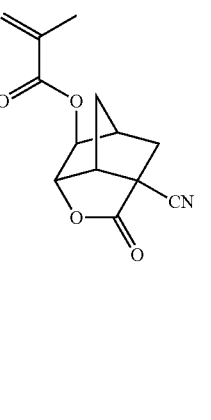 | 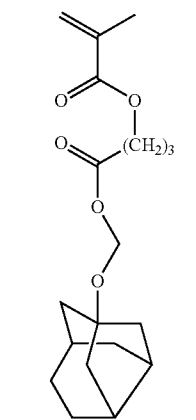 | — | — | 30/70 | 6300 | 1.9 |

TABLE 3-continued

| 16 | (structure) | (structure) | — | — | 40/50 | 2600 | 2.3 |
| 17 | (structure) | (structure) | — | — | 20/80 | 12000 | 2.4 |
| 18 | (structure) | (structure) | (structure) | — | 20/40/40 | 7500 | 2.3 |

TABLE 3-continued

| # | Structure 1 | Structure 2 | | | Ratio | Mw | PDI |
|---|---|---|---|---|---|---|---|
| 19 | methacrylate with –(CH₂)₃–C(=O)O–C(Et)₂(cyclohexyl) group | — | — | — | 100 | 6100 | 1.9 |
| 20 | methacrylate of cyano-lactone norbornane | methacrylate with –(CH₂)₃–C(=O)O–C(Et)₂(cyclohexyl) group | — | — | 50/50 | 5900 | 2.0 |

TABLE 4

| # | Structure 1 | Structure 2 | Structure 3 | | Ratio | Mw | PDI |
|---|---|---|---|---|---|---|---|
| R1 | methacrylate –CH₂–O–(1-adamantyl) | — | — | — | 100 | 6900 | 2.1 |
| R2 | methacrylate of γ-butyrolactone | methacrylate of 3-hydroxy-1-adamantyl | methacrylate –CH₂–O–(1-adamantyl) | — | 50/20/30 | 8500 | 2.2 |

TABLE 4-continued

| | | | | | | |
|---|---|---|---|---|---|---|
| R3 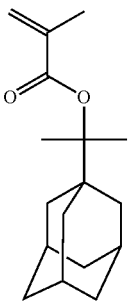 | — | — | — | 100 | 7800 | 2.0 |
| R4 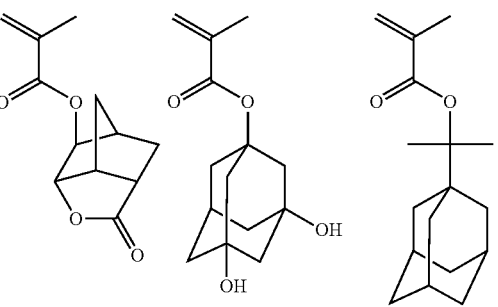 | | | | 40/20/40 | 7900 | 2.3 |

Examples 1 to 24 and Comparative Examples 1 to 10

<Preparation of Resist>

The components shown in Tables 5 and 6 below were dissolved in a solvent to prepare a solution having a solid content concentration of 5 mass %, and the obtained solution was filtered through a 0.1-μm polyethylene filter to prepare a positive resist composition. The positive resist compositions prepared were evaluated by the following methods, and the results are shown in Tables 5 and 6. As for each component in the Tables, when a plurality of species were used, the ratio is a ratio by mass.

Incidentally, in Tables 5 and 6, when the positive resist composition contains a hydrophobic resin (HR), the addition mode is indicated by "added", and when the positive resist composition does not contain a hydrophobic resin (HR) and after forming a resist film, a topcoat protective layer is formed thereon, the addition mode is indicated by "TC".

Image Performance Test:
(Exposure Condition (1): Normal Dry Exposure)

An organic antireflection film, ARC29A (produced by Nissan Chemical Industries, Ltd.), was coated on a silicon wafer and baked at 205° C. for 60 seconds to form a 78-nm antireflection film, and the positive resist composition prepared was coated thereon and baked at 130° C. for 60 seconds to form a 120-nm resist film. The obtained wafer was exposed using an ArF excimer laser scanner (PAS5500/1100, manufactured by ASML, NA: 0.75) through a 6% halftone mask having a 65-nm 1:1 line-and-space pattern. Thereafter, the resist film was heated at 130° C. for 60 seconds, developed with an aqueous tetramethylammonium hydroxide solution (2.38 mass %) for 30 seconds, rinsed with pure water and spin-dried to obtain a resist pattern.

(Exposure Condition (2): Normal Immersion Exposure)

An organic antireflection film, ARC29A (produced by Nissan Chemical Industries, Ltd.), was coated on a silicon wafer and baked at 205° C. for 60 seconds to form a 78-nm antireflection film, and the positive resist composition prepared was coated thereon and baked at 130° C. for 60 seconds to form a 120-nm resist film. The obtained wafer was exposed using an ArF excimer laser immersion scanner (PAS5500/1250i, manufactured by ASML, NA: 0.85) through a 6% halftone mask having a 65-nm 1:1 line-and-space pattern. The immersion liquid used was ultrapure water. Thereafter, the resist film was heated at 130° C. for 60 seconds, developed with an aqueous tetramethylammonium hydroxide solution (2.38 mass %) for 30 seconds, rinsed with pure water and spin-dried to obtain a resist pattern.

(Exposure Condition (3): Dry Double Exposure)

An organic antireflection film, ARC29A (produced by Nissan Chemical Industries, Ltd.), was coated on a silicon wafer and baked at 205° C. for 60 seconds to form a 78-nm antireflection film, and the positive resist composition prepared was coated thereon and baked at 130° C. for 60 seconds to form a 120-nm resist film. The obtained wafer was subjected to first exposure by using an ArF excimer laser scanner (PAS5500/1100, manufactured by ASML, NA: 0.75) through a 6% halftone mask having a pattern of 60-nm space and 180-nm line and further to second exposure through the same pattern as in the first mask by displacing the mask by 120 nm such that the space was arranged between a space and a space at the first exposure. Thereafter, the resist film was heated at 130° C. for 60 seconds, developed with an aqueous tetramethylammonium hydroxide solution (2.38 mass %) for 30 seconds, rinsed with pure water and spin-dried to obtain a resist pattern.

(Exposure Condition (4): Immersion Double Exposure)

An organic antireflection film, ARC29A (produced by Nissan Chemical Industries, Ltd.), was coated on a silicon wafer and baked at 205° C. for 60 seconds to form a 78-nm antireflection film, and the positive resist composition prepared was coated thereon and baked at 130° C. for 60 seconds to form a 120-nm resist film. The obtained wafer was subjected to first exposure by using an ArF excimer laser immersion scanner (PAS5500/1250i, manufactured by ASML, NA: 0.85) through a 6% halftone mask having a pattern of 50-nm space and 150-nm line and further to second exposure through the same pattern as in the first mask by displacing the mask by 100 nm such that the space was arranged between a space and a space at the first exposure. The immersion liquid used was ultrapure water. Thereafter, the resist film was heated at 130° C. for 60 seconds, developed with an aqueous tetramethylammonium hydroxide solution (2.38 mass %) for 30 seconds, rinsed with pure water and spin-dried to obtain a resist pattern.

When the addition mode of the hydrophobic resin (HR) is "TC", the following operation was performed after the formation of the resist film.

<Forming Method of Topcoat>

The hydrophobic resin (HR) shown in Tables 5 and 6 was dissolved in a solvent and coated by a spin coater on the resist film above, and the wafer was heated at 115° C. for 60 seconds to form a 0.05 μm-thick topcoat layer. At this time, the topcoat was observed whether coating unevenness was present or not and it was confirmed that the topcoat was uniformly coated without coating unevenness.

The abbreviations of the solvents are as follows.
SL-1: 2-Ethylbutanol
SL-2: Perfluorobutyltetrahydrofuran In (Exposure Condition (1)) and (Exposure Condition (2)), the pattern profile was observed through a scanning microscope (S-4800, manufactured by Hitachi, Ltd.).

Also, the pattern collapse was evaluated as follows.

Pattern Collapse:

The exposure dose for reproducing a 130-nm 1:1 line-and-space mask pattern was taken as an optimal exposure dose and when a dense 1:1 mask-and-space pattern was exposed with the optimal exposure dose, the line width (nm) at which the pattern in a finer mask size was resolved without collapsing was taken as a limit line width of pattern collapse. A smaller value indicates that a finer pattern can be resolved without collapse of the pattern and the pattern collapse less occurs.

In (Exposure Condition (3)) and (Exposure Condition (4)), the obtained resist pattern was observed through a length-measuring SEM (S-8840, manufactured by Hitachi, Ltd.). In Tables 5 and 6, ○ indicates that resolution of the resist pattern was confirmed, and × indicates that the resist pattern could not be confirmed.

When resolution of the resist pattern was confirmed, the pattern profile was observed through a scanning microscope (S-4800, manufactured by Hitachi, Ltd.).

TABLE 5

| Example | Compound (C) | (g) | Acid Generator | (g) | Resin (10 g) | Basic Compound | (g) | Surfactant (0.03 g) | Solvent | (parts by mass) | Dissolution Inhibiting Compound (g) | Hydrophobic Resin (HR) | Addition Mode | (g) or (solvent) |
|---|---|---|---|---|---|---|---|---|---|---|---|---|---|---|
| 1 | 1-1 | (1.0) | z38 | (0.1) | 1 | PEA | (0.02) | W-4 | A1/B1 | (80/20) | | HR-22 | added | (0.1) |
| 2 | 1-3 | (1.0) | z78 | (0.2) | 2 | TOA | (0.005) | W-4 | A1/B1 | (60/40) | | HR-5 | added | (0.2) |
| 3 | 1-4 | (0.3) | z60 | (0.1) | 3 | PEA | (0.01) | W-6 | A1/B1 | (80/20) | | HR-11 | added | (0.1) |
|  |  |  | z38 | (0.05) |  |  |  |  |  |  |  | HR-73 |  | (0.05) |
| 4 | 1-5 | (0.3) | z60 | (0.2) | 4 | PEA | (0.01) | W-4 | A1/B1 | (80/20) | | HR-15 | added | (0.2) |
|  |  |  |  |  |  | DIA | (0.01) |  |  |  |  |  |  |  |
| 5 | 1-6 | (0.5) | z64 | (0.3) | 5 | PEA | (0.02) | W-4 | A1/B2 | (60/40) | LCB (0.2) | HR-53 | TC | (SL-1) |
| 6 | 1-7 | (0.4) | z70 | (0.2) | 6 | TOA | (0.02) | W-1 | A1/A3 | (60/40) | | HR-20 | added | (0.2) |
| 7 | 1-8 | (1.0) | z72 | (0.4) | 7 | DIA | (0.02) | W-4 | A1/B1 | (80/20) | | HR-37 | added | (0.4) |
| 8 | 1-9 | (0.3) | z38 | (0.3) | 8 | PEA | (0.02) | W-4 | A1/B2 | (60/40) | | HR-30 | added | (0.3) |
| 9 | 1-10 | (1.0) | z69 | (0.1) | 9 | PBI | (0.01) | W-6 | A1/B1 | (60/40) | | HR-47 | added | (0.1) |
| 10 | 1-11 | (0.5) | z66 | (0.2) | 10 | PEA | (0.02) | W-4 | A1 | (100) | | HR-51 | added | (0.2) |
| 11 | 2-1 | (2.0) | z60 | (0.2) | 11 | PEA | (0.02) | W-2 | A1/B1 | (60/40) | LCB (0.3) | HR-65 | added | (0.2) |
|  |  |  | z68 | (0.2) |  |  |  |  |  |  |  |  |  |  |
| 12 | 2-6 | (1.0) | z68 | (0.4) | 12 | PEA | (0.01) | W-4 | A1/B1 | (80/20) | | HR-66 | added | (0.4) |
| 13 | 3-4 | (1.0) | z63 | (0.1) | 13 | PEA | (0.01) | W-6 | A1/B1 | (80/20) | | HR-44 | added | (0.1) |
|  |  |  |  |  |  | DIA | (0.005) |  |  |  |  |  |  |  |
| 14 | 3-6 | (2.0) | z78 | (0.3) | 14 | PEA | (0.01) | W-4 | A1/B1 | (80/20) | | HR-63 | added | (0.3) |
| 15 | 4-6 | (0.5) | z61 | (0.2) | 15 | PEA | (0.01) | W-4 | A1/B1 | (80/20) | | HR-83 | TC | (SL-2) |

| Example | Exposure Condition (1) | | Exposure Condition (2) | | Exposure Condition (3) | | Exposure Condition (4) | |
|---|---|---|---|---|---|---|---|---|
|  | Pattern Collapse (nm) | Pattern Profile | Pattern Collapse (nm) | Pattern Profile | Pattern Resolution | Pattern Profile | Pattern Resolution | Pattern Profile |
| 1 | 62 | rectangular | 49 | rectangular | ○ | rectangular | ○ | rectangular |
| 2 | 54 | rectangular | 46 | rectangular | ○ | rectangular | ○ | rectangular |
| 3 | 62 | rectangular | 39 | rectangular | ○ | rectangular | ○ | rectangular |
| 4 | 63 | rectangular | 41 | rectangular | ○ | rectangular | ○ | rectangular |
| 5 | 65 | rectangular | 42 | rectangular | ○ | rectangular | ○ | rectangular |
| 6 | 55 | rectangular | 49 | rectangular | ○ | rectangular | ○ | rectangular |
| 7 | 62 | rectangular | 43 | rectangular | ○ | rectangular | ○ | rectangular |
| 8 | 58 | rectangular | 39 | rectangular | ○ | rectangular | ○ | rectangular |
| 9 | 62 | rectangular | 40 | rectangular | ○ | rectangular | ○ | rectangular |
| 10 | 65 | rectangular | 52 | rectangular | ○ | rectangular | ○ | rectangular |
| 11 | 60 | rectangular | 59 | rectangular | ○ | rectangular | ○ | rectangular |
| 12 | 58 | rectangular | 49 | rectangular | ○ | rectangular | ○ | rectangular |
| 13 | 64 | rectangular | 46 | rectangular | ○ | rectangular | ○ | rectangular |
| 14 | 65 | rectangular | 41 | rectangular | ○ | rectangular | ○ | rectangular |
| 15 | 68 | rectangular | 43 | rectangular | ○ | rectangular | ○ | rectangular |

TABLE 6

| | Compound (C) | (g) | Acid Generator | (g) | Resin (10 g) | Basic Compound | (g) | Surfactant (0.03 g) | Solvent | (parts by mass) | Dissolution Inhibiting Compound (g) | Hydrophobic Resin (HR) | Addition Mode | (g) or (solvent) |
|---|---|---|---|---|---|---|---|---|---|---|---|---|---|---|
| Example | | | | | | | | | | | | | | |
| 16 | 1-7 | (0.4) | z70 | (0.3) | 19 | PEA | (0.01) | W-4 | A1/B1 | (60/40) | | HR-21 | added | (0.4) |
| 17 | 1-7 | (0.4) | z70 | (0.2) | 20 | DIA | (0.02) | W-4 | A1/B1 | (60/40) | | HR-22 | added | (0.1) |
| 18 | 5-3 | (2.0) | z50 | (0.2) | 16 | PEA | (0.02) | W-4 | A1 | (100) | | HR-80 | added | (0.2) |
| 19 | 6-1 | (3.5) | z70 | (0.3) | 19 | PEA | (0.01) | W-4 | A1/B1 | (60/40) | | HR-21 | added | (0.1) |
| 20 | 6-3 | (0.4) | z68 | (0.3) | 14 | DIA | (0.02) | W-4 | A1/B1 | (80/20) | LCB (0.3) | HR-66 | added | (0.1) |
| 21 | 6-2 | (0.4) | z70 | (0.3) | 14 | DIA | (0.02) | W-2 | A1/B1 | (80/20) | | HR-83 | TC | (SL-2) |
| 22 | 6-16 | (2.0) | z68 | (0.4) | 14 | PEA | (0.01) | W-4 | A1/B1 | (60/40) | | HR-47 | added | (0.1) |
| 23 | 6-20 | (1.0) | z69 | (0.3) | 14 | DIA | (0.02) | W-4 | A1/B1 | (70/30) | | HR-30 | added | (0.1) |
| 24 | 6-7 | (2.0) | z38 | (0.3) | 16 | PEA DIA | (0.01) (0.01) | W-4 | A1 | (100) | | HR-80 | added | (0.2) |
| Comparative Example | | | | | | | | | | | | | | |
| 1 | — | (—) | z38 | (0.15) | 1 | PEA | (0.03) | W-4 | A1/B1 | (80/20) | | HR-22 | added | (0.15) |
| 2 | — | (—) | z38 | (0.2) | 2 | PEA DIA | (0.01) (0.005) | W-1 | A1/B1 | (80/20) | LCB (0.2) | HR-5 | added | (0.2) |
| 3 | — | (—) | z78 | (0.2) | 10 | DIA | (0.03) | W-4 | A1 | (100) | | HR-37 | added | (0.2) |
| 4 | — | (—) | z60 | (0.2) | 13 | PEA | (0.04) | W-6 | A1/A3 | (80/20) | | HR-53 | TC | (SL-1) |
| 5 | — | (—) | z38 | (0.4) | 16 | PBI | (0.01) | W-4 | A1/A3 | (60/40) | | HR-47 | added | (0.4) |
| 6 | 1-7 | (0.4) | z38 | (0.15) | R1 | PEA | (0.03) | W-4 | A1/B1 | (80/20) | | HR-51 | added | (0.15) |
| 7 | 1-8 | (1.0) | z38 | (0.2) | R2 | PEA DIA | (0.01) (0.005) | W-1 | A1/B1 | (80/20) | | HR-65 | added | (0.2) |
| 8 | 1-9 | (0.3) | z78 | (0.2) | R3 | DIA | (0.03) | W-4 | A1 | (100) | LCB (0.2) | HR-63 | added | (0.2) |
| 9 | 1-10 | (1.0) | Z60 | (0.2) | R4 | PEA | (0.04) | W-6 | A1/A3 | (80/20) | | HR-83 | TC | (SL-2) |
| 10 | 1-11 | (0.5) | Z38 | (0.4) | R4 | PBI | (0.01) | W-4 | A1/A3 | (60/40) | | HR-80 | added | (0.4) |

| | Exposure Condition (1) | | Exposure Condition (2) | | Exposure Condition (3) | | Exposure Condition (4) | |
|---|---|---|---|---|---|---|---|---|
| | Pattern Collapse (nm) | Pattern Profile | Pattern Collapse (nm) | Pattern Profile | Pattern Resolution | Pattern Profile | Pattern Resolution | Pattern Profile |
| Example | | | | | | | | |
| 16 | 50 | rectangular | 39 | rectangular | ◯ | rectangular | ◯ | rectangular |
| 17 | 70 | rectangular | 46 | rectangular | ◯ | rectangular | ◯ | rectangular |
| 18 | 62 | rectangular | 49 | rectangular | ◯ | rectangular | ◯ | rectangular |
| 19 | 55 | rectangular | 50 | rectangular | ◯ | rectangular | ◯ | rectangular |
| 20 | 68 | rectangular | 42 | rectangular | ◯ | rectangular | ◯ | rectangular |
| 21 | 65 | rectangular | 49 | rectangular | ◯ | rectangular | ◯ | rectangular |
| 22 | 69 | rectangular | 50 | rectangular | ◯ | rectangular | ◯ | rectangular |
| 23 | 70 | rectangular | 51 | rectangular | ◯ | rectangular | ◯ | rectangular |
| 24 | 63 | rectangular | 52 | rectangular | ◯ | rectangular | ◯ | rectangular |
| Comparative Example | | | | | | | | |
| 1 | 99 | rectangular | 82 | rectangular | X | unresolved | X | unresolved |
| 2 | 101 | tapered | 91 | rectangular | X | unresolved | X | unresolved |
| 3 | 95 | rectangular | 82 | rectangular | X | unresolved | X | unresolved |
| 4 | 92 | rectangular | 83 | rectangular | X | unresolved | X | unresolved |
| 5 | 97 | rectangular | 80 | rectangular | X | unresolved | X | unresolved |
| 6 | 101 | tapered | 95 | reverse tapered | X | unresolved | X | unresolved |
| 7 | 105 | tapered | 100 | reverse tapered | X | unresolved | X | unresolved |
| 8 | 110 | reverse tapered | 96 | reverse tapered | X | unresolved | X | unresolved |
| 9 | 106 | tapered | 89 | tapered | X | unresolved | X | unresolved |
| 10 | 99 | tapered | 93 | tapered | X | unresolved | X | unresolved |

Denotations in the Tables are as follows.

[Basic Compound]
TPI: 2,4,5-triphenylimidazole
TPSA: triphenylsulfonium acetate
HEP: N-hydroxyethylpiperidine
DIA: 2,6-diisopropylaniline
DCMA: dicyclohexylmethylamine
TPA: tripentylamine
HAP: hydroxyantipyrine
TBAH: tetrabutylammonium hydroxide
TMEA: tris(methoxyethoxyethyl)amine
PEA: N-phenyldiethanolamine
TOA: trioctylamine
DBN: 1,5-diazabicyclo [4.3.0]non-5-ene
PBI: 2-phenylbenzimidazole
DHA: N,N-dihexylaniline

[Surfactant]
W-1: Megafac F176 (produced by Dainippon Ink & Chemicals, Inc.) (fluorine-containing)
W-2: Megafac R08 (produced by Dainippon Ink & Chemicals, Inc.) (fluorine- and silicon-containing)
W-3: polysiloxane polymer KP-341 (produced by Shin-Etsu Chemical Co., Ltd.) (silicon-containing)
W-4: Troysol S-366 (produced by Troy Chemical)

W-5: PF656 (produced by OMNOVA, fluorine-containing)

W-6: PF6320 (produced by OMNOVA, fluorine-containing)

[Solvent]

A1: propylene glycol monomethyl ether acetate

A2: 2-heptanone

A3: cyclohexanone

A4: γ-butyrolactone

B1: propylene glycol monomethyl ether

B2: ethyl lactate

B3: propylene carbonate

[Dissolution Inhibiting Compound]

LCB: tert-butyl lithocholate

It is seen from the results in Tables 5 and 6 that the positive resist composition of the present invention exhibits good performance in terms of pattern collapse and pattern profile not only in normal exposure (dry exposure) but also in immersion exposure and at the same time, ensures good pattern resolution and good pattern profile in double exposure.

Industrial Applicability

According to the present invention, a positive resist composition exhibiting good performance in terms of pattern collapse and pattern profile not only in normal exposure (dry exposure) but also in immersion exposure, and a pattern forming method using the positive resist composition can be provided. Also, a positive resist composition suitable for double exposure, which ensures good pattern resolution and good pattern profile in double exposure, and a pattern forming method using the positive resist composition can be provided.

The entire disclosure of each and every foreign patent application from which the benefit of foreign priority has been claimed in the present application is incorporated herein by reference, as if fully set forth.

The invention claimed is:

1. A positive resist composition comprising:

(A) a compound capable of generating an acid upon irradiation with actinic rays or radiation;

(B) a resin of which solubility in an alkali developer increases under action of an acid;

(C) a compound capable of decomposing under action of an acid to generate an acid; and (HR) a hydrophobic resin, wherein the pKa of the acid generated from the compound (C) is less than or equal to 3; and the resin (B) comprises at least one of a repeating unit represented by formula (Ia) and a repeating unit represented by formula (Ib):

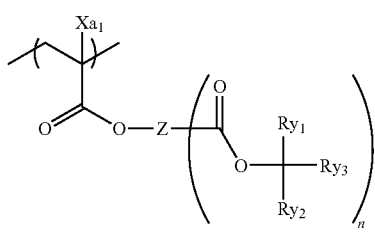

(Ia)

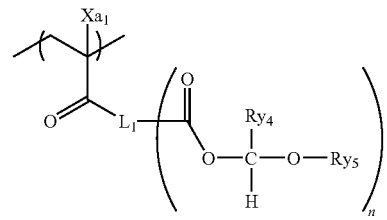

(Ib)

wherein $Xa_1$ represents a hydrogen atom, an alkyl group, a cyano group or a halogen atom;

$Ry_1$ to $Ry_3$ each independently represents an alkyl group or a cycloalkyl group, and at least two members out of $Ry_1$ to $Ry_3$ may combine to form a monocyclic or polycyclic cyclohydrocarbon structure;

Z represents an (n+1)-valent linking group;

$Ry_4$ represents a hydrogen atom, an alkyl group or a cycloalkyl group and $Ry_5$ represents an alkyl group or a cycloalkyl group, and $Ry_4$ and $Ry_5$ may combine to form a monocyclic or polycyclic cyclohydrocarbon structure;

$L_1$ represents an (n+1)-valent linking group; and n represents an integer of 1 to 3.

2. The positive resist composition as claimed in claim 1, wherein the resin (B) comprises a repeating unit represented by formula (Ia) and, in formula (Ia), Z has a chain hydrocarbon group or a cyclic hydrocarbon group.

3. The positive resist composition as claimed in claim 1, wherein the resin (B) comprises a repeating unit represented by formula (Ib) and, in formula (Ib), $L_1$ has a chain hydrocarbon group or a cyclic hydrocarbon group.

4. A pattern forming method comprising:

forming a resist film from the positive resist composition claimed in claim 1; and exposing and developing the resist film.

5. A pattern forming method comprising:

forming a resist film from the positive resist composition claimed in claim 1; and subjecting the resist film to immersion exposure and development.

6. A pattern forming method comprising:

forming a resist film from the positive resist composition claimed in claim 1; and doubly exposing and developing the resist film.

7. The positive resist composition as claimed in claim 1, wherein the acid generated from the compound (C) is a sulfonic acid having an alkyl group, a cycloalkyl group, an aryl group or an aralkyl group.

8. The positive resist composition as claimed in claim 1, wherein the compound (C) is selected from the group consisting of compounds represented by formulae (1) to (6),

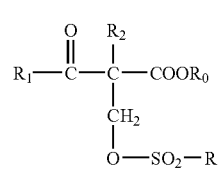

(1)

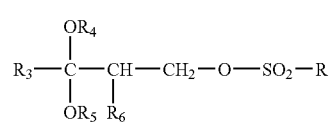

(2)

-continued

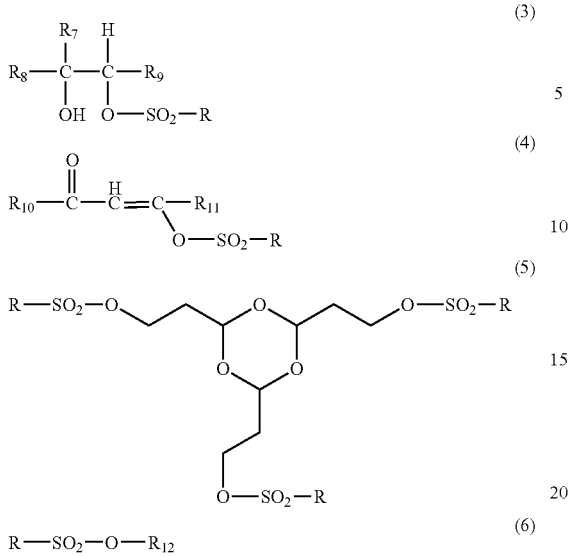

(3)

(4)

(5)

(6)

wherein R represents an alkyl group, a cycloalkyl group, an aryl group or an aralkyl group;
$R_0$ represents a group which leaves under an action of an acid;
$R_1$ represents an alkyl group, a cycloalkyl group, an aryl group, an aralkyl group, an alkoxy group or an aryloxy group;
$R_2$ represents an alkyl group or an aralkyl group;
$R_3$ represents an alkyl group, a cycloalkyl group, an aryl group or an aralkyl group;
$R_4$ and $R_5$ each independently represents an alkyl group, and $R_4$ and $R_5$ may combine with each other to form a ring;
$R_6$ represents a hydrogen atom or an alkyl group;
$R_7$ represents a hydrogen atom, an alkyl group, a cycloalkyl group, an aryl group or an aralkyl group;
$R_8$ represents an alkyl group, a cycloalkyl group, an aryl group or an aralkyl group;
$R_9$ represents a hydrogen atom, an alkyl group, a cycloalkyl group, an aryl group or an aralkyl group;
$R_9$ may combine with $R_7$ to form a ring,
$R_{10}$ represents an alkyl group, a cycloalkyl group, an alkoxy group, an aryl group, an aralkyl group, an aryloxy group or an alkenyloxy group;
$R_{11}$ represents an alkyl group, a cycloalkyl group, an alkoxy group, an aryl group, an aralkyl group, an aryloxy group or an alkenyl group;
$R_{10}$ and $R_{11}$ may combine with each other to form a ring; and
$R_{12}$ represents an alkyl group, a cycloalkyl group, an aryl group, an alkenyl group or a cyclic imide group.

9. A pattern forming method comprising:
forming a resist film from a positive resist composition;
forming a hydrophobic resin-containing topcoat on the resist film; and
subjecting the resist film to immersion exposure and development,
wherein the positive resist composition comprises:
(A) a compound capable of generating an acid upon irradiation with actinic rays or radiation;
(B) a resin of which solubility in an alkali developer increases under action of an acid; and
(C) a compound capable of decomposing under action of an acid to generate an Acid,
wherein the pKa of the acid generated from the compound (C) is less than or equal to 3; and
the resin (B) comprises at least one of a repeating unit represented by formula (Ia) and a repeating unit represented by formula (Ib):

(Ia)

(Ib)

wherein $Xa_1$ represents a hydrogen atom, an alkyl group, a cyano group or a halogen atom;
$Ry_1$ to $Ry_3$ each independently represents an alkyl group or a cycloalkyl group, and at least two members out of $Ry_1$ to $Ry_3$ may combine to form a monocyclic or polycyclic cyclohydrocarbon structure;
Z represents an (n+1)-valent linking group;
$Ry_4$ represents a hydrogen atom, an alkyl group or a cycloalkyl group and $Ry_5$ represents an alkyl group or a cycloalkyl group, and $Ry_4$ and $Ry_5$ may combine to form a monocyclic or polycyclic cyclohydrocarbon structure;
$L_1$ represents an (n+1)-valent linking group; and
n represents an integer of 1 to 3.

* * * * *